(12) United States Patent
Iijima et al.

(10) Patent No.: US 8,023,016 B2
(45) Date of Patent: Sep. 20, 2011

(54) IMAGING DEVICE AND MANUFACTURING METHOD THEREOF

(75) Inventors: Tomokuni Iijima, Osaka (JP); Takashi Ishikawa, Osaka (JP); Ikuo Numai, Osaka (JP); Masahito Hayakawa, Osaka (JP); Aki Takai, Osaka (JP)

(73) Assignee: Panasonic Corporation, Osaka (JP)

( * ) Notice: Subject to any disclaimer, the term of this patent is extended or adjusted under 35 U.S.C. 154(b) by 784 days.

(21) Appl. No.: 11/722,447

(22) PCT Filed: Dec. 20, 2005

(86) PCT No.: PCT/JP2005/023345
§ 371 (c)(1),
(2), (4) Date: Jun. 21, 2007

(87) PCT Pub. No.: WO2006/068129
PCT Pub. Date: Jun. 29, 2006

(65) Prior Publication Data
US 2008/0151079 A1 Jun. 26, 2008

(30) Foreign Application Priority Data
Dec. 22, 2004 (JP) .................................. 2004-371850

(51) Int. Cl.
*H04N 9/09* (2006.01)
*H04N 9/097* (2006.01)
*H04N 13/02* (2006.01)

(52) U.S. Cl. ............. 348/265; 348/262; 348/47; 348/48

(58) Field of Classification Search ........... 348/262–265
See application file for complete search history.

(56) References Cited

U.S. PATENT DOCUMENTS

| 4,166,280 | A | * | 8/1979 | Poole ............................ 348/263 |
| 6,205,259 | B1 | | 3/2001 | Komiya et al. |
| 6,373,518 | B1 | | 4/2002 | Sogawa |
| 6,611,289 | B1 | * | 8/2003 | Yu et al. ........................ 348/265 |
| 6,859,229 | B1 | | 2/2005 | Suda |
| 2002/0041383 | A1 | * | 4/2002 | Lewis et al. .................... 358/1.9 |
| 2002/0122124 | A1 | * | 9/2002 | Suda ............................. 348/263 |
| 2003/0035056 | A1 | * | 2/2003 | Chen et al. ..................... 348/273 |
| 2003/0086013 | A1 | * | 5/2003 | Aratani ......................... 348/335 |
| 2003/0174235 | A1 | * | 9/2003 | Barkan et al. .................. 348/362 |

FOREIGN PATENT DOCUMENTS

CN 1347001 5/2002
(Continued)

*Primary Examiner* — Tuan Ho
*Assistant Examiner* — Christopher K Peterson
(74) *Attorney, Agent, or Firm* — Hamre, Schumann, Mueller & Larson, P.C.

(57) ABSTRACT

A small, low-profile imaging device that obtains imaging signals having similar light intensity distributions for different colored light, even when there is variability in component precision or assembly. The imaging device (101) includes a plurality of lens units (113) each including at least one lens, a plurality of imaging areas corresponding one-to-one with the plurality of lens units, and each having a light receiving surface (123) substantially perpendicular to an optical axis direction of the corresponding lens unit, an imaging signal input unit (133) that receives as input a plurality of imaging signals each output from a different one of the plurality of imaging areas, and an intensity correcting unit (142) that corrects the intensity of each of the plurality of imaging signals, so that the degree of correction changes depending on the position of the imaging area.

17 Claims, 52 Drawing Sheets

FOREIGN PATENT DOCUMENTS

| | | |
|---|---|---|
| JP | 7-87385 A | 3/1995 |
| JP | 8-79623 A | 3/1996 |
| JP | 10-289316 A | 10/1998 |
| JP | 2001-78213 A | 3/2001 |
| JP | 2002-262159 A | 9/2002 |
| JP | 2002-330332 A | 11/2002 |

* cited by examiner

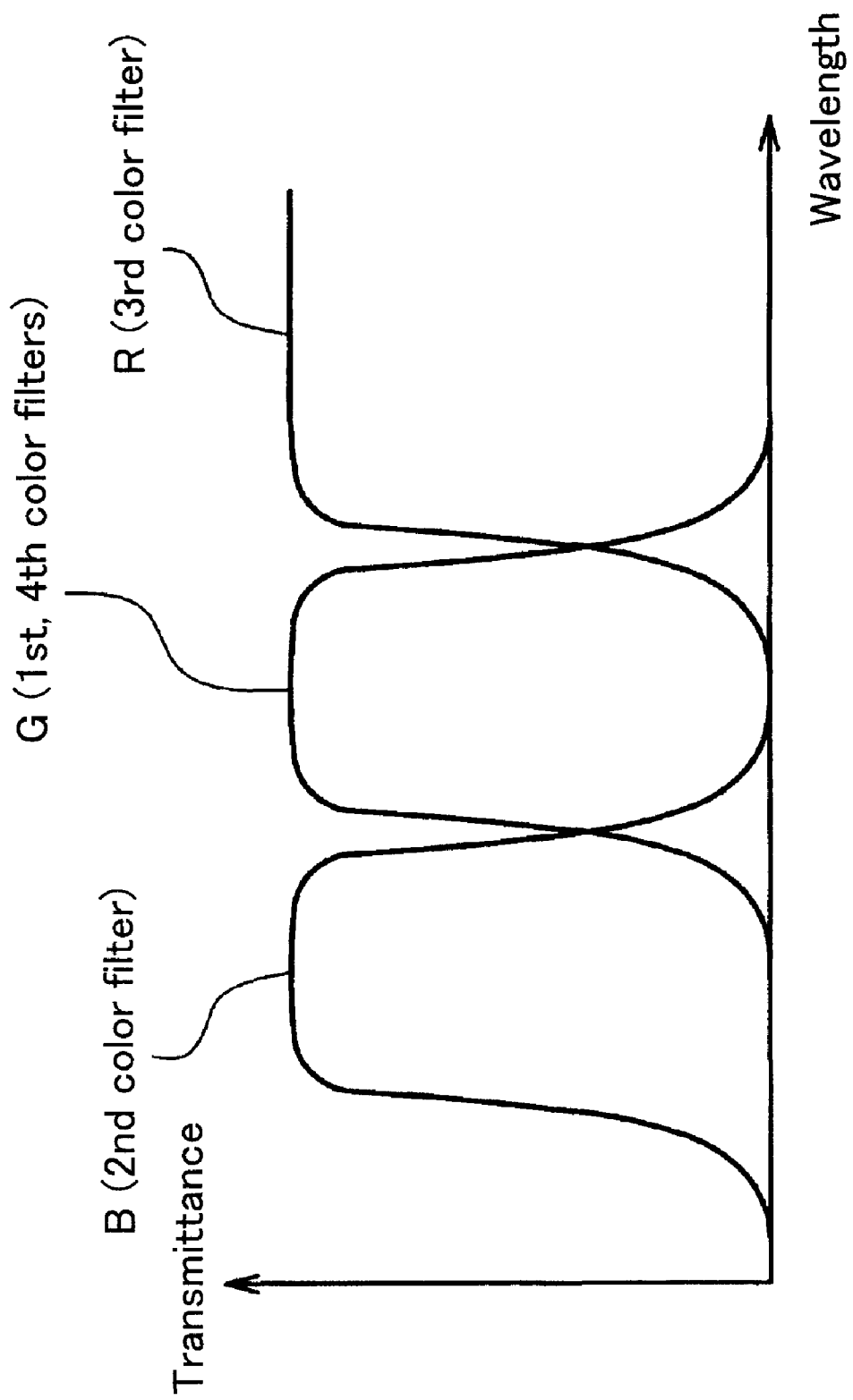
F I G. 4

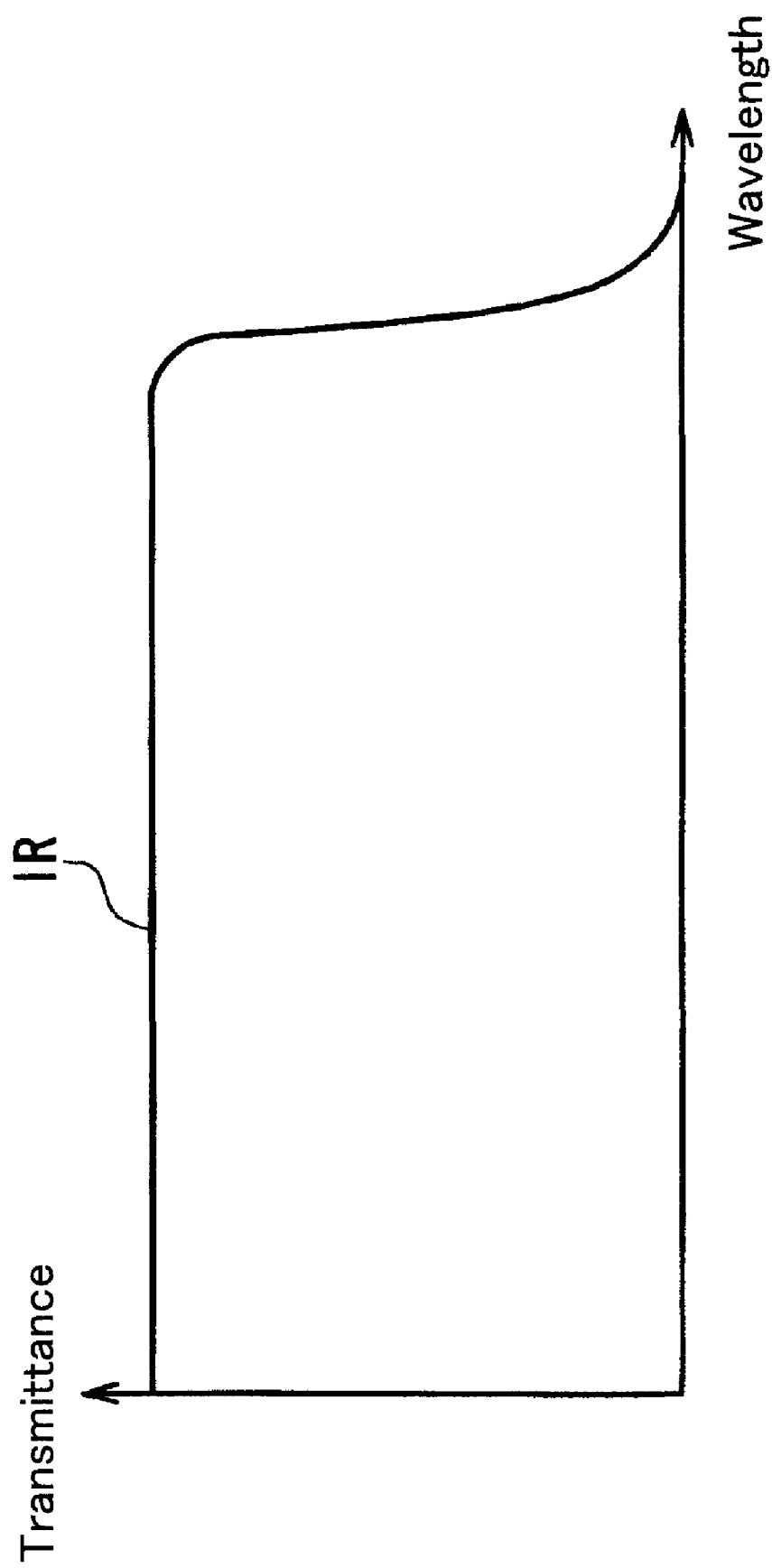
F I G. 5

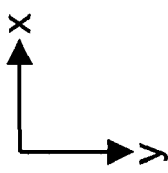
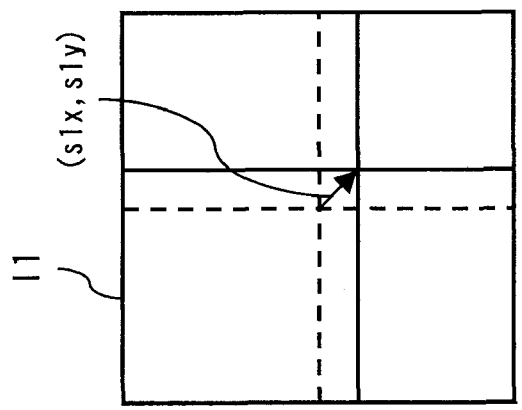
FIG. 27A
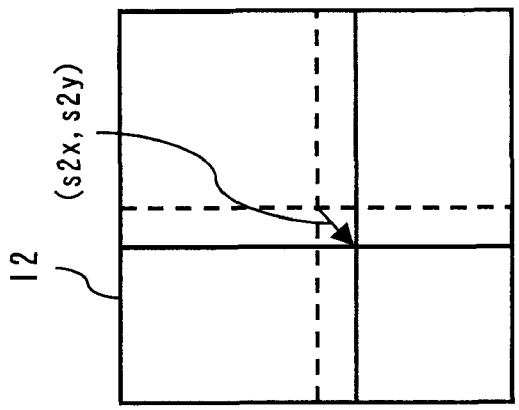
FIG. 27B
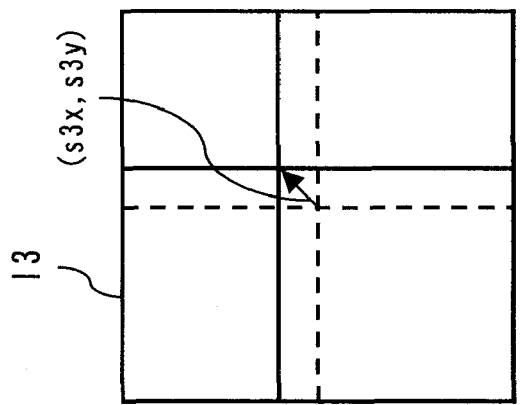
FIG. 27C
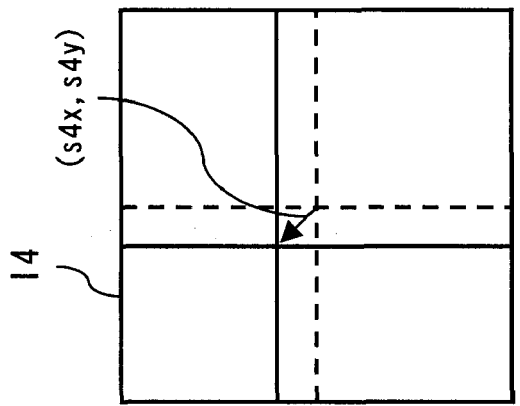
FIG. 27D

IMAGING DEVICE AND MANUFACTURING METHOD THEREOF

TECHNICAL FIELD

The present invention relates to a small, low-profile imaging device and a manufacturing method thereof.

BACKGROUND ART

A conventional imaging device is disclosed, for example, in JP 2001-78213A. FIG. 50 is a cross-sectional view showing the configuration of the conventional imaging device.

In FIG. 50, an imaging system 9010 is an optical processing system that images light from an object on the imaging surface of an imaging element 9120 via an aperture 9110 and an imaging lens 9100. The aperture 9110 has three circular openings 9110a, 9110b and 9110c. The object light from the openings 9110a, 9110b and 9110c that is incident on a light incidence surface 9100e of the imaging lens 9100 is emitted from three lens units 9100a, 9100b and 9100c of the imaging lens 9110 and forms three object images on the imaging surface of the imaging element 9120. A shading film is formed on a flat portion 9100d of the imaging lens 9100. Three optical filters 9052a, 9052b and 9052c that transmit light of different wavelength ranges are formed on the light incidence surface 9100e of the imaging lens 9100. Three optical filters 9053a, 9053b and 9053c that transmit light of different wavelength ranges are also formed on three imaging areas 9120a, 9120b and 9120c on the imaging element 9120. The optical filters 9052a and 9053a have a spectral transmittance characteristic of mainly transmitting green (marked G), the optical filters 9052b and 9053b have a spectral transmittance characteristic of mainly transmitting red (marked R), and the optical filters 9052c and 9053c have a spectral transmittance characteristic of mainly transmitting blue (marked B). Thus, the imaging areas 9120a, 9120b and 9120c are respectively sensitive to green (G), red (R) and blue (B) light.

With an imaging device such as this having a plurality of imaging lenses, the mutual spacing between the plurality of object images respectively formed by the plurality of imaging lenses on the imaging surface of the imaging element 9120 changes when the distance from the camera module to the object changes.

With the above conventional camera module, the optical axis spacing of the plurality of imaging systems is set such that the mutual spacing between the plurality of object images when the object is at a virtual subject distance D[m] and the mutual spacing between the plurality of object images when the object is at infinity changes by less than twice the pixel pitch of a reference image signal, where $D=1.4/(\tan \theta/2)$, with the virtual subject distance D[m] as a function of the angle of view $\theta[°]$ of the plurality of imaging systems. That is, color shift in the images of an object at infinity can be suppressed to a permissible level, even when the same image processing optimized for capturing an image of an object at a virtual subject distance D[m] is performed on an object at infinity, because the optical axis spacing is set such that the difference in mutual spacing between the two sets of object images on the imaging surface will be less than twice the pixel pitch of a reference signal.

In the conventional imaging device, the optical axes of the three lens units 9100a, 9100b and 9100c of the imaging lens 9100 are disposed so as to pass respectively through the centers of the three circular openings 9110a, 9110b and 9110c of the aperture 9110 and the centers of the imaging areas 9120a, 9120b and 9120c. However, the optical axes of the three lens units 9100a, 9100b and 9100c of the imaging lens 9100 can deviate from the respective centers of the three circular openings 9110a, 9110b and 9110c of the aperture 9110 due to variability in component precision, assembly or the like. A characteristic particular to the lens is that the light intensity around the periphery of the imaging surface of the imaging element 9120 (peripheral brightness) decreases in comparison to the center, although the extent to which peripheral brightness decreases differs when the optical axes of the three lens units 9100a, 9100b and 9100c of the imaging lens 9100 deviate in different directions from the centers of the three circular openings 9110a, 9110b and 9110c of the aperture 9110.

FIG. 51 illustrates the relationship between the aperture, the lens units, and peripheral brightness. In FIG. 51, only the lens 9100, the aperture 9110 and the imaging element 9120 are shown for simplicity. The curves marked G, R and B show the respective light intensities of the colors green, red and blue. Here, the positive sense of the y direction is upwards on the page, as shown in FIG. 51. As in FIG. 51, the peripheral brightness on the imaging surface of the imaging element 9120 decreases symmetrically in the positive and negative senses of the y direction, when the center of the circular opening 9110b coincides with the optical axis of the lens unit 9110b (curved distribution marked R). Thus, the light intensity distribution for red is positively and negatively symmetrical in relation to the y direction. However, when the center of the circular opening 9110a deviates from the optical axis of the lens unit 9100a in the negative sense of the y direction, the peripheral brightness on the imaging surface of the imaging element 9120 decreases to a greater extent in the negative sense of the y direction (curved distribution marked G). Thus, the light intensity distribution for green is pronounced in the positive sense in relation to the y direction. On the other hand, when the center of the circular opening 9110c deviates from the optical axis of the lens unit 9100c in the positive sense of the y direction, due to variability in processing precision of the lends 9100 or the apertures 9110, brightness on the imaging surface of the imaging element 9120 decreases to a greater extent in the positive sense of the y direction (curved distribution marked B). Thus, the light intensity distribution for blue is pronounced in the negative sense in relation to the y direction. Note that when the aperture 9110 and the lens 9100 are made from thermoformed resin, variability as in FIG. 51 can arise from differences in the coefficient of thermal expansion resulting from compositional differences.

FIG. 52 shows the light intensity distributions for the green, red and blue components. The y-axis is shown on the horizontal axis and light intensity is shown on the vertical axis. Where, for example, images of a gray subject are captured and synthesized when the above variability is present, colors (false color) other than the actual colors (gray in the present example) of the subject are produced, such as red in central portions in the y direction, green in positive positions, and blue in negative positions, since the light intensity distribution for red (curve marked R) will be positively and negatively symmetrical in relation to the y direction, the light intensity distribution for green (curve marked G) will be pronounced in the positive sense in relation to the y direction, and the light intensity distribution for blue (curve marked B) will be pronounced in the negative sense in relation to the y direction, as shown in FIG. 52. That is, a conventional imaging device that has a plurality of lens units and receives red, green and blue light of the subject independently in imaging areas corresponding respectively to the lens units produces false colors when the light intensity distribution is biased because of differing light intensities for red, green and blue light.

False colors thus are produced when the light axes of the three lens units 9100a, 9100b and 9100c of the imaging lens 9100 deviate from the respective centers of the circular openings 9110a, 9110b and 9110c of the aperture 9110 due to variability in component precision, assembly or the like.

Note that the above problem does not arise with an imaging device constituted by a single lens unit and a single imaging area, and having an imaging element in which a Bayer array of color filters is disposed in the imaging area (e.g., imaging element is a CCD, and has 3 different color filters red, green and blue disposed in a lattice on the surface of the imaging element, each color filter corresponding to a different photodiode). That is, false colors are not produced even if the lens unit deviates from the center of the aperture and light intensities are biased due to the aforementioned variability in component precision, assembly or the like, because the light intensity distributions for red, green and blue will be similar, since the red, green and blue color filters are disposed in a lattice in proximity to each other, and the red, green and blue light of the subject is received at an imaging area that brings them close together. However, the size and profile of an imaging device constituted by a single lens unit and a single imaging element cannot be reduced because of the long optical length.

DISCLOSURE OF INVENTION

The present invention, which was made in consideration of the above problems, has as its object to provide a small, low-profile imaging device that obtains imaging signals having similar light intensity distributions for different colored light, even when there is variability in component precision or assembly.

An imaging device of the present invention includes a plurality of lens units each including at least one lens, a plurality of imaging areas corresponding one-to-one with the plurality of lens units, and each having a light receiving surface substantially perpendicular to an optical axis direction of the corresponding lens unit, an imaging signal input unit that receives as input a plurality of imaging signals each output from a different one of the plurality of imaging areas, an intensity correction coefficient saving unit that saves an intensity correction coefficient, which is information concerning intensity unevenness in the imaging areas, and an intensity correcting unit that corrects the intensity of each of the plurality of imaging signals using the intensity correction coefficient, so as to reduce the effect of intensity unevenness in the imaging areas.

The present invention is able to provide a small, low-profile imaging device that obtains imaging signals having similar light intensity distributions for different colored light, even when there is variability in component precision or assembly.

BRIEF DESCRIPTION OF DRAWINGS

FIG. 4 is a characteristics diagram of color filters of the imaging device according to Embodiment 1 of the present invention.

FIG. 5 is a characteristics diagram of an IR filter of the imaging device according to Embodiment 1 of the present invention.

FIGS. 27A to 27D show imaging signals when images are captured of the origin correction chart according to Embodiment 2 of the present invention.

BEST MODE FOR CARRYING OUT THE INVENTION

Figure 1:
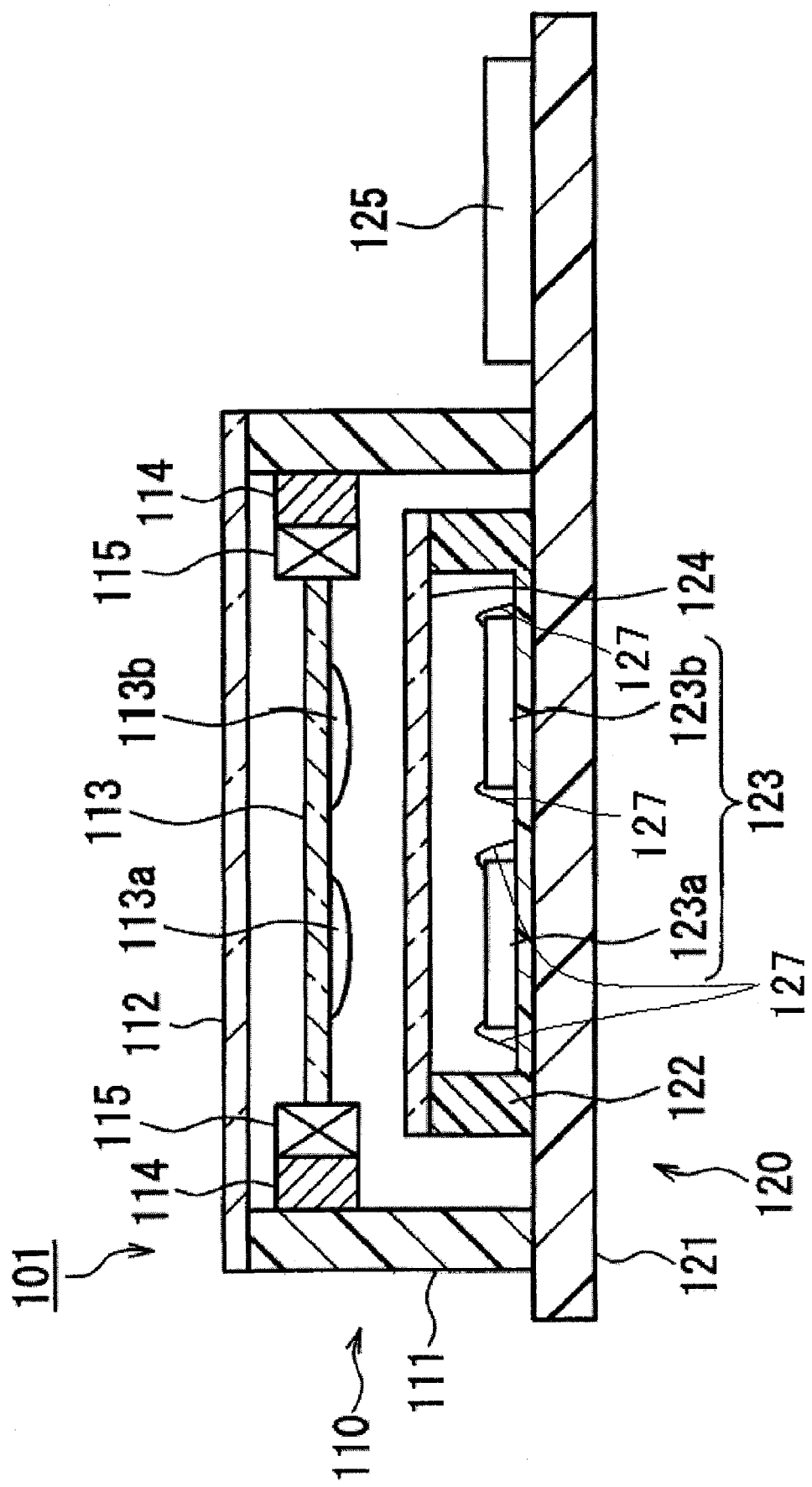
FIG. 1 is a cross-sectional view showing the configuration of an imaging device according to Embodiment 1 of the present invention.

An imaging device of the present invention has a plurality of lens units each including at least one lens, a plurality of imaging areas corresponding one-to-one with the plurality of lens units, and each having a light receiving surface substantially perpendicular to the optical axis direction of the corresponding lens unit, an imaging signal input unit that receives as input a plurality of imaging signals each output from a different one of the imaging areas, an intensity correction coefficient saving unit that saves an intensity correction coefficient, which is information concerning intensity unevenness in the imaging areas, and the intensity correcting unit that corrects the intensity of each of the plurality of imaging signals using the intensity correction coefficient, so as to reduce the effect of intensity unevenness in the imaging areas.

When there is variability in component precision or assembly, light intensity distribution is biased relative to the center of the optical axis depending on the color, producing false colors. The imaging device of the present invention enables biasing of light intensity distribution to be compensated by saving intensity correction coefficients and correcting the intensity of imaging signals based on the intensity correction coefficients, so as to reduce the effect of intensity unevenness in the imaging areas. The occurrence of false colors is thereby suppressed where, for example, images are synthesized from imaging signals after correction, enabling fine images to be synthesized.

The above imaging device preferably further includes an optical element on a light path of light incident on at least two of the plurality of imaging areas that has transmission characteristics substantially centered on a first wavelength, and an optical element on a light path of light incident on the remaining imaging areas that has transmission characteristics substantially centered on a different wavelength from the first wavelength. Further, the intensity correcting unit preferably corrects the intensity of at least the imaging signals corresponding to the imaging areas, of the plurality of the imaging areas, that receive light passing through the optical elements having transmission characteristics substantially centered on the first wavelength. Note that the first wavelength preferably is perceived as substantially green by human vision, for example.

The above imaging device preferably further includes a parallax calculating unit that derives a parallax between images formed by the plurality of lens units, based on the imaging signals whose intensity has been corrected by the intensity correcting unit, and a parallax correcting unit that corrects the plurality of imaging signals and performs image synthesis based on the parallax.

When there is variability in component precision or assembly, light intensity distribution is biased relative to the center of the optical axis depending on the color, and parallax cannot be derived correctly. This preferable configuration enables correct parallax to be derived since biasing of light intensity distribution is compensated by correcting the intensity of the imaging signals, and parallax is derived based on the corrected imaging signals. Also, since image synthesis is performed based on the correct parallax so as to reduce the effect of parallax, fine images can be synthesized.

Alternatively, the above imaging device preferably further includes a parallax calculating unit that derives a parallax between images formed by the plurality of lens units, based on the imaging signals whose intensity has been corrected by the intensity correcting unit, and a distance calculating unit that derives a distance to a subject based on the parallax.

When there is variability in component precision or assembly, light intensity distribution is biased relative to the center of the optical axis depending on the color, and parallax cannot be correctly derived. This preferable configuration enables the correct parallax to be derived since biasing of light intensity distribution is compensated by correcting the intensity of the imaging signals, and parallax is derived based on the corrected imaging signals. Also, the distance to the subject can be correctly derived based on the correct parallax.

The above imaging device preferably further includes a block dividing unit that divides at least one of the plurality of imaging signals into a plurality of blocks, and the parallax calculating unit preferably calculates the parallax between images formed by the plurality of lens units for each block.

According to this configuration, at least one of the plurality of imaging signals is divided into a plurality of blocks, the intensity of imaging signals corresponding to the at least two imaging areas that receive light passing through the light transmission elements having the same wavelength characteristics is corrected, biasing of light intensity distribution is compensated, and the correct parallax can be derived for each block based on the corrected imaging signals. Also, since image synthesis is performed based on correct parallax so as to reduce the effect of parallax for each block, fine images can be synthesized. Alternatively, the distance to the subject can be derived correctly based on the correct parallax.

The above imaging device preferably further includes an origin correction coefficient saving unit that saves an origin correction coefficient, which is information concerning correspondence between an origin of the optical axes of the plurality of lens units and an origin of the imaging signals, and an origin correcting unit that corrects an origin of each of the plurality of imaging signals based on the origin correction coefficient.

The above imaging device preferably further includes a distortion correction coefficient saving unit that saves a distortion correction coefficient, which is information concerning distortion of the lens units, and a distortion correcting unit that corrects each of the plurality of imaging signals based on the distortion correction coefficient, so as to reduce the effect of distortion of the plurality of lens units.

In the above imaging device, the intensity correcting unit preferably corrects the plurality of imaging signals such that intensity levels are equal.

A imaging device manufacturing method according to the present invention is for an imaging device that has a plurality of lens units each including at least one lens, a plurality of imaging areas corresponding one-to-one with the plurality of lens units, and each having a light receiving surface substantially perpendicular to the optical axis direction of the corresponding lens unit, an imaging signal input unit that receives as input a plurality of imaging signals each output from a different one of the imaging areas, an intensity correction coefficient saving unit that saves an intensity correction coefficient, which is information concerning intensity unevenness in the imaging areas, and an intensity correcting unit that corrects the intensity of the imaging signals using the intensity correction coefficient, so as to reduce the effect of intensity unevenness in the imaging areas, and includes a first image capturing step of using the imaging device to capture an image of a substantially white object, an intensity correction coefficient calculating step of calculating the intensity correction coefficient based on an imaging signal obtained in the first image capturing step, and a step of saving the intensity correction coefficient calculated in the intensity correction coefficient calculating step to the intensity correction coefficient saving unit.

By generating intensity correction coefficients based on imaging signals obtained by capturing an image of a substantially white object such as a display or a test chart displaying uniform white light, for example, and writing the intensity correction coefficients to an intensity correction coefficient saving unit in the manufacturing process, biasing of the light intensity distribution can be compensated and the occurrence of false colors can be suppressed even if the variability in component precision or assembly is different for each device, enabling fine images to be synthesized.

In the above manufacturing method, preferably the imaging device further includes an origin correction coefficient saving unit that saves an origin correction coefficient, which is information concerning correspondence between an origin of the optical axes of the plurality of lens units and an origin of the imaging signals, and an origin correcting unit that corrects an origin of the imaging signals based on the origin correction coefficient, and the manufacturing method further includes a second image capturing step of using the imaging device to capture an image of an object having a pattern that includes a cross in a central portion thereof, an origin correction coefficient calculating step of calculating the origin correction coefficient based on an imaging signal obtained in the second image capturing step, and a step of saving the origin correction coefficient calculated in the origin correction coefficient calculating step to the origin correction coefficient saving unit.

Origin correction coefficients for compensating origin deviation resulting from manufacturing variability caused by deviation in the lens units during manufacture, positional displacement of the imaging elements, or the like, thereby can be calculated and saved to an origin correction coefficient saving unit.

In the above manufacturing method, preferably the imaging device further includes a distortion correction coefficient saving unit that saves a distortion correction coefficient, which is information concerning distortion of the lens units, and a distortion correcting unit that corrects the imaging signals based on the distortion correction coefficient, so as to reduce the effect of distortion of the plurality of lens units, and the manufacturing method further includes a third image capturing step of using the imaging device to capture an image of an object having a lattice pattern, a distortion correction coefficient calculating step of calculating the distortion correction coefficient based on an imaging signal obtained in the third image capturing step, and a step of saving the distortion correction coefficient calculated in the distortion correction coefficient calculating step to the distortion correction coefficient saving unit.

This manufacturing method enables distortion correction coefficients for compensating lens distortion to be calculated and saved to a distortion correction coefficient saving unit.

In the above manufacturing method, preferably the imaging device further includes an origin correction coefficient saving unit that saves an origin correction coefficient, which is information concerning correspondence between an origin of the optical axes of the plurality of lens units and an origin of the imaging signals, and an origin correcting unit that corrects an origin of the imaging signals based on the origin correction coefficient, an object having a substantially white background and a pattern that includes a cross in a central portion thereof is used as the object in the first image capturing step, and the manufacturing method further includes an origin correction coefficient calculating step of calculating the origin correction coefficient based on the imaging signal obtained in the first image capturing step, and a step of saving the origin correction coefficient calculated in the origin correction coefficient calculating step to the origin correction coefficient saving unit.

This manufacturing method enables the number of times image capture is performed in the manufacturing process to be reduced and the tact time of the manufacturing process to be shortened, since intensity correction coefficients and origin correction coefficients are generated using the same imaging signal obtained by performing image capture once.

In the above manufacturing method, preferably the imaging device further includes a distortion correction coefficient saving unit that saves a distortion correction coefficient, which is information concerning distortion of the lens units, and a distortion correcting unit that corrects the imaging signals based on the distortion correction coefficient, so as to reduce the effect of distortion of the plurality of lens units, an object having a substantially white background and a lattice pattern is used as the object in the first image capturing step, and the manufacturing method further includes a distortion correction coefficient calculating step of calculating the distortion correction coefficient based on the imaging signal obtained in the first image capturing step, and a step of saving the distortion correction coefficient calculated in the distortion correction coefficient calculating step to the distortion correction coefficient saving unit.

This manufacturing method enables the number of times image capture is performed in the manufacturing process to be reduced and the tact time of the manufacturing process to be shortened, since intensity correction coefficients and distortion correction coefficients are generated using the same imaging signal obtained by performing image capture once.

In the above manufacturing method, preferably the imaging device further includes an origin correction coefficient saving unit that saves an origin correction coefficient, which is information concerning correspondence between an origin of the optical axes of the plurality of lens units and an origin of the imaging signals, an origin correcting unit that corrects an origin of the imaging signals based on the origin correction coefficient, a distortion correction coefficient saving unit that saves a distortion correction coefficient, which is information concerning distortion of the lens units, and a distortion correcting unit that corrects the imaging signals based on the distortion correction coefficient, so as to reduce the effect of distortion of the plurality of lens units, an object having a substantially white background and a lattice pattern is used as the object in the first image capturing step, and the manufacturing method further includes an origin correction coefficient calculating step of calculating the origin correction coefficient based on the imaging signal obtained in the first image capturing step, a distortion correction coefficient calculating step of calculating the distortion correction coefficient based on the imaging signal obtained in the first image capturing step, and a step of saving the origin correction coefficient calculated in the origin correction coefficient calculating step to the origin correction coefficient saving unit, and saving the distortion correction coefficient calculated in the distortion correction coefficient calculating step to the distortion correction coefficient saving unit.

This manufacturing method enables the number of times image capture is performed in the manufacturing process to be reduced and the tact time of the manufacturing process to be shortened, since intensity correction coefficients, origin correction coefficients and distortion correction coefficients are generated using the same imaging signal obtained by performing image capture once.

Hereinafter, specific embodiments of the present invention will be described with reference to the drawings.

Embodiment 1

An imaging device according to Embodiment 1 of the present invention saves intensity correction coefficients, and corrects the intensity of imaging signals based on the intensity correction coefficients such that the degree of correction changes depending on the position of the imaging area. Biasing of light intensity distribution is thereby compensated, the occurrence of false colors is suppressed, and fine images are synthesized.

The imaging device according to Embodiment 1 of the present invention divides at least one of the plurality of imaging signals into a plurality of blocks, corrects the intensity of imaging signals corresponding to the at least two imaging areas that receive light passing through the light transmission elements having the same wavelength characteristics, compensates for biasing of light intensity distribution, derives a parallax for each block based on the corrected imaging signals, and performs image synthesis based on this parallax so as to reduce the effect of parallax for each block. Since biasing of light intensity distribution is thereby compensated, correct parallax derived, and image synthesis performed based on this correct parallax, fine images can be synthesized.

The imaging device according to Embodiment 1 of the present invention saves an origin correction coefficient, corrects the origin of imaging signals based on the origin correction coefficient, derives a parallax for each block based on the corrected imaging signals, and performs image synthesis based on this parallax so as to reduce the effect of parallax for each block. Since origin deviation is thereby compensated, correct parallax derived, and image synthesis performed based on this correct parallax, fine images can be synthesized.

The imaging device according to Embodiment 1 of the present invention saves a distortion correction coefficient, corrects imaging signals based on the distortion correction coefficient so as to reduce the effect of distortion of the plurality of lens units, derives a parallax for each block based on the corrected imaging signals, and performs image synthesis based on this parallax so as to reduce the effect of parallax for each block. Since the effect of distortion is thereby reduced, correct parallax is derived, and image synthesis is performed based on this correct parallax, fine images can be synthesized.

The imaging device according to Embodiment 1 of the present invention will be described with reference to the drawings.

FIG. 1 is a cross-sectional view showing the configuration of the imaging device according to Embodiment 1 of the present invention. In FIG. 1, an imaging device 101 has a lens module unit 110 and a circuit unit 120.

The lens module unit 110 has a lens barrel 111, an upper cover glass 112, a lens 113, a fixed actuator portion 114, and a movable actuator portion 115. The circuit unit 120 has a substrate 121, a package 122, an imaging element 123, a package cover glass 124, and a system LSI (hereinafter, SLSI) 125.

The lens barrel 111 is cylindrical and formed by injection-molding resin, and the inner surface thereof is lusterless black in order to prevent diffused reflection of light. The upper cover glass 112 is discoid, formed from transparent resin, and anchored to the top surface of the lens barrel 111 using adhesive or the like, and the surface thereof is provided with a protective film for preventing damage caused by friction or the like and an antireflective film for preventing reflection of incident light.

Figure 2:
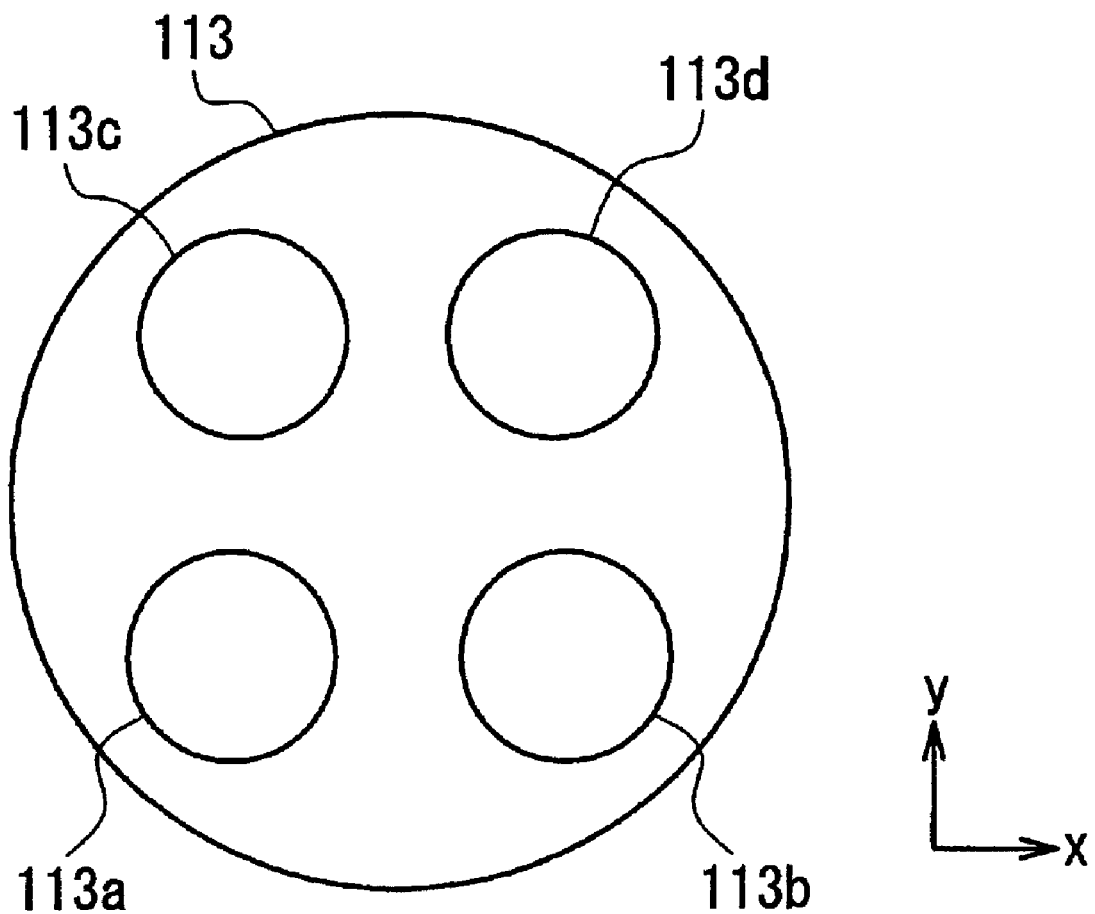
FIG. 2 is a top view of the lens of the imaging device according to Embodiment 1 of the present invention.

FIG. 2 is a top view of the lens 113 of the imaging device according to Embodiment 1 of the present invention. The lens 113 is substantially discoid and formed from glass or transparent resin, and has a first lens unit 113a, a second lens unit 113b, a third lens unit 113c, and a fourth lens unit 113d disposed in a grid. The X-axis and the Y-axis are set as shown in FIG. 2, along the directions in which the first to fourth lens units 113a to 113d are disposed. Light incident on the first lens unit 113a, the second lens unit 113b, the third lens unit 113c, and the fourth lens unit 113d from the side on which the subject is positioned is emitted to the side on which the imaging element 123 is positioned, and four images are formed on the imaging element 123.

The fixed actuator portion 114 is anchored to the inner surface of the lens barrel 111 by adhesive or the like. The movable actuator portion 115 is anchored to the outer periphery of the lens 113 by adhesive or the like. The fixed actuator portion 114 and the movable actuator portion 115 constitute a voice coil motor. The fixed actuator portion 114 has a permanent magnet (not shown) and a ferromagnetic yoke (not shown), while the movable actuator portion 115 has a coil (not shown). The movable actuator portion 115 is elastically supported by an elastic body (not shown) relative to the fixed actuator portion 114. The movable actuator portion 115 moves relative to the fixed actuator portion 114 as a result of energizing the coil of the movable actuator portion 115, which changes the relative distance along the optical axis between the lens 113 an the imaging element 123.

The substrate 121 is constituted by a resin substrate, and is anchored by adhesive or the like, with the bottom surface of the lens barrel 111 contacting the top thereof. The circuit unit 120 is thus anchored to the lens module unit 110 to constitute the imaging device 101.

The package 122 is formed from resin having a metal terminal, and is anchored inside the lens barrel 111 by soldering or the like the metal terminal unit to the top surface of the substrate 121. The imaging element 123 is constituted by a first imaging element 123a, a second imaging element 123b, a third imaging element 123c, and a fourth imaging element 123d. The first imaging element 123a, the second imaging element 123b, the third imaging element 123c and the fourth imaging element 123d are solid state imaging elements such as CCD sensors or CMOS sensors, and are disposed such that the centers of the light receiving surfaces thereof are substantially aligned with the centers of the optical axes of the first lens unit 113a, the second lens unit 113b, the third lens unit 113c and the fourth lens unit 113d, and such that the light receiving surfaces of the imaging elements are substantially perpendicular to the optical axes of the corresponding lens units. The terminals of the first imaging element 123a, the second imaging element 123b, the third imaging element 123c and the fourth imaging element 123d are connected with gold wires 127 by wire bonding to the metal terminal on a bottom portion of the package 122 on the inside thereof, and electrically connected to the SLSI 125 via the substrate 121. Light emitted from the first lens unit 113a, the second lens unit 113b, the third lens unit 113c and the fourth lens unit 113d forms images on the light receiving surfaces of the first imaging element 123a, the second imaging element 123b, the third imaging element 123c and the fourth imaging element 123d, and electrical information converted from optical information by a photodiode is output to the SLSI 125.

Figure 3:
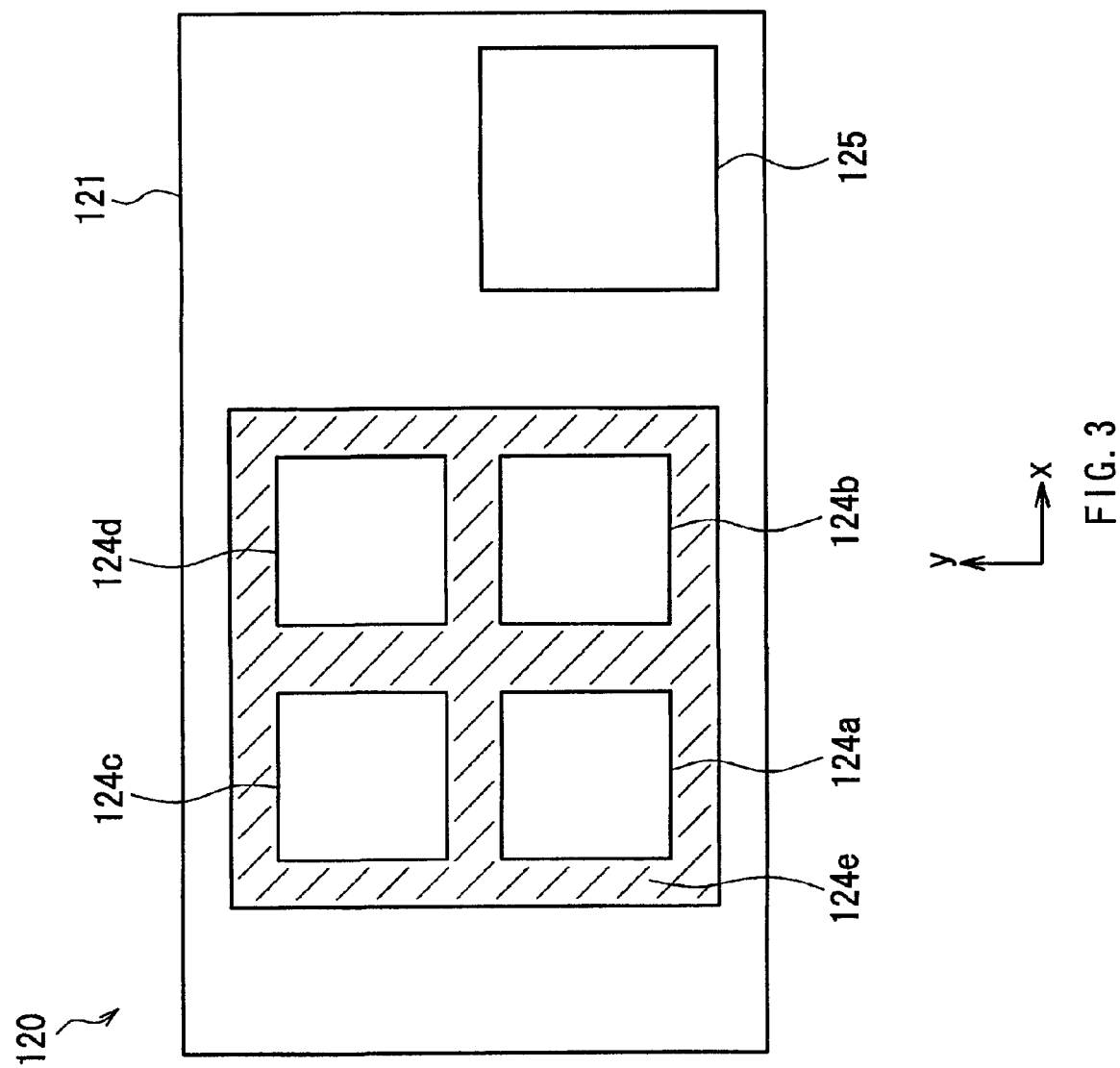
FIG. 3 is a top view of the circuit unit of the imaging device according to Embodiment 1 of the present invention.

FIG. 3 is a top view of the circuit unit 120 of the imaging device according to Embodiment 1 of the present invention. The package cover glass 124 is flat, formed using transparent resin, and anchored to the top surface of the package 122 by adhesive or the like. A first color filter 124a, a second color filter 124b, a third color filter 124c, a fourth color filter 124d and a shading portion 124e are disposed on the top surface of the package cover glass 124 by vapor deposition or the like. An infrared blocking filter (not shown; hereinafter, IR filter) is provided on the bottom surface of the package cover glass 124 by vapor deposition or the like.

FIG. 4 is a characteristics diagram of the color filters of the imaging device according to Embodiment 1 of the present invention, while FIG. 5 is a characteristics diagram of the IR filter of the imaging device according to Embodiment 1 of the present invention. The first color filter 124a has a spectral transmission characteristic of transmitting mainly green as shown by G in FIG. 4, the second color filter 124b has a spectral transmission characteristic of transmitting mainly blue as shown by B in FIG. 4, the third color filter 124c has a spectral transmission characteristic of transmitting mainly red as shown by R in FIG. 4, and the fourth color filter 124d has spectral transmission characteristics for transmitting mainly green as shown by G in FIG. 4. The IR filter has a spectral transmission characteristic of blocking infrared light as shown by IR in FIG. 5.

Consequently, object light incident from a top portion of the first lens unit 113a is emitted from a bottom portion of the first lens unit 113a, and the first imaging element 123a receives the green component of the object light, since mainly green is transmitted by the first color filter 124a and IR filter, and forms an image on the light receiving portion of the first imaging element 123a. Object light incident from a top portion of the second lens unit 113b is emitted from a bottom portion of the second lens unit 113b, and the second imaging element 123b receives the blue component of the object light, since mainly blue is transmitted by the second color filter 124b and IR filter, and forms an image on the light receiving portion of the second imaging element 123b. Object light incident from a top portion of the third lens unit 113c is emitted from a bottom portion of the third lens unit 113c, and the third imaging element 123c receives the red component of the object light since mainly red is transmitted by the third color filter 124c and IR filter, and forms an image on the light receiving portion of the third imaging element 123c. Further, object light incident from a top portion of the fourth lens unit 113d is emitted from a bottom portion of the fourth lens unit 113d, and the fourth imaging element 123d receives the green component of the object light since mainly green is transmitted by the fourth color filter 124d and IR filter, and forms an image on the light receiving portion of the fourth imaging element 123d.

The SLSI 125 controls the energizing of the coil of the movable actuator portion 115, drives the imaging element 123, receives as input electrical information from the imaging element 123, performs various image processing, communicates with a host CPU, and outputs images externally as described later.

The relationship between subject distance and parallax will be described next. Since the camera module according to Embodiment 1 of the present invention has four lens units (first lens unit 113a, second lens unit 113b, third lens unit 113c, fourth lens unit 113d), the relative position of the four object images respectively formed by the four lens units changes according to subject distance.

Figure 6:
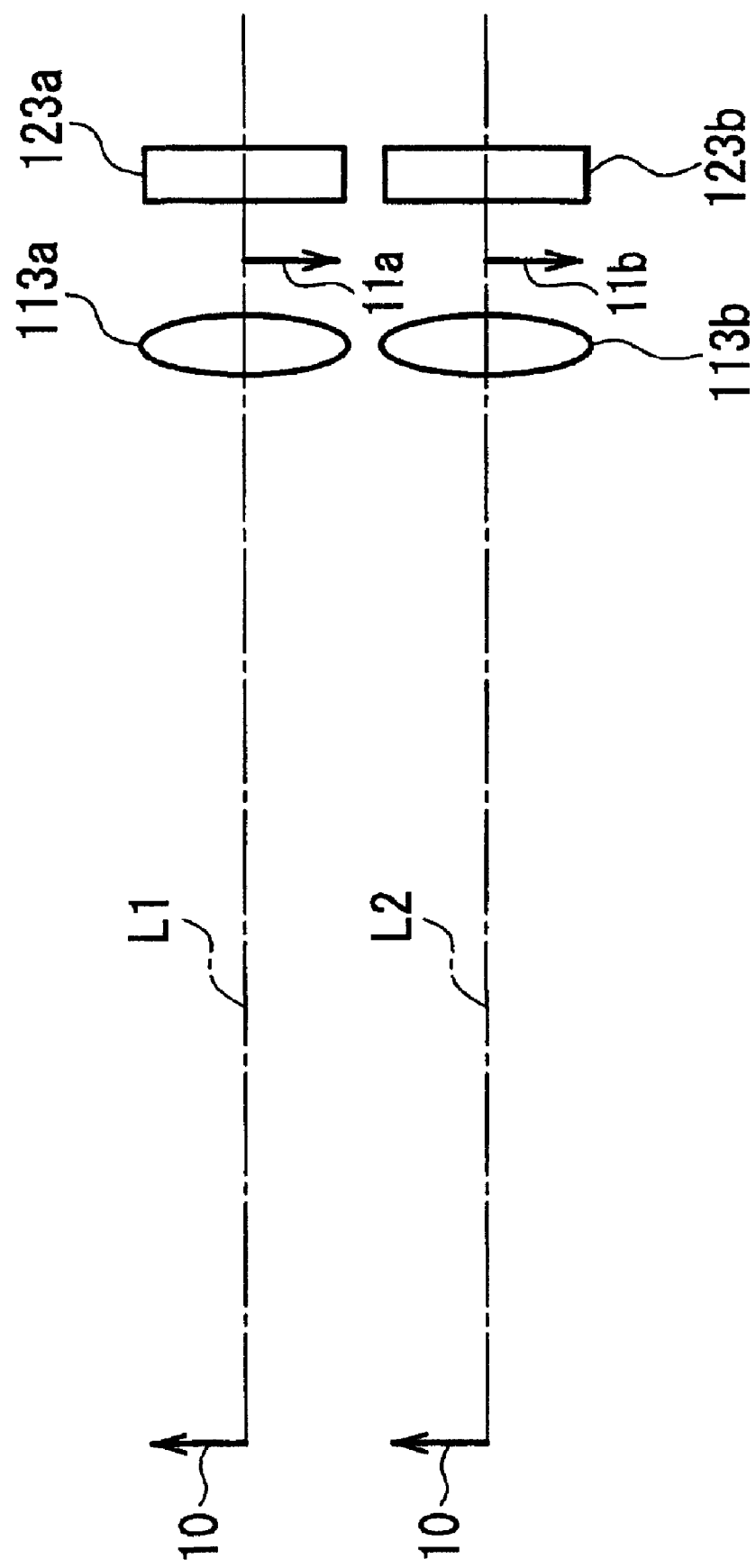
FIG. 6 illustrates the position of images of an object at infinity in the imaging device according to Embodiment 1 of the present invention.

FIG. 6 illustrates the position of images of an object at infinity in the imaging device according to Embodiment 1 of the present invention. In FIG. 6, only the first lens unit 113a, the first imaging element 123a, the second lens unit 113b, and the second imaging element 123b are shown for simplicity. Since light L1 of light from an object 10 at infinity incident on the first lens unit 113a is parallel with light L2 incident on the second lens unit 113b, the distance between the first lens unit 113a and the second lens unit 113b is equal to the distance between an object image 11a on the first imaging element 123a and an object image 11b on the second imaging element 123b. Here, the optical axis of the first lens unit 113a, the optical axis of the second lens unit 113b, the optical axis of the third lens unit 113c, and the optical axis of the fourth lens unit 113d are disposed so as to substantially coincide respectively with the centers of the light receiving surfaces of the first imaging element 123a, the center of the second imaging element 123b, the center of the third imaging element 123c, and the center of the fourth imaging element 123d. Consequently, the relative positional relation of the centers of the light receiving surfaces of the first imaging element 123a, the second imaging element 123b, the third imaging element 123c and the fourth imaging element 123d with the images of the object at infinity respectively formed on the light receiving surfaces is the same for all of the imaging elements. In other words, there is no parallax.

Figure 7:
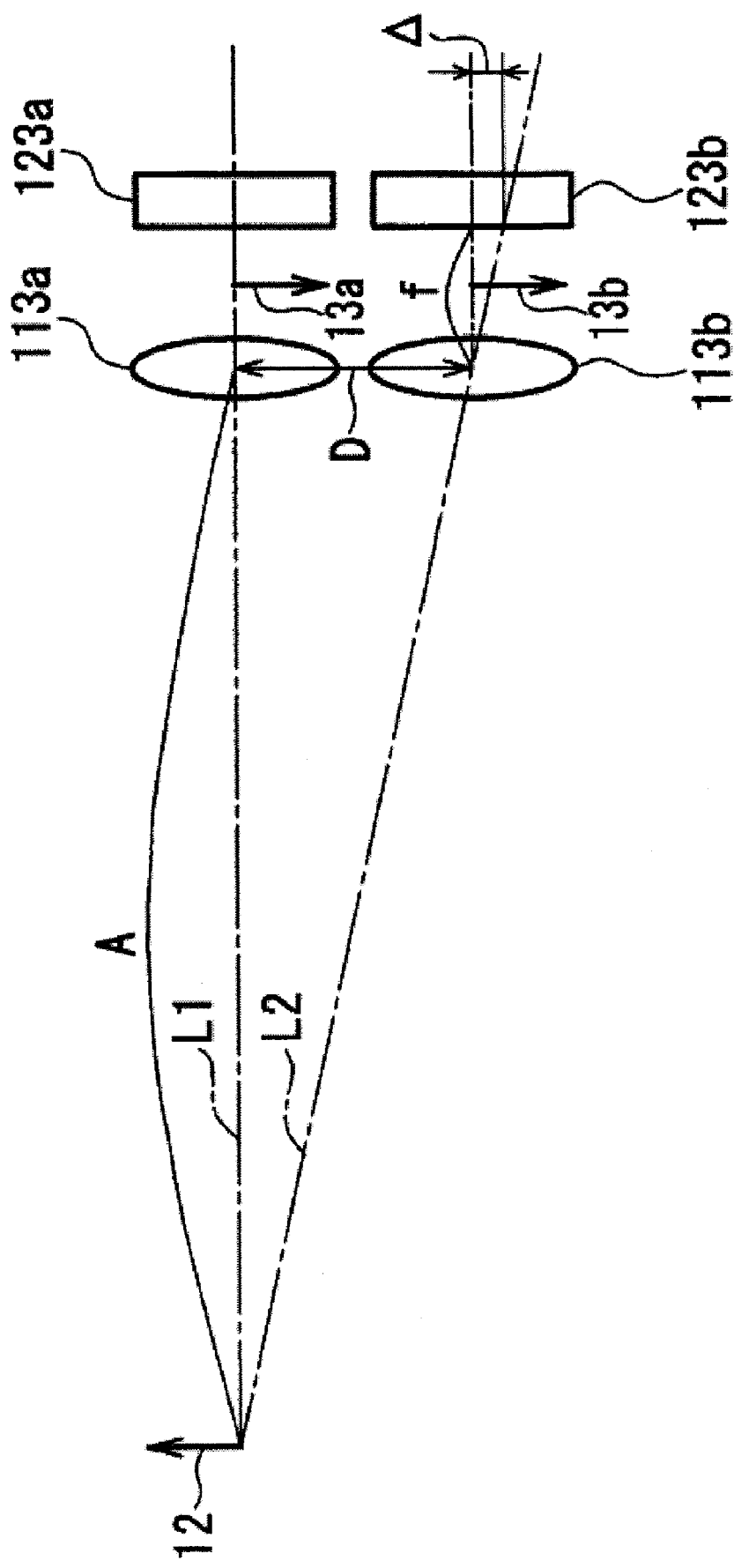
FIG. 7 illustrates the position of images of an object at a finite distance in the imaging device according to Embodiment 1 of the present invention.

FIG. 7 illustrates the position of images of an object at a finite distance in the imaging device according to Embodiment 1 of the present invention. In FIG. 7, only the first lens unit 113a, the first imaging element 123a, the second lens unit 113b, and the second imaging element 123b are shown for simplicity. Since light L1 of light from an object 12 at a finite distance incident on the first lens unit 113a is not parallel with light L2 incident on the second lens unit 113b, the distance between an object image 13a on the first imaging element 123a and an object image 13b on the second imaging element 123b is longer than the distance between the first lens unit 113a and the second lens unit 113b. Thus, the relative positional relationship of the centers of the light receiving surfaces of the first imaging element 123a, the second imaging element 123b, the third imaging element 123c and the fourth imaging element 123d with the images of the object at a finite distance respectively formed on the light receiving surfaces differs for each imaging elements. In other words, there is parallax. The parallax $\Delta$ is expressed by the following equation (1), given that the right triangle whose two sides A and D in FIG. 7 form a right angle is similar to the right triangle whose two sides f and $\Delta$ form a right angle, where A is the distance to the object 12 (subject distance), D is the distance between the first lens unit 113a and the second lens unit 113b, and f is the focal length of the lens units 113a and 113b. Note that the asterisk "*" in the following equation (1) and in other equations described below denotes the multiplication operator. A similar relation is established between the other lens units. The relative positions of the four object images respectively formed by the four lens units 113a, 113b, 113c and 113d thus change according to the subject distance. For example, the parallax $\Delta$ increases with decreases in the subject distance A.

$$\Delta = f*D/A \tag{1}$$

The relationship between contrast and focal length will be described next.

Figure 8A:
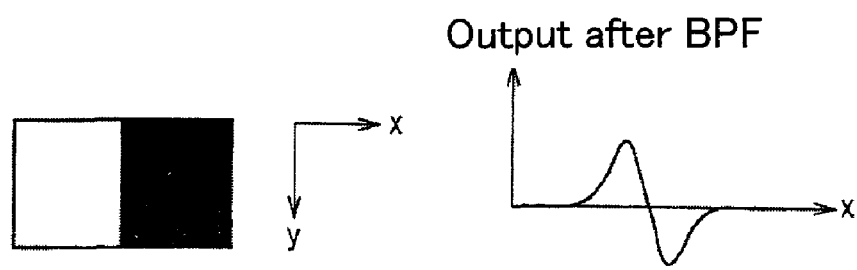
FIG. 8A illustrates the relationship between an in-focus image and a contrast evaluation value in the imaging device according to Embodiment 1 of the present invention.
Figure 8B:
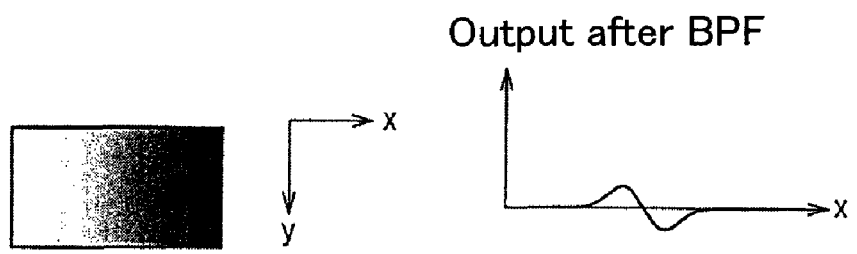
FIG. 8B illustrates the relationship between an out-of-focus image and a contrast evaluation value in the imaging device according to Embodiment 1 of the present invention.

FIG. 8A illustrates the relationship between an in-focus (focused) image and a contrast evaluation value in the imaging device according to Embodiment 1 of the present invention, and FIG. 8B illustrates the relationship between an out-of-focus (not focused) image and a contrast evaluation value in the imaging device according to Embodiment 1 of the present invention. The figures on the left-hand side in FIG. 8A and FIG. 8B are images captured of a rectangle whose left half is white and right half is black. As shown in the figure on the left-hand side of FIG. 8A, the outline of the captured image when in-focus is distinct and contrast is high. On the other hand, as shown in the figure on the left-hand side of FIG. 8B, the outline of the captured image when out-of-focus is blurred and contrast is low. The figures on the right-hand side of FIG. 8A and FIG. 8B show the results when a band-pass filter (BPF) is used on the information signals in the figures on the left-hand side. The horizontal axis plots the position in the x axis direction and the vertical axis plots output values after band-pass filtering. The signal amplitude after band-pass filtering when in-focus is large, as shown in the figure on the right-hand side of FIG. 8A, while the signal amplitude after band-pass filtering when out-of-focus is small, as shown in the figure on the right-hand side of FIG. 8B. Here, the signal amplitude after band-pass filtering is defined as a contrast evaluation value showing the level of contrast. Thus, the contrast evaluation value is high when in-focus, as shown in the figure on the right-hand side of FIG. 8A, and the contrast evaluation value is low when out-of-focus, as shown in the figure on the right-hand side of FIG. 8B.

Figure 9:
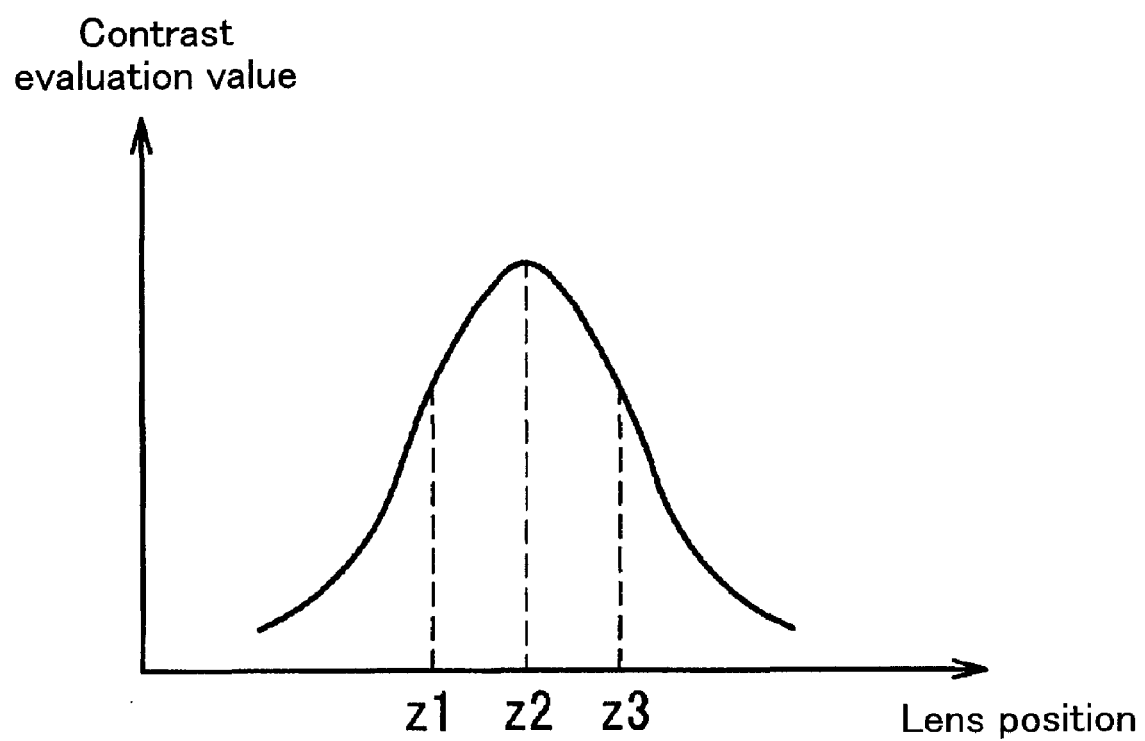
FIG. 9 illustrates the relationship between lens position and the contrast evaluation value in the imaging device according to Embodiment 1 of the present invention.

FIG. 9 illustrates the relationship between the lens position and the contrast evaluation value in the imaging device according to Embodiment 1 of the present invention. The contrast evaluation value will be small when the distance between the lens 113 and the imaging element 123 is short (z1) when capturing an image of a given object, because the object will not be in focus. The contrast evaluation value gradually increases as the distance between the lens 113 and the imaging element 123 gradually increases, and is maximized when in-focus (z2). Further, the object goes out of focus and the contrast evaluation value decreases as the distance between the lens 113 and the imaging element 123 gradually increases (z3). The contrast evaluation value is thus maximized when in-focus.

Figure 10:
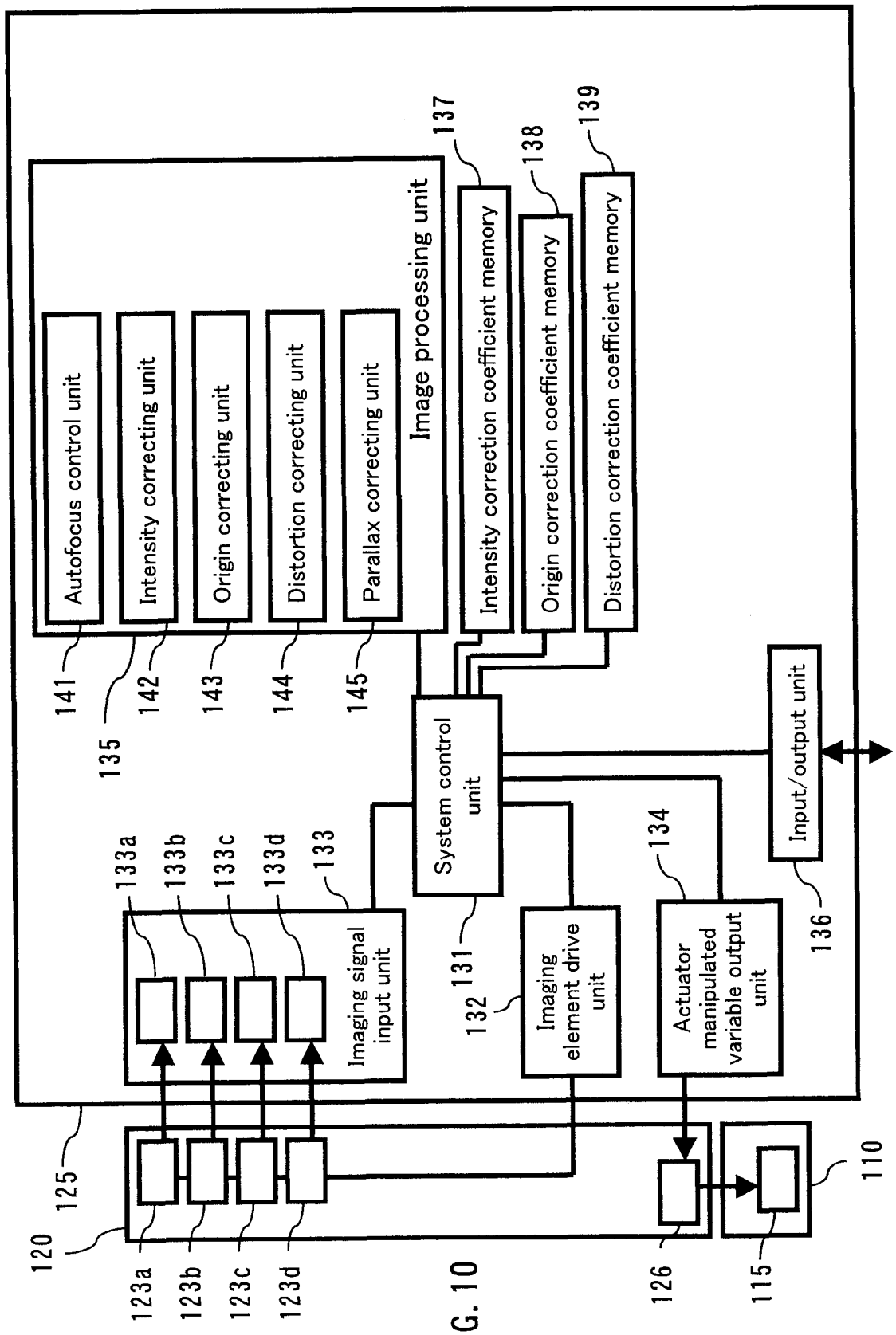
FIG. 10 is a block diagram of the imaging device according to Embodiment 1 of the present invention.

The operations of the imaging device according to Embodiment 1 of the present invention will be described next. FIG. 10 is a block diagram of the imaging device according to Embodiment 1 of the present invention. The SLSI 125 has a system control unit 131, an imaging element drive unit 132, an imaging signal input unit 133, an actuator manipulated variable output unit 134, an image processing unit 135, an input/output unit 136, an intensity correction coefficient memory 137, an origin correction coefficient memory 138, and a distortion correction coefficient memory 139. The circuit unit 120 has an amplifier 126 in addition to the above configuration.

The amplifier 126 applies a voltage that depends on the output from the actuator manipulated variable output unit 134 to the coil of the movable actuator portion 115.

The system control unit 131, which is constituted by a CPU (central processing unit), a memory and the like, controls the overall SLSI 125.

The imaging element drive unit 132, which is constituted by a logic circuit and the like, generates a signal for driving the imaging element 123, and applies a voltage that depends on this signal to the imaging element 123.

The imaging signal input unit 133 is constituted by a first imaging signal input unit 133a, a second imaging signal input unit 133b, a third imaging signal input unit 133c, and a fourth imaging signal input unit 133d. The first imaging signal input unit 133a, the second imaging signal input unit 133b, the third imaging signal input unit 133c, and the fourth imaging signal input unit 133d, each of which is configured with a CDS circuit (correlated double sampling circuit), an AGC (automatic gain controller), and an ADC (analog digital converter) connected in series, and are respectively connected to the first imaging element 123a, the second imaging element 123b, the third imaging element 123c, and the fourth imaging element 123d, receives as input electrical signals from the imaging elements, remove static noise using the CDS circuit, adjust gains using the AGC, convert the analog signals to digital values using the ADC, and write the digital values to the memory of the system control unit 131.

The actuator manipulated variable output unit 134, which is constituted by a DAC (digital analog converter), outputs a voltage signal that depends on the voltage to be applied to the coil of the movable actuator portion 115.

The image processing unit 135, which is configured to include a logic circuit or a DSP (digital signal processor), or both, performs various image processing in accordance with prescribed program controls, using information in the memory of the system control unit 131. The image processing unit 135 has an autofocus control unit 141, an intensity correcting unit 142, an origin correcting unit 143, a distortion correcting unit 144, and a parallax correcting unit 145.

The input/output unit 136 communicates with the host CPU (not shown), and outputs image signals to the host CPU, an external memory (not shown) and an external display device such as an LCD (not shown).

The intensity correction coefficient memory 137, which is constituted by a nonvolatile memory such as a flash memory or a FeRAM (ferroelectric random access memory), saves intensity correction coefficients for use by the intensity correcting unit 142. The origin correction coefficient memory 138, which is constituted by a nonvolatile memory such as a flash memory or a FeRAM, saves origin correction coefficients for use by the origin correcting unit 143. The distortion correction coefficient memory 139, which is constituted by a nonvolatile memory such as a flash memory or a FeRAM, saves distortion correction coefficients for use by the distortion correcting unit 144.

Figure 11:
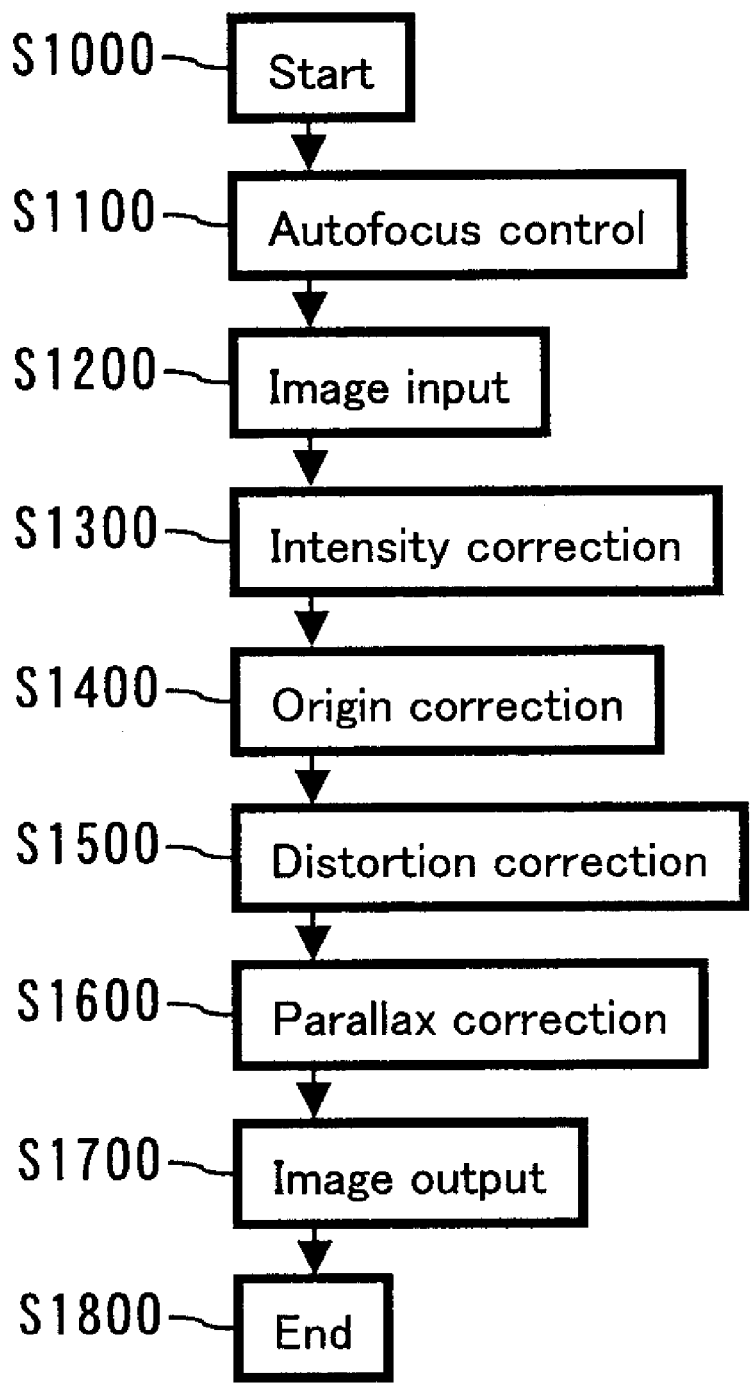
FIG. 11 is a flowchart showing the operations of the imaging device according to Embodiment 1 of the present invention.

FIG. 11 is a flowchart showing the operations of the imaging device according to Embodiment 1 of the present invention. The imaging device 101 is operated by the system control unit 131 of the SLSI 125 as per this flowchart.

In step S1000, operations are started. For example, the imaging device 101 starts operations as the result of the host CPU (not shown) detecting that a shutter button (not shown) has been pressed, and instructing the imaging device 101 to start operations via the input/output unit 136. Step S1100 is executed next.

Figure 12:
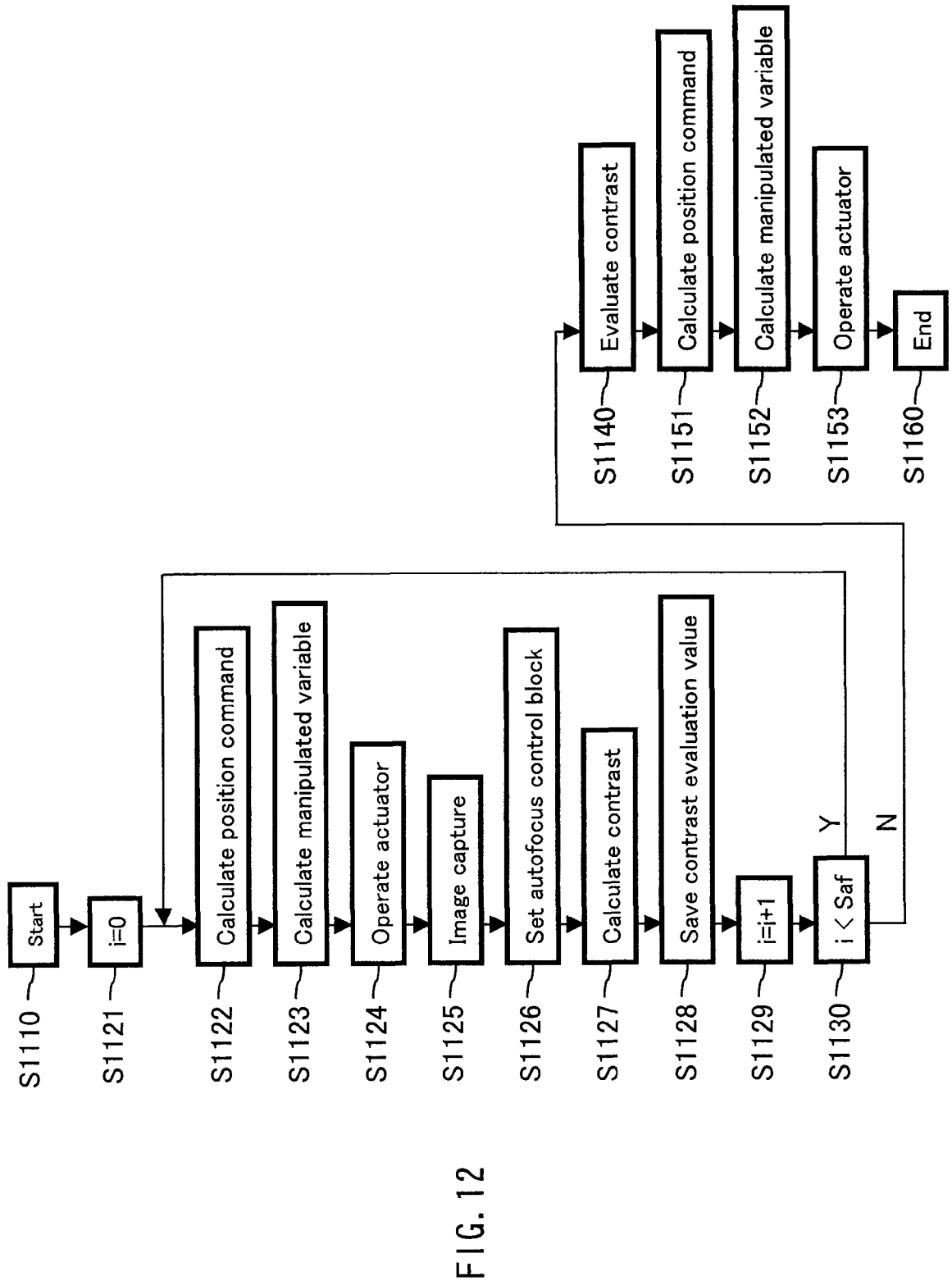
FIG. 12 is a flowchart showing an autofocus control operation according to Embodiment 1 of the present invention.

In step S1100, the autofocus control unit 141 executes autofocus controls. FIG. 12 is a flowchart showing autofocus control operations according to Embodiment 1 of the present invention. The flowchart of FIG. 12 shows the operations of step S1100 in detail.

In step S1110, the autofocus control operations are started. Step S1121 is executed next.

In step S1121, a counter i is initiated to 0. Step S1122 is executed next.

In step S1122, the position command for the actuator is calculated. A position command Xact for the actuator is calculated using the counter i, as in the following equation (2). Note that the position command Xact indicates the position at which the sense towards the subject is positive, based on the in-focus position of the image at infinity. Here, kx is the set value. Step S1123 is executed next.

$$Xact = kx * i \quad (2)$$

In step S1123, the actuator manipulated variable (voltage applied to the coil of the movable actuator portion 115) Vact is calculated using a manipulated variable function shown by the following equation (3). Here, ka and kb are the respectively set values. Step S1124 is executed next.

$$Vact = ka * Xact + kb \quad (3)$$

In step S1124, the actuator is operated. The actuator manipulated variable output unit 134 changes the output voltage signal such that the voltage applied to the coil (not shown) of the movable actuator portion 115 after passing through the amplifier 126 will be Vact. Step S1125 is executed next.

Figure 13:
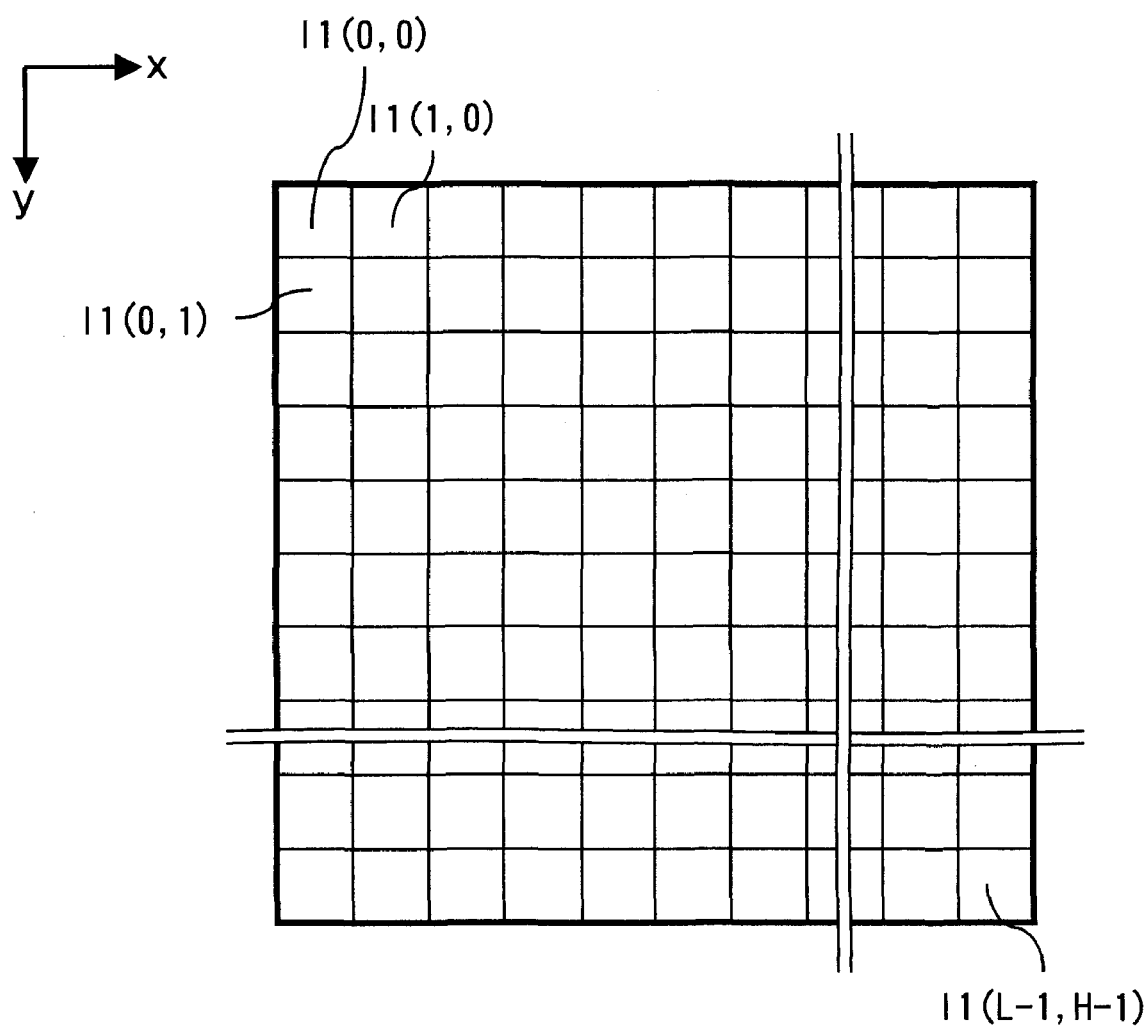
FIG. 13 illustrates the coordinates of an imaging signal of the imaging device according to Embodiment 1 of the present invention.

In step S1125, the subject image incident on the first lens unit 113a and formed on the first imaging element 123a is captured. The imaging element drive unit 132 outputs signals for operating an electronic shutter and/or performing transfer as needed, as a result of instructions from the system control unit 131. The first imaging signal input unit 133a, in sync with signals generated by the imaging element drive unit 132, receives as input an imaging signal, which is an analog signal of an image output by the first imaging element 123a, removes static noise using the CDS, automatically adjusts input gain using the AGC, converts the analog signal to a digital value using the ADC, and writes the digital value to the memory of a prescribed address in the system control unit 131 as a first imaging signal I1(x, y). FIG. 13 illustrates the coordinates of an imaging signal of the imaging device according to Embodiment 1 of the present invention. I1(x, y) indicates the first imaging signal of the x-th horizontal and y-th vertical pixel. The total number of pixels is H×L, where H is the number of pixels in the height direction and L is the number of pixels in the length direction of the input image, with x changing from 0 to L−1, and y changing from 0 to H−1. Step S1126 is executed next.

In step S1126, an autofocus control block is set. A rectangular area in a vicinity of the center of the image area is assumed to be the autofocus control block. Note that this block need not necessarily be in a vicinity of the center of the image area, and may be set to reflect the intentions of the user operating the camera, for instance (e.g., detecting the view direction with a sensor). Note also that a plurality of blocks may be selected rather than a single block, and the average of the contrast evaluation values for use in autofocus control (described hereinafter) in the plurality of blocks may be used. Also, the contrast evaluation values for use in autofocus control (described hereinafter) may be calculated for a plurality of blocks, and at least one of the blocks later selected as the autofocus control block. Step S1127 is executed next.

In step S1127, a contrast evaluation value for use in autofocus control is generated using data in the memory of the system control unit 131. This calculation is performed for pixels in the autofocus control block of the first imaging signal I1. The absolute values of the Laplacian, which is the sum of the second-order derivatives of the x and y directions, are calculated as in the following equation (11), spatially filtered using a LPF (low-pass filter) as in the following equation (12), and averaged in the autofocus control block to obtain an autofocus control contrast evaluation value C3 as in the following equation (13). Here, Naf is the number of pixel in the autofocus control block. Step S1128 is executed next.

$$C1(x, y) = \\ |I1(x-1, y) + I1(x+1, y) + I1(x, y-1) + I1(x, y+1) - 4I1(x, y)| \quad (11)$$

-continued $$C2(x, y) = C1(x-1, y-1) + C1(x, y-1) + \\ C1(x+1, y-1) + C1(x-1, y) + C1(x, y) + C1(x+1, y) + \\ C1(x-1, y+1) + C1(x, y+1) + C1(x+1, y+1) \quad (12)$$

$$C3 = \sum C2(x, y)/Naf \quad (13)$$

In step S1128, the contrast evaluation value C3 is written to the memory of the system control unit 131 as C3(i), as in the following equation (14). Step S1129 is executed next.

$$C3(i)=C3 \quad (14)$$

In step S1129, 1 is added to the counter i as in the following equation (15). Step S1130 is executed next.

$$i=i+1 \quad (15)$$

In step S1130, the counter i is compared with a threshold Saf, and branching is performed depending on the result. If the counter i is smaller than the threshold Saf (comparison result of step S1130=Y), step S1122 is executed next. On the other hand, if the counter i is greater than or equal to the threshold Saf (comparison result of step S1130=N), step S1140 is executed next. The processing from step S1122 to step S1128 is thus repeated Saf number of times by initiating the counter i to 0 in step S1121, adding 1 to the counter i in step S1129, and performing branching with the counter i in step S1130.

In step S1140, the contrast evaluation value C3 is evaluated. As in FIG. 9, the contrast evaluation value C3 is maximized at the in-focus position. The counter value i that gives this maximum value is assumed to be a counter value iaf that gives the maximum contrast, as in the following equation (16). Step S1151 is executed next.

$$iaf=i \text{ giving maximum value of } C3 \quad (16)$$

In step S1151, the position command for the actuator is calculated. The position command Xact for the actuator is calculated using the counter value iaf giving the maximum contrast, as in the following equation (17). Note that position command Xact indicates the position at which the sense towards the subject is positive based on the in-focus position of the image at infinity. Step S1152 is executed next.

$$X\text{act}=kx*iaf \quad (17)$$

In step S1152, the actuator manipulated variable (voltage applied to the coil of the movable actuator portion 115) Vact is calculated using a manipulated variable function. The description of this operation, which is similar to step S1123, is omitted. Step S1153 is executed next.

In step S1153, the actuator is operated. The description of this operation, which is similar to step S1124, is omitted. Step S1160 is executed next.

In step S1160, autofocus control is ended and processing returns to the main routine. Accordingly, step S1200 of FIG. 11 is executed next.

In step S1200, an image is input. The imaging element drive unit 132 outputs signals for operating an electronic shutter and/or performing transfer as needed, as a result of instructions from the system control unit 131. The first imaging signal input unit 133a, the second imaging signal input unit 133b, the third imaging signal input unit 133c, and the fourth imaging signal input unit 133d, in sync with signals generated by the imaging element drive unit 132, respectively receive as input imaging signals, which are analog signals of images output by the first imaging element 123a, the second imaging element 123b, the third imaging element 123c and the fourth imaging element 123d, remove static noise using the CDS, automatically adjust input gains using the AGC, converts the analog signals to digital values using the ADC, and write the digital values to the memory of prescribed addresses in the system control unit 131 as a first imaging signal I1(x, y), a second imaging signal I2(x, y), a third imaging signal I3(x, y), and a fourth imaging signal I4(x, y). FIG. 13 illustrates the coordinates of an imaging signal of the camera module according to Embodiment 1 of the present invention. I1(x, y) indicates the first imaging signal of the x-th horizontal and y-th vertical pixel. The total number of pixels is H×L, where H is the number of pixels in the height direction and L is the number of pixels in the length direction of the input image, with x changing from 0 to L−1, and y changing from 0 to H−1. The second imaging signal I2(x, y), the third imaging signal I3(x, y), and the fourth imaging signal I4(x, y) are similar. That is, I2(x, y), I3(x, y) and I4(x, y) respectively show the second imaging signal, the third imaging signal and the fourth imaging signal of the x-th horizontal and y-th vertical pixel. The respective total number of pixels is H×L, where H is the number of pixels in the height direction and L is the number of pixels in the length direction of the input image, with x changing from 0 to L−1, and y changing from 0 to H−1. Step S1300 is executed next.

In step S1300, the intensity correcting unit 142 corrects the first imaging signal I1, the second imaging signal I2, the third imaging signal I3, and the fourth imaging signal I4 using intensity correction coefficients saved in the intensity correction coefficient memory 137. The results are then written to the memory of the system control unit 131.

A first intensity correction coefficient a1(x, y) for use in correcting the first imaging signal I1(x, y), a second intensity correction coefficient a2(x, y) for use in correcting the second imaging signal I2(x, y), a third intensity correction coefficient a3(x, y) for use in correcting the third imaging signal I3(x, y), and a fourth intensity correction coefficient a4(x, y) for use in correcting the fourth imaging signal I4(x, y) are saved in the intensity correction coefficient memory 137. a1(x, y), a2(x, y), a3(x, y) and a4(x, y) respectively indicate the first intensity correction coefficient, the second intensity correction coefficient, the third intensity correction coefficient and the fourth intensity correction coefficient of the x-th horizontal and y-th vertical pixel. The total number of pixels is H×L, where H is the number of pixels in the height direction and L is the number of pixels in the length direction of the input image, with x changing from 0 to L−1, and y changing from 0 to H−1.

Figure 14:
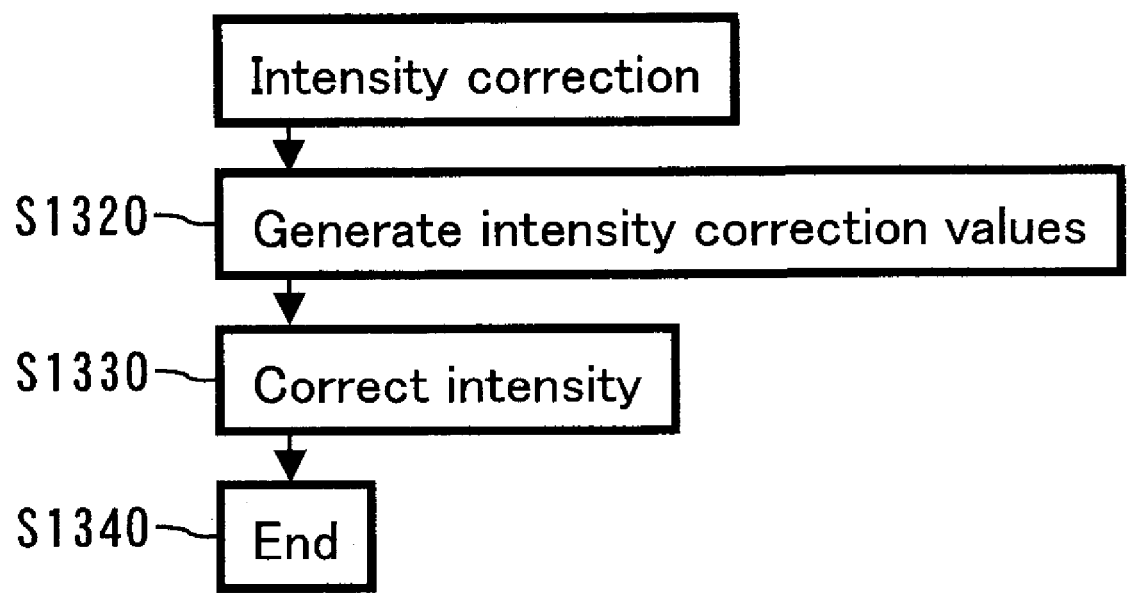
FIG. 14 is a flowchart showing an intensity correction operation according to Embodiment 1 of the present invention.

FIG. 14 is a flowchart showing the intensity correction operation according to Embodiment 1 of the present invention. The flowchart of FIG. 14 shows step S1300, in which intensity correction is performed, in detail.

Firstly, in step S1320, a correction value for each pixel (x, y) is calculated. The results of respectively multiplying kab1, kab2, kab3 and kab4 by the first intensity correction coefficient a1(x, y), the second intensity correction coefficient a2(x, y), the third intensity correction coefficient a3(x, y), and the fourth intensity correction coefficient a4(x, y) are set as a first intensity correction value b1(x, y), a second intensity correction value b2(x, y), a third intensity correction value b3(x, y), and a fourth intensity correction value b4(x, y), as in the following equations (18), (19), (20), and (21). Step S1330 is executed next.

$$b1(x,y)=kab1*a1(x,y) \quad (18)$$

$$b2(x,y)=kab2*a2(x,y) \quad (19)$$

$$b3(x,y)=kab3*a3(x,y) \quad (20)$$

$$b4(x,y)=kab4*a4(x,y) \quad (21)$$

In step S1330, intensity correction is performed. Intensity is corrected by respectively multiplying the first imaging signal I1(x, y), the second imaging signal I2(x, y), the third imaging signal I3(x, y), and the fourth imaging signal I4(x, y) by the first intensity correction value b1(x, y), the second intensity correction value b2(x, y), the third intensity correction value b3(x, y), and the fourth intensity correction value b4(x, y), as in the following equations (22), (23), (24), and (25). Step S1340 is executed next.

$$I1(x,y)=I1(x,y)*b1(x,y) \quad (22)$$

$$I2(x,y)=I2(x,y)*b2(x,y) \quad (23)$$

$$I3(x,y)=I3(x,y)*b3(x,y) \quad (24)$$

$$I4(x,y)=I4(x,y)*b4(x,y) \quad (25)$$

In step S1340, intensity correction is ended and processing returns to the main routine. Accordingly, step S1400 of FIG. 11 is executed next.

In step S1400, the origin correcting unit 143 corrects the first imaging signal I1, the second imaging signal I2, the third imaging signal I3, and the fourth imaging signal I4 using origin correction coefficients saved in the origin correction coefficient memory 138. The results are then written to the memory of the system control unit 131.

A first origin correction coefficient g1x, g1y for use in correcting the first imaging signal I1(x, y), a second origin correction coefficient g2x, g2y for use in correcting the second imaging signal I2(x, y), a third origin correction coefficient g3x, g3y for use in correcting the third imaging signal I3(x, y), and a fourth origin correction coefficient g4x, g4y for use in correcting the fourth imaging signal I4(x, y) are saved in the origin correction coefficient memory 138. g1x, g2x, g3x and g4x respectively indicate the x component of the origin correction coefficients, and g1y, g2y, g3y and g4y respectively indicate the y component of the origin correction coefficients.

The first imaging signal I1 is corrected so as to be moved by the first origin correction coefficient (g1x, g1y), as in the following equation (26). The second imaging signal I2 is corrected so as to be moved by the second origin correction coefficient (g2x, g2y), as in the following equation (27). The third imaging signal I3 is corrected so as to be moved by the third origin correction coefficient (g3x, g3y), as in the following equation (28). The fourth imaging signal I4 is corrected so as to be moved by the fourth origin correction coefficient (g4x, g4y), as in the following equation (29). Note that if the values on the right side of equations (26), (27), (28) and (29) do not exist (e.g., x=0, y=0, g1x and g1y are positive numbers), the same value as an existing neighboring value, a value inferred from neighbors by extrapolation or the like, or zero or the like may be substituted. Note that g1x, g2x, g3x, g4x, g1y, g2y, g3y and g4y are not limited to being integers, and may be decimals. In this case, the nearest neighboring value or a value interpolated from neighboring pixels is used as the right side of equations (26), (27), (28) and (29). Step S1500 of FIG. 11 is executed next.

$$I1(x,y)=I1(x-g1x,y-g1y) \quad (26)$$

$$I2(x,y)=I2(x-g1x,y-g1y) \quad (27)$$

$$I3(x,y)=I3(x-g1x,y-g1y) \quad (28)$$

$$I4(x,y)=I4(x-g1x,y-g1y) \quad (29)$$

In step S1500, the distortion correcting unit 144 corrects the first imaging signal I1, the second imaging signal I2, the third imaging signal I3, and the fourth imaging signal I4 using distortion correction coefficients saved in the distortion correction coefficient memory 138. The results are then written to the memory of the system control unit 131.

A first distortion correction coefficient p1x(x, y), p1y(x, y) for use in correcting the first imaging signal I1(x, y), a second distortion correction coefficient p2x(x, y), p2y(x, y) for use in correcting the second imaging signal I2(x, y), a third distortion correction coefficient p3x(x, y), p3y(x, y) for use in correcting the third imaging signal I3(x, y), and a fourth distortion correction coefficient p4x(x, y), p4y(x, y) for use in correcting the fourth imaging signal I4(x, y) are saved in the distortion correction coefficient memory 139. p1x(x, y), p2x(x, y), p3x(x, y) and p4x(x, y) respectively indicate the x component of the first distortion correction coefficient, the second distortion correction coefficient, the third distortion correction coefficient, and the fourth distortion correction coefficient of the x-th horizontal and y-th vertical pixel. p1y(x, y), p2y(x, y), p3y(x, y) and p4y(x, y) respectively indicate the y component of the first distortion correction coefficient, the second distortion correction coefficient, the third distortion correction coefficient, and the fourth distortion correction coefficient of the x-th horizontal and y-th vertical pixel. The total number of pixels is H×L, where H is the number of pixels in the height direction and L is the number of pixels in the length direction of the input image, with x changing from 0 to L−1, and y changing from 0 to H−1.

Figure 15:
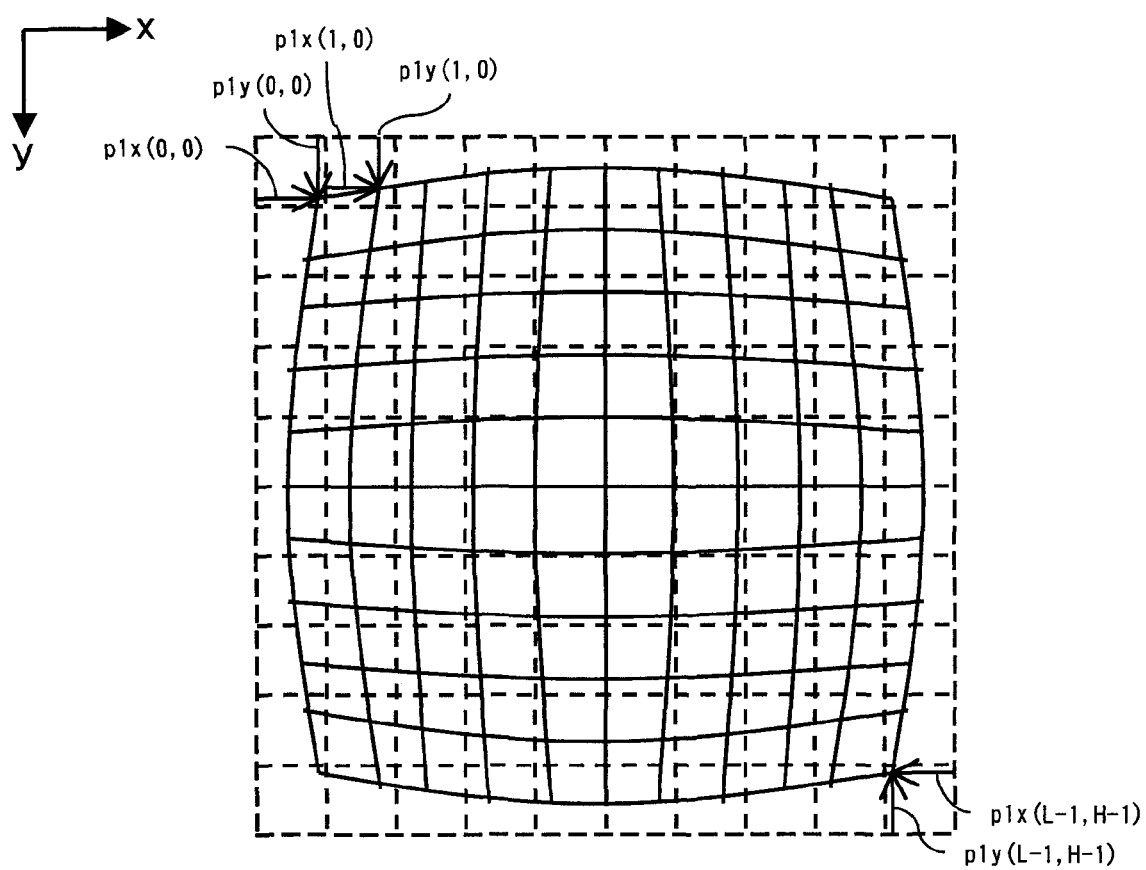
FIG. 15 illustrates distortion correction coefficients according to Embodiment 1 of the present invention.

FIG. 15 illustrates distortion correction coefficients according to Embodiment 1 of the present invention. The intersections of the lattice of dotted lines indicate ideal coordinates, while the intersections of the lattice of solid lines indicate the distorted coordinates. As shown in FIG. 15, an image that should ideally be imaged at (0, 0), for example, is actually imaged at a position that deviates by (p1x(0, 0), p1y(0, 0)) from (0, 0) due to distortion. The amount of deviation (p1x(0, 0), p1y(0, 0)) is assumed to be the distortion correction coefficient, and stored in the distortion correction coefficient memory 139. That is, an image that should ideally be imaged at (x, y) is actually imaged at a position that deviates by (p1x(x, y), p1y(x, y)) from (x, y) due to distortion. The amount of deviation (p1x(x, y), p1y(x, y)) is assumed to be the distortion correction coefficient, and stored in the distortion correction coefficient memory 139.

Figure 16:
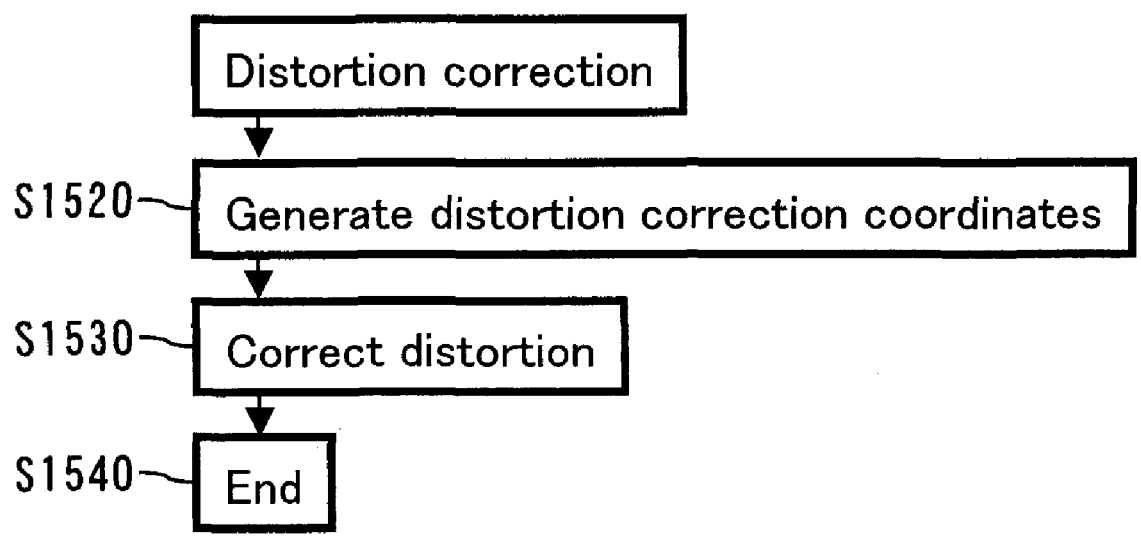
FIG. 16 is a flowchart showing a distortion correction operation according to Embodiment 1 of the present invention.

FIG. 16 is a flowchart showing the distortion correction operation according to Embodiment 1 of the present invention. The flowchart of FIG. 16 shows step S1500, in which distortion correction is performed, in detail.

Firstly, in step S1520, distortion correction coordinates for each pixel (x, y) are calculated. The results of adding the value x of the x coordinate to the x component p1x(x, y) of the first distortion correction coefficient, the x component p2x(x, y) of the second distortion correction coefficient, the x component p3x(x, y) of the third distortion correction coefficient, and the x component p4x(x, y) of the fourth distortion correction coefficient are set as the x component q1x(x, y) of the first distortion correction coordinate, the x component q2x(x, y) of the second distortion correction coordinate, the x component q3x(x, y) of the third distortion correction coordinate, and the x component q4x(x, y) of the fourth distortion correction coordinate, as in the following equations (30), (31), (32) and (33). The results of adding the value y of the y coordinate to the y component p1y(x, y) of the first distortion correction coefficient, the y component p2y(x, y) of the second distortion correction coefficient, the y component p3y(x, y) of the third distortion correction coefficient, and the y component p4y(x, y) of the fourth distortion correction coefficient are set as the y component q1y(x, y) of the first distortion correction coordinate, the y component q2y(x, y) of the second distortion correction coordinate, the y component q3y(x, y) of the third distortion correction coordinate, and the y component q4y(x, y) of the fourth distortion correction coordinate, as in the following equations (34), (35), (36) and (37). Step S1530 is executed next.

$$q1x(x,y)=x+p1x(x,y) \quad (30)$$

$$q2x(x,y)=x+p2x(x,y) \quad (31)$$

$$q3x(x,y)=x+p3x(x,y) \quad (32)$$

$$q4x(x,y)=x+p4x(x,y) \quad (33)$$

$$q1y(x,y)=y+p1y(x,y) \quad (34)$$

$$q2y(x,y)=y+p2y(x,y) \quad (35)$$

$$q3y(x,y)=y+p3y(x,y) \quad (36)$$

$$q4y(x,y)=y+p4y(x,y) \quad (37)$$

In step S1530, distortion correction is performed. A first imaging signal I1(q1x(x, y), q1y(x, y)) on first distortion correction coordinates (q1x(x, y), q1y(x, y)), a second imaging signal I2(q2x(x, y), q2y(x, y)) on second distortion correction coordinates (q2x(x, y), q2y(x, y)), a third imaging signal I3(q3x(x, y), q3y(x, y)) on third distortion correction coordinates (q3x(x, y), q3y(x, y)), and a fourth imaging signal I4(q4x(x, y), q4y(x, y)) on fourth distortion correction coordinates (q4x(x, y), q4y(x, y)) are used as the first imaging signal I1(x, y), the second imaging signal I2(x, y), the third imaging signal I3(x, y), and the fourth imaging signal I4(x, y) on the coordinates (x, y), as in the following equations (38), (39), (40) and (41). Note that if the values on the right side of equations (38), (39), (40) and (41) do not exist, the same value as an existing neighboring value, a value inferred from neighbors by extrapolation or the like, or zero or the like may be substituted. Note that q1x(x, y), q2x(x, y), q3x(x, y), q4x(x, y), q1y(x, y), q2y(x, y), q3y(x, y) and q4y(x, y) are not limited to being integers, and may be decimals. In this case, the nearest neighboring value or a value interpolated from neighboring pixels is used as the right side of equations (38), (39), (40) and (41). Step S1540 is executed next.

$$I1(x,y)=I1(q1x(x,y),q1y(x,y)) \quad (38)$$

$$I2(x,y)=I2(q2x(x,y),q2y(x,y)) \quad (39)$$

$$I3(x,y)=I3(q3x(x,y),q3y(x,y)) \quad (40)$$

$$I4(x,y)=I4(q4x(x,y),q4y(x,y)) \quad (41)$$

In step S1540, distortion correction is ended and processing returns to the main routine. Accordingly, step S1600 of FIG. 11 is executed next.

Figure 17:
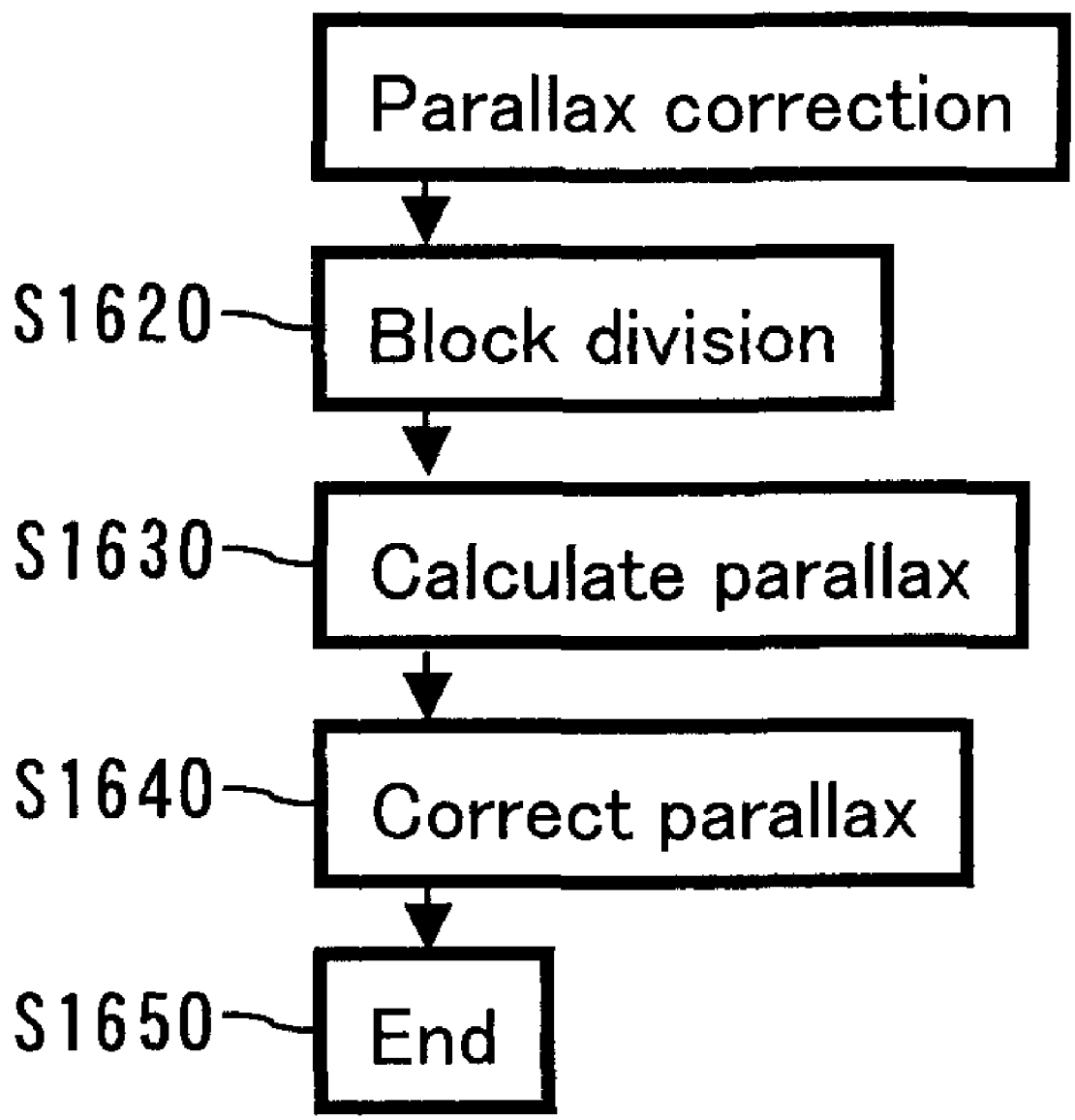
FIG. 17 is a flowchart showing a parallax correction operation according to Embodiment 1 of the present invention.

In step S1600, parallax correction is performed. FIG. 17 is a flowchart showing the parallax correction operation according to Embodiment 1 of the present invention. The flowchart of FIG. 17 shows the operations of step S1600 in detail.

Figure 18:
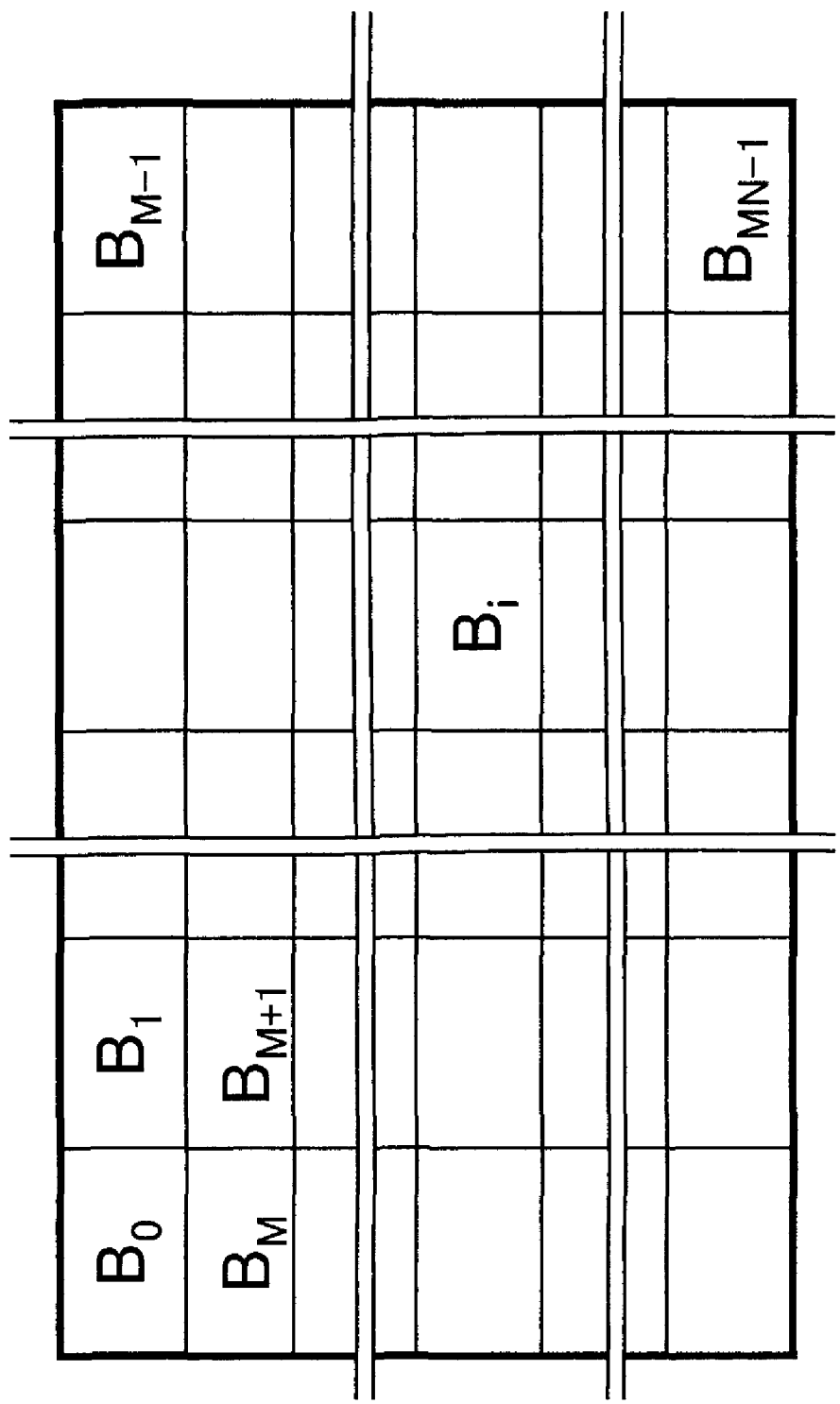
FIG. 18 illustrates block dividing in the imaging device according to Embodiment 1 of the present invention.

Firstly, in step S1620, block dividing is performed. FIG. 18 illustrates block dividing in the imaging device according to Embodiment 1 of the present invention. As shown in FIG. 18, the first imaging signal I1 is divided into M blocks in the length direction and N blocks in the height direction, giving a total of M×N blocks, with the respective blocks shown by $B_i$. Here, i changes from 0 to M×N−1. Step S1630 is executed next.

Figure 19:
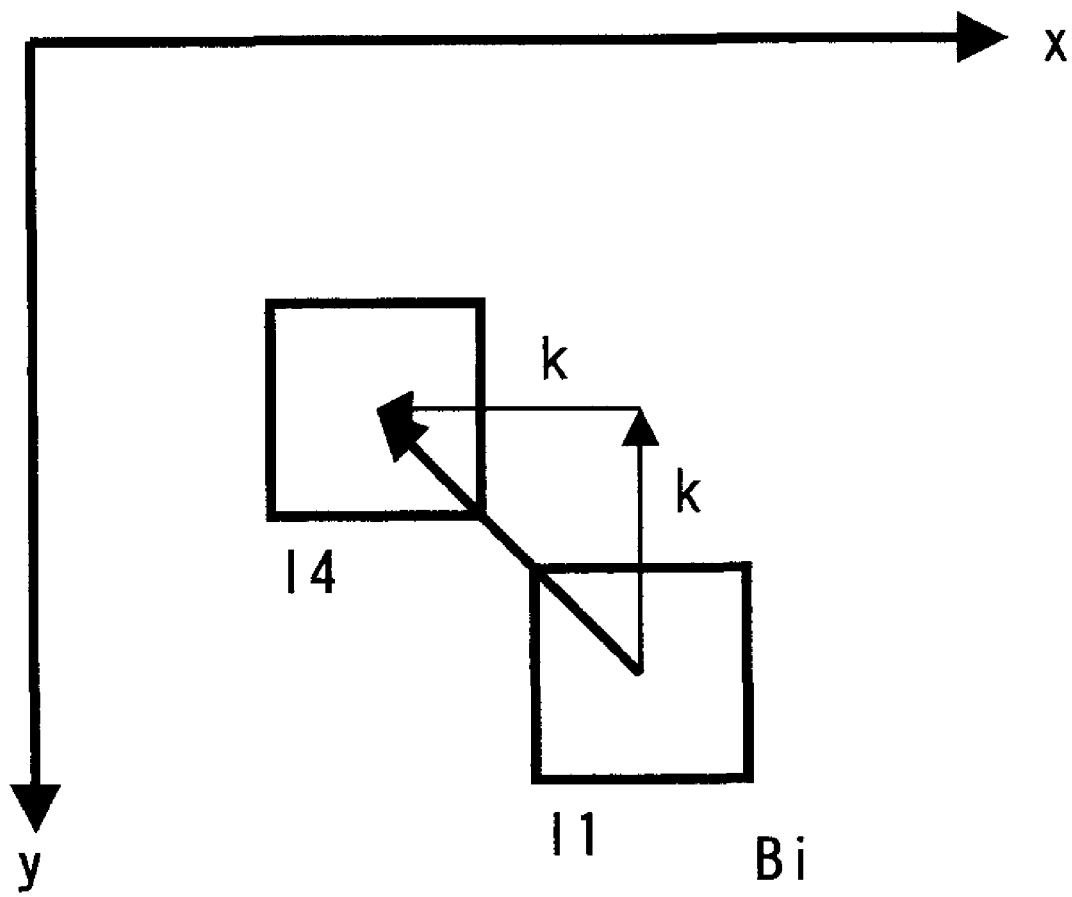
FIG. 19 illustrates a calculation area for calculating parallax evaluation values in the imaging device according to Embodiment 1 of the present invention.

In step S1630, a parallax value is calculated for each block. Firstly, a parallax evaluation value ($R_{0(k)}$, $R_{1(k)}$, . . . , $R_{i(k)}$, . . . , $R_{MN-1(k)}$, K=0, 1, . . . , kmax) is calculated for each block ($B_0$, $B_1$, . . . , $B_i$, . . . , $B_{MN-1}$). FIG. 19 illustrates a calculation area for calculating parallax evaluation values in the imaging device according to Embodiment 1 of the present invention. The area shown by $B_i$ (also shown as I1 is the i-th block derived at step S1620 from the first imaging signal I1. The area shown by I4 is an area in which $B_i$ has been moved by k in the x direction and k in the y direction. The total sum of absolute differences shown by the following expression (42) is then calculated as a parallax evaluation value $R_{i(k)}$ for all imaging signals I1(x, y) and I4(x-k, y-k) of the respective areas. Here, ΣΣ shows the total sum of all pixels in the block $B_i$.

$$R_{i(k)}=\Sigma\Sigma|I1(x,y)-I4(x-k,y-k)| \quad (42)$$

Figure 20:
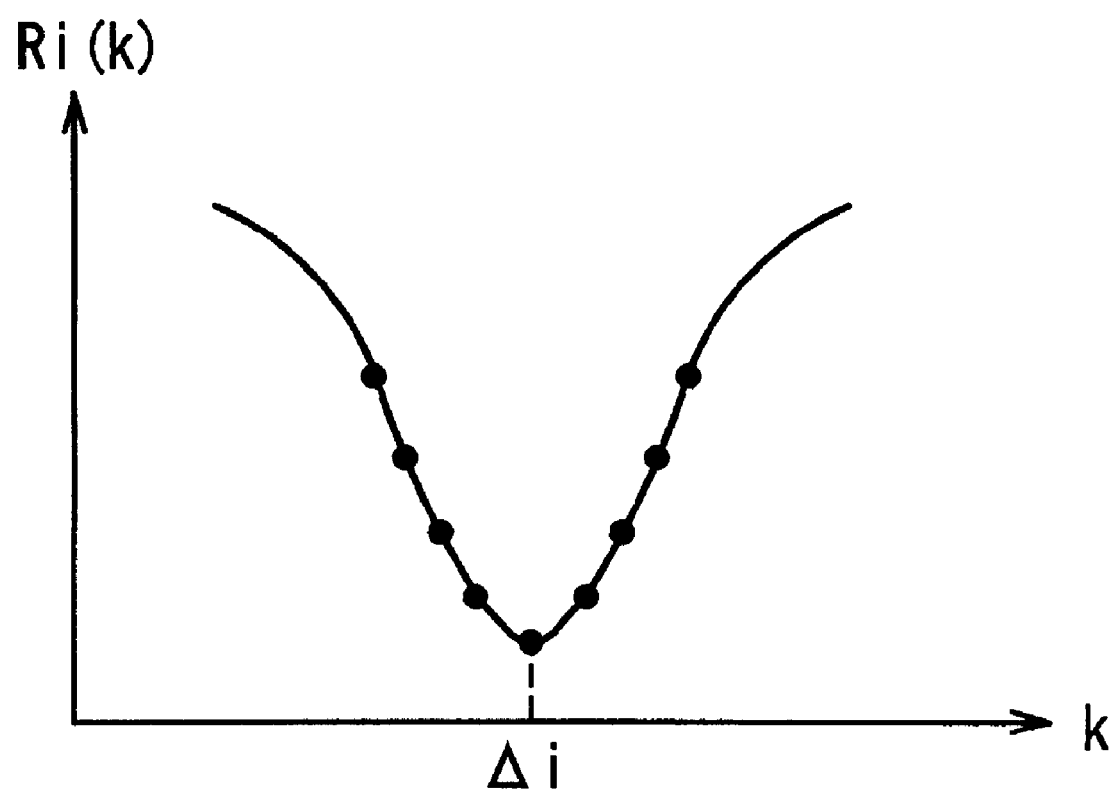
FIG. 20 illustrates the relationship between parallax and parallax evaluation values in the imaging device according to Embodiment 1 of the present invention.

This parallax evaluation value $R_{i(k)}$ shows the level of correlation between the first image signal I1 of the i-th block $B_i$ and the fourth image signal I4 in an area removed by (k, k) in the x and y directions, respectively. The smaller the value, the greater the correlation (similarity). FIG. 20 illustrates the relationship between parallax and parallax evaluation values in the imaging device according to Embodiment 1 of the present invention. As shown in FIG. 20, the parallax evaluation value $R_{i(k)}$ changes depending on the value of k, and is minimized when k=Δi. This shows that the image signal I1 of the block is most closely correlated to (most closely resembles) the fourth image signal I4 obtained by moving the i-th block $B_i$ of the first image signal I1 by (−Δi, −Δi) in the x and y directions, respectively. Consequently, we know that the parallax in the x and y directions between the first imaging signal I1 and the fourth imaging signal I4 in relation to i-th block $B_i$ is (Δi, Δi). Hereinafter, this Δi will be called the parallax Δi of the i-th block $B_i$. The parallax Δi of $B_i$ is thus derived from i=0 to i=M×N−1. Step S1640 is executed next.

In step S1640, parallax correction and image synthesis are performed. The result of this is written to the memory of the system control unit 131. Since the first imaging element 123a and the fourth imaging element 123d mainly receive the green component of object light, the first imaging signal I1 and the fourth imaging signal I4 are the information signals of the green component of object light. Also, since the second imaging element 123b mainly receives the blue component of object light, the second imaging signal I2 is the information signal of the blue component of object light. Further, since the third imaging element 123c mainly receives the red component of object light, the third imaging signal I3 is the information signal of the red component of object light. Since the parallax between the first imaging element 123a and the fourth imaging element 123d in relation to the i-th block $B_i$ is predicted to be (Δi, Δi), G(x, y) showing the intensity of green at the pixel coordinates (x, y) are assumed to be the average of the first imaging signal I1(x, y) and the fourth imaging signal I4(x−Δi, y−Δi), as in the following expression (43). Taking the average in this way enables the effect of random noise to be reduced. Also, since the parallax between the first imaging element 123a and the second imaging element 123b is predicted to be (Δi, 0), B(x, y) showing the intensity of blue at the pixel coordinates (x, y) are assumed to be the second imaging signal I2(x−Δi, y), as in the following expression (44). Further, since the parallax between the first imaging element 123a and the third imaging element 123c is predicted to be (0, Δi), R(x, y) showing the intensity of red at the pixel coordinates (x, y) are assumed to be the third imaging signal I3(x, y−Δi), as in the following expression (45). Step S1650 is executed next.

$$G(x,y)=[I1(x,y)+I4(x-\Delta i,y-\Delta i)]/2 \quad (43)$$

$$B(x,y)=I2(x-\Delta i,y) \quad (44)$$

$$R(x,y)=I3(x,y-\Delta i) \quad (45)$$

In step S1650, parallax correction is ended and processing returns to the main routine. Accordingly, step S1700 of FIG. 11 is executed next.

In step S1700, image output is performed. The input/output unit 136 outputs G(x, y), B(x, y) and R(x, y), which are pieces of data in the memory of the system control unit 131, to the host CPU (not shown) or an external display device (not shown). Note that output such as luminance or color difference signals, for example, may be output instead of G(x, y), B(x, y) and R(x, y). Values after image processing such as white balance or γ(gamma) correction may also be output. Further, data obtained by performing lossless compression or lossy compression such as JPEG may be output. A plurality of these may also be output. Step S1800 is executed next.

In step S1800, operations are ended.

As a result of being configured and operated as above, the imaging device 101 has the following effects.

When there is variability in component precision or assembly, light intensity distribution is biased relative to the center of the optical axis depending on the color, producing false colors. With the imaging device of Embodiment 1, the intensity correction coefficients a1, a2, a3 and a4 are saved to the intensity correction coefficient memory 137, which is a nonvolatile memory, and in step S1300, the intensity correction values b1(x, y), b2(x, y), b3(x, y) and b4(x, y), whose degree of correction changes depending on the position (x, y) of the imaging area, are generated based on the intensity correction coefficients a1, a2, a3 and a4, and the imaging signals I1(x, y), I2(x, y), I3(x, y) and I4(x, y) are corrected. Biasing of light intensity distribution is thereby compensated and the occurrence of false colors is suppressed, enabling fine images to be synthesized.

Also, the imaging device of Embodiment 1 generates the intensity correction values b1(x, y), b2(x, y), b3(x, y) and b4(x, y), whose degree of correction changes depending on the position (x, y) of the imaging area, based on the intensity correction coefficients a1, a2, a3 and a4, corrects the imaging signals I1(x, y), I2(x, y), I3(x, y) and I4(x, y), compensates for biasing of light intensity distribution in step S1300, divides the first imaging signal I1 into a plurality of blocks in step S1620, derives a parallax for each block based on the corrected imaging signals I1(x, y) and I4(x, y) in step S1630, and performs image synthesis based on these parallaxes in step S1640, so as to reduce the effect of parallax for each block. Since biasing of light intensity distribution is thereby compensated, correct parallax derived, and image synthesis performed based on this correct parallax, fine images can be synthesized.

The imaging device of Embodiment 1 saves the origin correction coefficients g1x, g2x, g3x, g4x, g1y, g2y, g3y and g4y to the origin correction coefficient memory 138, corrects the origins of the imaging signals I1(x, y), I2(x, y), I3(x, y) and I4(x, y) based on the origin correction coefficients g1x, g2x, g3x, g4x, g1y, g2y, g3y and g4y in step S1400, derives a parallax for each block based on the corrected imaging signals I1(x, y) and I4(x, y) in step S1630, and performs image synthesis based on these parallaxes in step S1640, so as to reduce the effect of parallax for each block. Since correct parallax is thereby derived, and image synthesis is performed based on this correct parallax, fine images can be synthesized.

The imaging device of Embodiment 1 saves the distortion correction coefficients p1x(x, y), p2x(x, y), p3x(x, y), p4x(x, y), p1y(x, y), p2y(x, y), p3y(x, y) and p4y(x, y), calculates the distortion correction coordinates q1x(x, y), q2x(x, y), q3x(x, y), q4x(x, y), q1y(x, y), q2y(x, y), q3y(x, y), and q4y(x, y), based on the distortion correction coefficients p1x(x, y), p2x(x, y), p3x(x, y), p4x(x, y), p1y(x, y), p2y(x, y), p3y(x, y) and p4y(x, y) in step S1520, corrects the imaging signals I1(x, y), I2(x, y), I3(x, y) and I4(x, y) at the distortion correction coordinates q1x(x, y), q2x(x, y), q3x(x, y), q4x(x, y), q1y(x, y), q2y(x, y), q3y(x, y), and q4y(x, y) in step S1530, so as to reduce the effect of distortion of the plurality of lens units, derives a parallax for each block based on the corrected imaging signals I1(x, y) and I4(x, y) in step S1630, and performs image synthesis based on these parallaxes in step S1640, so as to reduce the effect of parallax for each block. Since correct parallax is derived and image synthesis is performed based on this correct parallax, fine images can be synthesized.

Note that the imaging device of Embodiment 1 also has the effect of suppressing the occurrence of false colors, even where biasing of the sensitivity of the first imaging element 123a, the second imaging element 123b, the third imaging element 123c, and the fourth imaging element 123d respectively differ.

Note that with the imaging device of Embodiment 1, the calculated parallaxes are used without modification, although they may be appropriately limited. Depending on the lens characteristics, images will lack sharpness when the subject distance A is less than a given value. Thus, the maximum value of the parallax Δ will be decided if this value is set as the minimum value of the subject distance A. Parallax greater than this value may be disregarded as an error. In such cases, the parallax evaluation value may also employ the second smallest value as the parallax.

With the imaging device of Embodiment 1, parallax is calculated from the first imaging signal I1 (mainly showing green) and the fourth imaging signal I4 (mainly showing green), although the present invention is not limited to this. Since a purple subject, for example, has little green component and includes plenty of blue component and red component, there may be times when parallax cannot be calculated from the first imaging signal I1 (mainly showing green) and the fourth imaging signal I4 (mainly showing green). In this case, parallax may be calculated from the second imaging signal I2 (mainly showing blue) and the third imaging signal I3 (mainly showing red). If parallax cannot be calculated from the first imaging signal I1 (mainly showing green) and the fourth imaging signal I4 (mainly showing green), or from the second imaging signal I2 (mainly showing blue) and the third imaging signal I3 (mainly showing red), it is assumed that there is no parallax effect, and processing can be performed as if there is no parallax.

In the imaging device of Embodiment 1, an IR filter is used on light that passes through all of the lens units, although part of the IR filter may be omitted, and not used on light passing through some of the lens units. The IR filter may also be completely omitted.

In the imaging device of Embodiment 1, the first color filter 124a, the second color filter 124b, the third color filter 124c and the fourth color filter 124d respectively transmit mainly green, blue, red and green, although the wavelengths may differ. Using complementary colors, for example, the first color filter 124a, the second color filter 124b, the third color filter 124c and the fourth color filter 124d may respectively transmit mainly yellow, cyan, magenta and yellow. Further, the order may be interchanged. For example, the first color filter 124a, the second color filter 124b, the third color filter 124c and the fourth color filter 124d may respectively transmit mainly green, green, blue and red. Alternatively, the first color filter 124a, the second color filter 124b, the third color filter 124c and the fourth color filter 124d may respectively transmit mainly red, blue, green and red.

By disposing the first to fourth imaging elements 123a to 123d such that the second imaging element 123b is disposed so as to be at the top and the third imaging element 123c is disposed so as to be at the bottom during image capture when the imaging device of Embodiment 1 is mounted in a camera, the upper side will be sensitive to blue and the lower side will be sensitive to red, enabling colors to be reproduced more naturally in landscape photographs.

When two extremums are marked in the parallax evaluation value, the larger of the parallaxes is employed. Since a subject and a background are included in these blocks, and the subject distance differs from the background distance, two extremums appear. Because the subject distance is small in comparison to the background distance, the parallax of the subject is large in comparison to the parallax of the background. Here, although the effect of the parallax of the background cannot be reduced if the larger of the parallaxes is employed, the effect of the parallax of the subject, which directly affects image quality, can be reduced.

The image output timing is not limited to the above, and preview output may be appropriately performed. For example, an image that has not undergone parallax correction may be output during the autofocus control in step S1100.

In Embodiment 1, the imaging element 123 is constituted by the first imaging element 123a, the second imaging element 123b, the third imaging element 123c, and the fourth imaging element 123d, and the imaging signal input unit 133 is constituted by the first imaging signal input unit 133a, the second imaging signal input unit 133b, the third imaging signal input unit 133c, and the fourth imaging signal input unit 133d. However, the imaging element 123 may be constituted by a single imaging element, and four images may be formed by the first to fourth lens units 113a to 113d at different positions on the light receiving surface thereof. The imaging signal input unit 133 may be constituted from a single imaging signal input unit that receives as input signals from the single imaging element 123. In this case, an area is appropriately selected from data placed in the memory of the system control unit 131, and the selected data is set as the first imaging signal I1, the second imaging signal I2, the third imaging signal I3, and the fourth imaging signal I4.

In the first embodiment, the first lens unit 113a, the second lens unit 113b, the third lens unit 113c, and the fourth lens unit 113d are disposed such that a rectangle obtained by joining together the centers of the optical axes thereof is square, although the present invention is not limited to this. The lengths of the rectangle in the x and y directions may differ. In this case, appropriate changes will be necessary, for instance, when deriving parallaxes in step S1630, or when correcting parallaxes in step S1640. That is, k is changed so as to maintain the ratio between lengths in the x and y directions of the above rectangle, rather than using the same value of k for the x and y directions.

Note that although the above description illustrates the configuration and operations of a device that performs various corrections on imaging signals obtained through image capture and corrects parallax before synthesizing images from the imaging signals, the imaging device of the present invention can also be applied as a measuring device for detecting distance to the subject. That is, the imaging device of the present invention can also be implemented as a device that calculates distance based on parallax obtained as aforementioned, and outputs the obtained distance, with practical application as a surveying device, inter-vehicular distance detecting device or the like being conceivable. That is, equation (1), when solved for distance A, is as shown in the following equation (46). Accordingly, the distance to the subject from the block $B_i$ is as calculated in the following equation (47), and the distance to the subject from a pixel (x, y) included in the block $B_i$ is as shown in the following equation (48), and saved in the memory of the system control unit 131. Note that the units of measurement are changed appropriately when the calculations are performed. If the distance information A(x, y) is then output externally via the input/output unit 136, an imaging device that functions as a measuring device for detecting distance can be realized.

$$A = f^* D/\Delta \tag{46}$$

$$A_i = f^* D/\Delta_i \tag{47}$$

$$A(x,y) = A_i(x,y) \text{ included in } B_i) \tag{48}$$

Embodiment 2

An imaging device according to Embodiment 2 of the present invention generates intensity correction coefficients in the manufacturing process, and writes the intensity correction coefficients to an intensity correction coefficient memory. Biasing of light intensity distribution is thereby compensated and the occurrence of false colors is suppressed, allowing fine images to be synthesized, even if the variability in component precision or assembly is different for each device.

Further, the imaging device according to Embodiment 2 of the present invention divides at least one of the imaging signals into a plurality of blocks, generates intensity correction coefficients in the manufacturing process, and writes the intensity correction coefficients to an intensity correction coefficient memory. Biasing of light intensity distribution is thereby compensated and a parallax is derived for each block based on the corrected imaging signals, enabling image synthesis to be performed based on these parallaxes so as to reduce the effect of parallax for each block, even if the variability in component precision or assembly is different for each device. Since biasing of light intensity distribution is thereby compensated, correct parallax derived, and image synthesis performed based on this correct parallax, fine images can be synthesized.

The imaging device according to Embodiment 2 of the present invention generates origin correction coefficients in the manufacturing process, and writes the origin correction coefficients to an origin correction coefficient memory. Variability in origin is thereby compensated, and a parallax is derived for each block based on the corrected imaging signals, enabling image synthesis to be performed based on these parallaxes so as to reduce the effect of parallax for each block, even if the variability in component precision or assembly is different for each device. Since origin deviation is thereby compensated, correct parallax derived, and image synthesis performed based on this correct parallax, fine images can be synthesized.

The imaging device according to Embodiment 2 of the present invention generates distortion correction coefficients in the manufacturing process, and writes the distortion correction coefficients to a distortion correction coefficient memory. Imaging signals are thereby corrected so as to reduce the effect of distortion of the plurality of lens units, and a parallax is derived for each block based on the corrected imaging signals, enabling image synthesis to be performed based on these parallaxes so as to reduce the effect of parallax for each block, even if the variability in component precision or assembly is different for each device. Since the effect of distortion is thereby reduced, correct parallax is derived, and image synthesis is performed based on this correct parallax, fine images can be synthesized.

Figure 21:
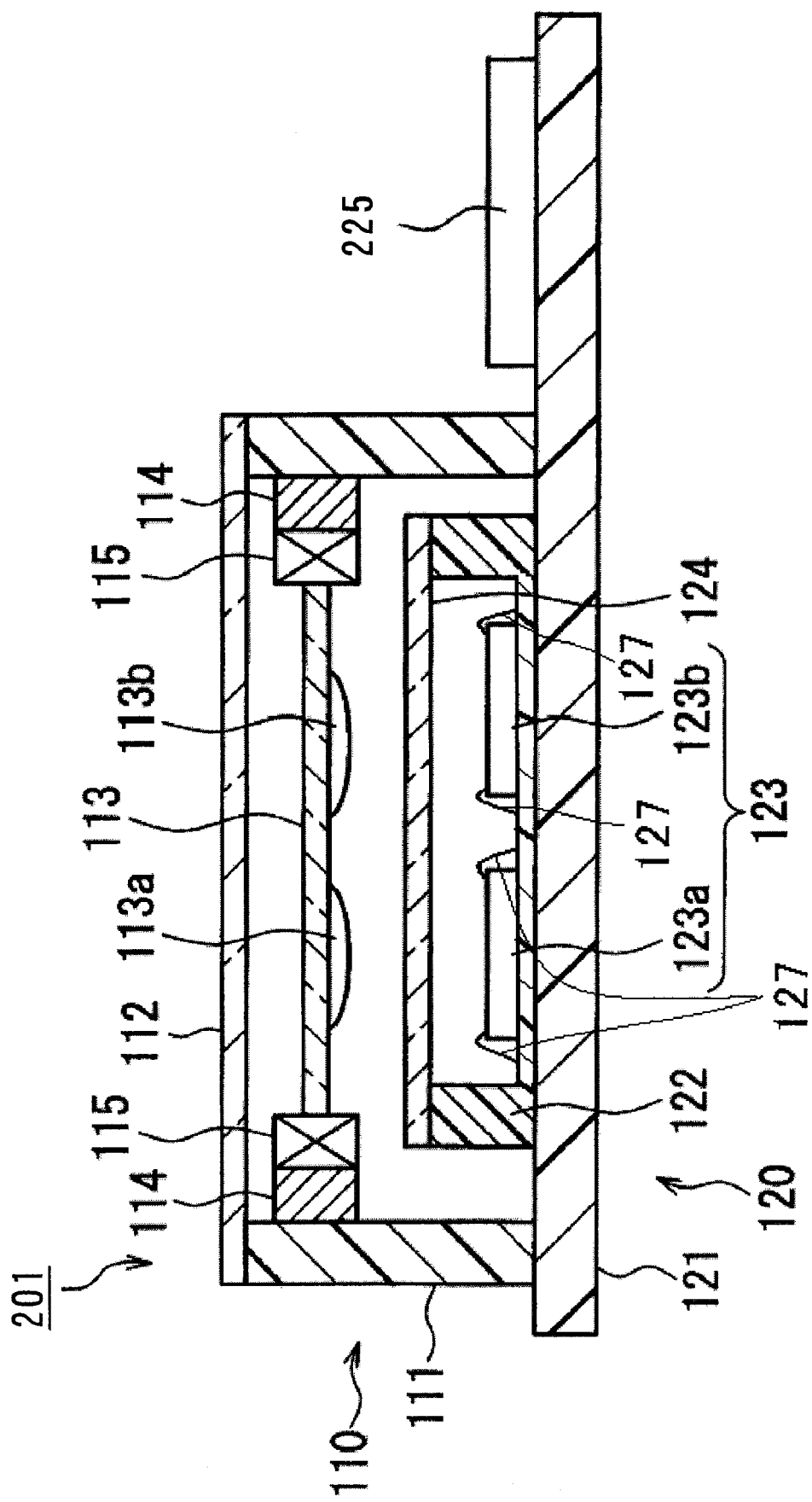
FIG. 21 is a cross-sectional view showing the configuration of an imaging device according to Embodiment 2 of the present invention.

The imaging device according to Embodiment 2 of the present invention will be described with reference to the drawings. FIG. 21 is a cross-sectional view showing the configuration of the imaging device according to Embodiment 2 of the present invention. In FIG. 21, an imaging device 201 has a lens module unit 110 and a circuit unit 220.

The lens module unit 110 has a lens barrel 111, an upper cover glass 112, a lens 113, a fixed actuator portion 114, and a movable actuator portion 115. The circuit unit 220 has a substrate 121, a package 122, an imaging element 123, a package cover glass 124, and a system LSI (hereinafter, SLSI) 225. The configurations and operations apart from the SLSI 225 are similar to Embodiment 1, with the same reference numerals attached and redundant description omitted.

Figure 22:
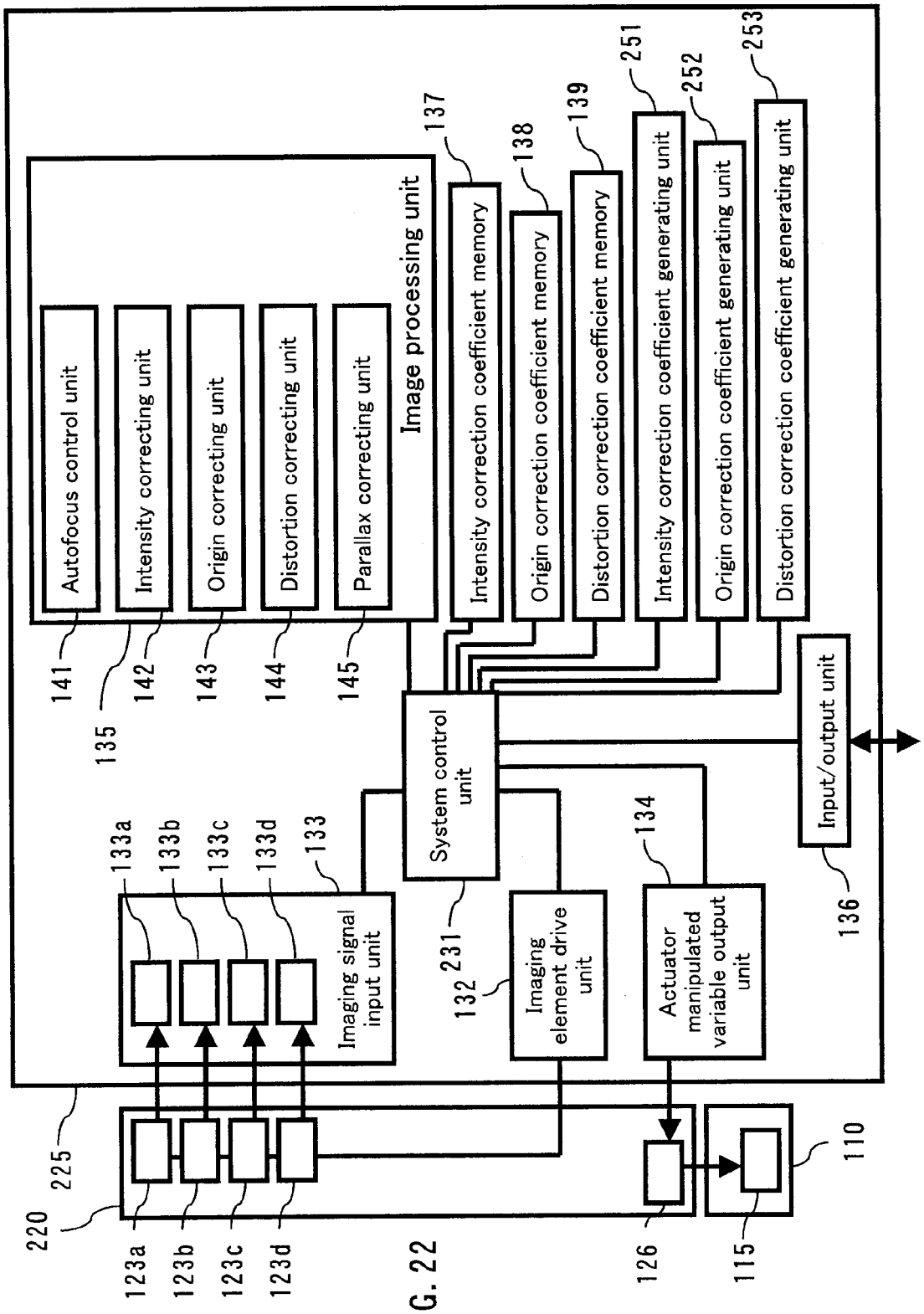
FIG. 22 is a block diagram of the imaging device according to Embodiment 2 of the present invention.

FIG. 22 is a block diagram of the imaging device according to Embodiment 2 of the present invention. The SLSI 225 has a system control unit 231, an imaging element drive unit 132, an imaging signal input unit 133, an actuator manipulated variable output unit 134, an image processing unit 135, an input/output unit 136, an intensity correction coefficient memory 137, an origin correction coefficient memory 138, a distortion correction coefficient memory 139, an intensity correction coefficient generating unit 251, an origin correction coefficient generating unit 252, and a distortion correction coefficient generating unit 253. The circuit unit 220 has an amplifier 126 in addition to the above configuration.

In an inspection process during the manufacturing process after assembly of the imaging device 201, the intensity correction coefficient generating unit 251 generates intensity correction coefficients $a1(x, y)$, $a2(x, y)$, $a3(x, y)$, $a4(x, y)$, and writes the intensity correction coefficients $a1(x, y)$, $a2(x, y)$, $a3(x, y)$, $a4(x, y)$ to the intensity correction coefficient memory 137, as described hereinafter. Also, the origin correction coefficient generating unit 252 generates origin correction coefficients $g1x$, $g1y$, $g2x$, $g2y$, $g3x$, $g3y$, $g4x$, $g4y$, and writes the origin correction coefficients $g1x$, $g1y$, $g2x$, $g2y$, $g3x$, $g3y$, $g4x$, $g4y$ to the origin correction coefficient memory 138. Further, the distortion correction coefficient generating unit 253 generates distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$, and writes the distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$ to the distortion correction coefficient memory 139.

Figure 23:
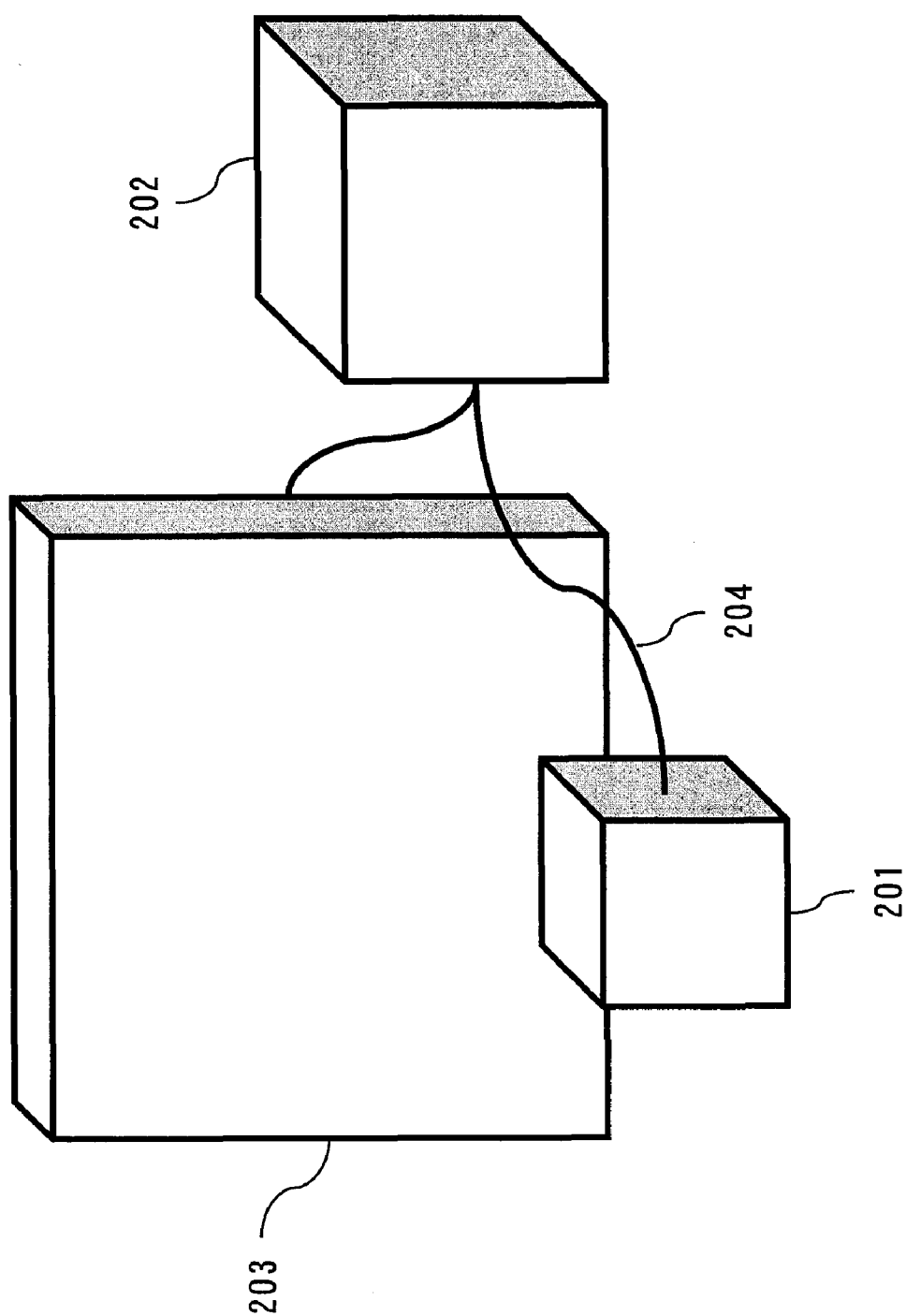
FIG. 23 is an external view of the imaging device and other devices when generating correction coefficients according to Embodiment 2 of the present invention.

FIG. 23 is an external view of the imaging device and other devices when generating correction coefficients according to Embodiment 2 of the present invention. 201 is the imaging device according to Embodiment 2 of the present invention, 202 is a correction coefficient generation controller, 203 is a display, and 204 is a cable for connecting the imaging device. The correction coefficient generation controller 202, which is constituted by a computer, performs coordinated control of the imaging device 201 and the display 203, and causes the imaging device 201 to generate the intensity correction coefficients $a1(x, y)$, $a2(x, y)$, $a3(x, y)$, $a4(x, y)$, the origin correction coefficients $g1x$, $g1y$, $g2x$, $g2y$, $g3x$, $g3y$, $g4x$, $g4y$, and the distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$. The display 203, which is constituted by a CRT (cathode ray tube) display or the like, is controlled by the correction coefficient generation controller 202, operates in coordination with the imaging device 201, and draws images (charts) used in generating the intensity correction coefficients $a1(x, y)$, $a2(x, y)$, $a3(x, y)$, $a4(x, y)$, the origin correction coefficients $g1x$, $g1y$, $g2x$, $g2y$, $g3x$, $g3y$, $g4x$, $g4y$, and the distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$. The imaging device cable 204, which is constituted by a USB (universal serial bus) cable or the like, connects the imaging device 201 and the correction coefficient generation controller 202, feeds power to the imaging device 201, and is the medium through which communication is performed between the imaging device 201 and the correction coefficient generation controller 202.

Figure 24:
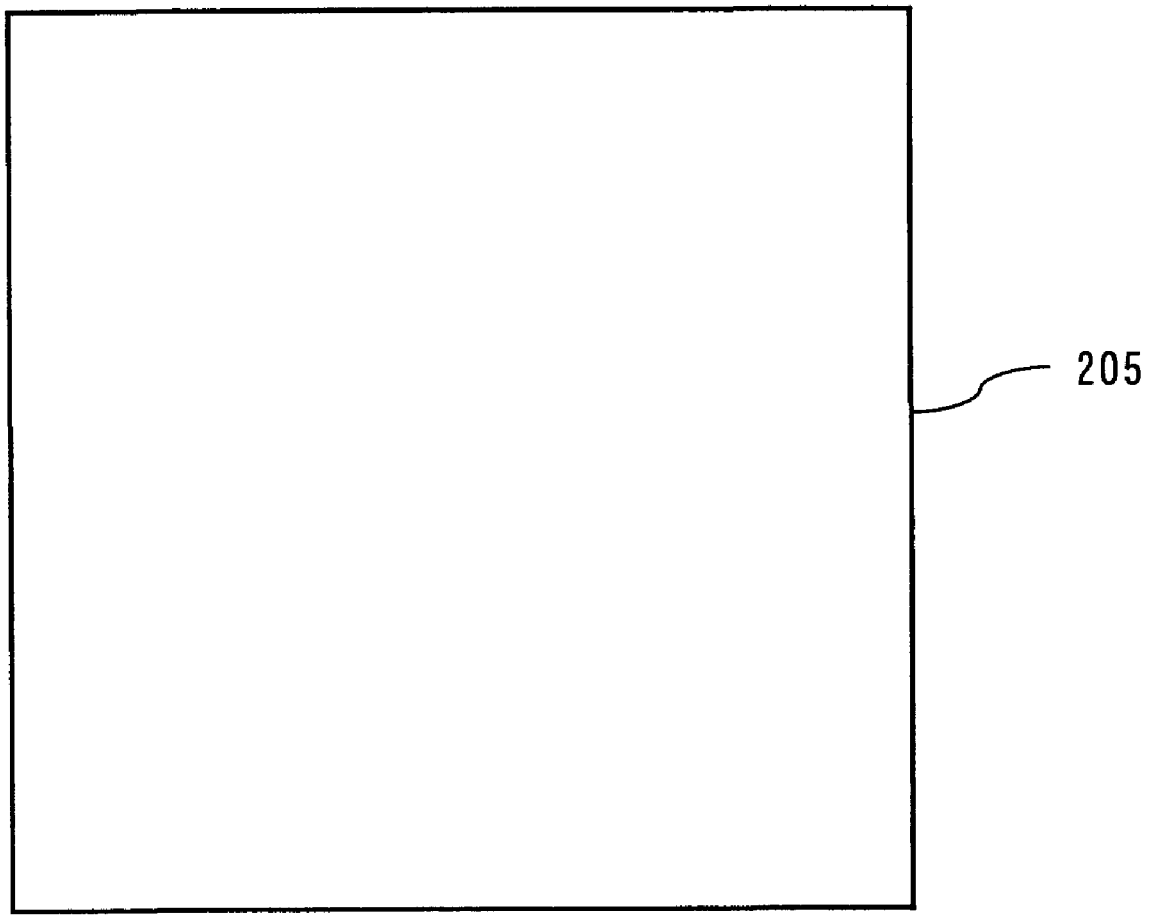
FIG. 24 is an external view of an intensity correction chart used in generating intensity correction coefficients according to Embodiment 2 of the present invention.
Figure 25A:
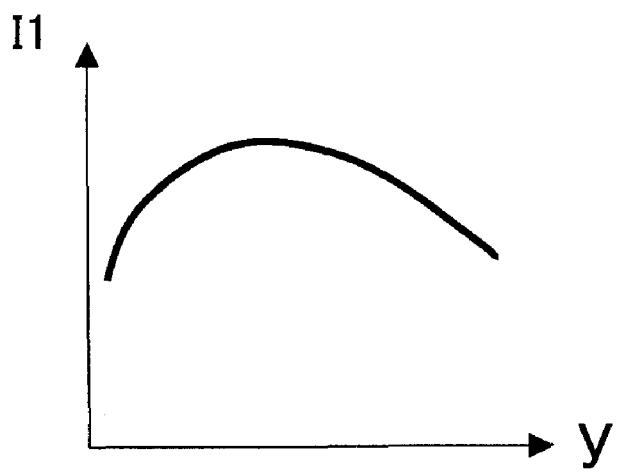
FIGS. 25A to 25C are waveform diagrams showing an imaging signal, an intensity correction coefficient and an imaging signal after correction in the imaging device according to Embodiment 2 of the present invention.
Figure 25B:
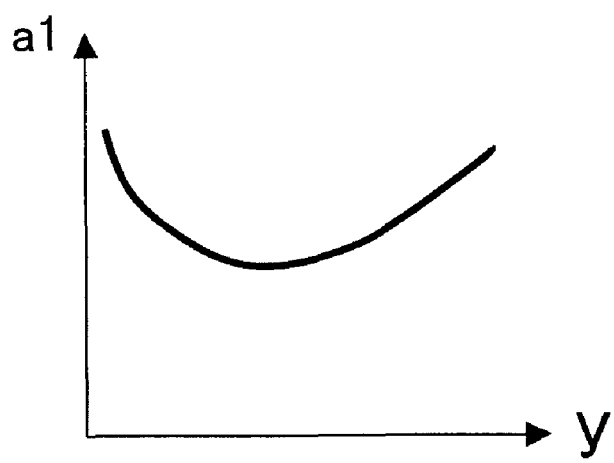
Figure 25C:
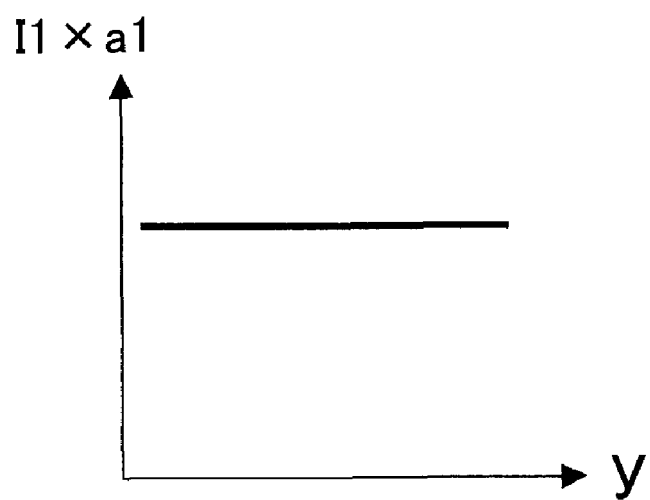

The operations of the imaging device according to Embodiment 2 of the present invention will be described next. FIG. 24 is an external view of an intensity correction chart used in generating intensity correction coefficients according to Embodiment 2 of the present invention. The imaging device of Embodiment 2 captures an image of an intensity correction chart 205, which is a uniform white subject such as in FIG. 24, in the manufacturing process. FIGS. 25A to 25C are waveform diagrams showing an imaging signal, an intensity correction coefficient and an imaging signal after correction in the imaging device according to Embodiment 2 of the present invention. In FIGS. 25A to 25C, only the first imaging signal I1, the first intensity correction coefficient a1 and the first imaging signal I1 after correction are shown for simplicity. As shown in FIG. 25A, this imaging signal I1 is intensity information concerning biasing of light intensity distribution, including intensity information on reductions in peripheral brightness. The intensity correction coefficient generating unit 251 derives the reciprocal of the imaging signal I1 as the intensity correction coefficient a1 such as shown in FIG. 25B, and saves the result in the intensity correction coefficient memory 137. That is, the intensity correction coefficient generating unit 251 derives $a1(x, y)$, such that $I1(x, y)*a1(x, y)=1$. When intensity correction is performed as shown in step S1300, the imaging signal after correction will be flat as shown in FIG. 25C, and a uniform subject image will be reproduced. Similarly, the intensity correction coefficient generating unit 251 generates the second intensity correction coefficient a2 for the second imaging signal I2, the third intensity correction coefficient a3 for the third imaging signal I3, and the fourth intensity correction coefficient a4 for the fourth imaging signal I4, and writes the generated intensity correction coefficients to the intensity correction coefficient memory 137. Here, when there is variability in component precision or assembly, light intensity distribution is biased relative to the center of the optical axis depending on the color, and reductions in peripheral brightness respectively differ, the second intensity correction coefficient a2, the third intensity correction coefficient a3, and the fourth intensity correction coefficient a4 will respectively differ. Capturing an image of a uniform white subject and setting the reciprocal of the resultant imaging signal as the intensity correction coefficient thus enables intensity correction to be appropriately performed. The imaging device of Embodiment 2 uses the intensity correction coefficient generating unit 251 to generate intensity correction coefficients based on this principle, and writes the generated intensity correction coefficients to the intensity correction coefficient memory 137. The intensity correcting unit 142 of the image processing unit 135 then performs intensity correction based on the intensity correction coefficients saved in the intensity correction coefficient memory 137.

Figure 26:
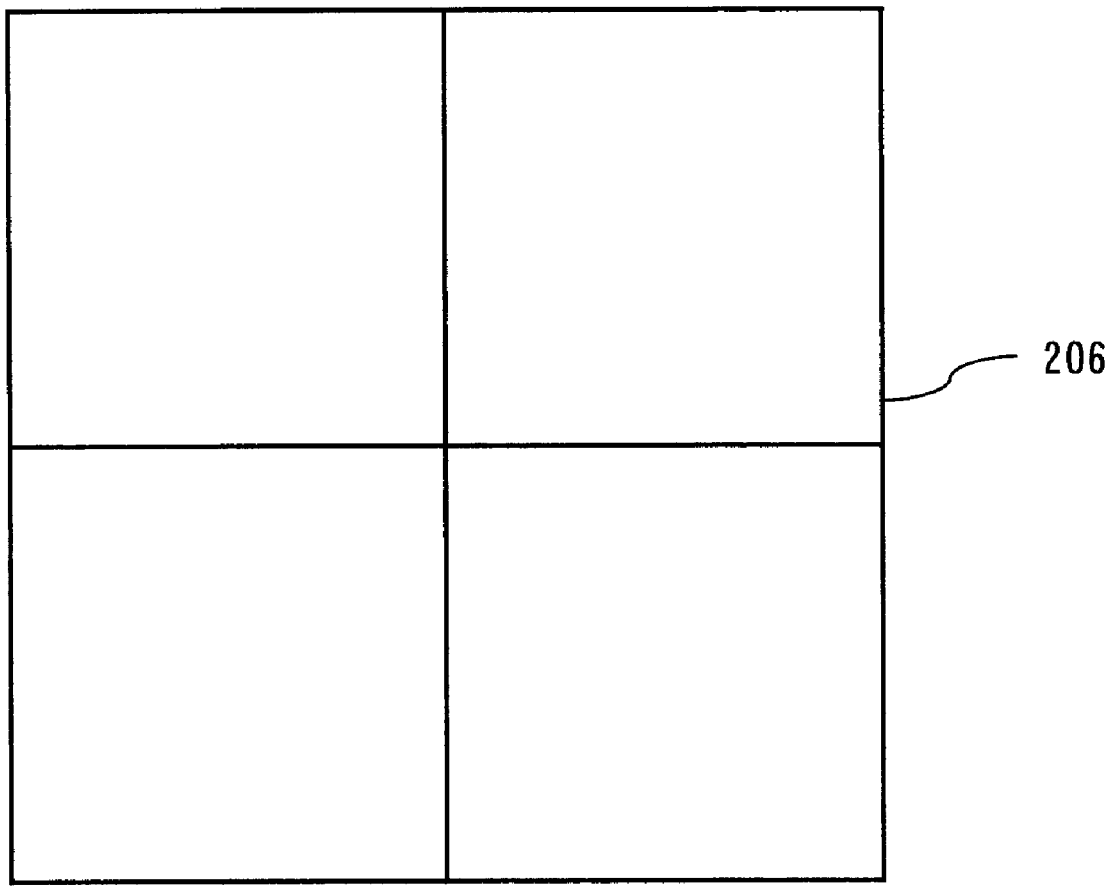
FIG. 26 is an external view of an origin correction chart used in generating origin correction coefficients according to Embodiment 2 of the present invention.

FIG. 26 is an external view of an origin correction chart used in generating origin correction coefficients according to Embodiment 2 of the present invention. The imaging device of Embodiment 2 captures an image of an origin correction chart 206, which is a uniform white subject with a cross drawn thereon such as in FIG. 26, in the manufacturing process. The imaging device 201 is disposed so as to directly oppose the origin correction chart 206, and the centers of the optical axes of the plurality of lens of the imaging device 201 are disposed so as to coincide with the center of the cross in the origin correction chart 206. FIGS. 27A to 27D show imaging signals of the origin correction chart 206 when images are captured according to Embodiment 2 of the present invention. By capturing an image of the origin correction chart 206, signals such as shown in FIGS. 27A to 27D are obtained as the first imaging signal I1, the second imaging signal I2, the third imaging signal I3 and the fourth imaging signal I4. The cross-shaped solid lines in FIGS. 27A to 27D are images captured of the cross drawn on the origin correction chart 206. Note that the cross-shaped broken lines in FIGS. 27A to 27D hypothetically show lines passing through the centers of the images in order to facilitate comparison with the imaging signals, and are not included in the actual signals. As shown in FIGS. 27A to 27D, the centers of the crosses (centers of the solid lines) of the first imaging signal I1, the second imaging signal I2, the third imaging signal I3, and the fourth imaging signal I4 respectively deviate by $(s1x, s1y)$, $(s2x, s2y)$, $(s3x, s3y)$ and $(s4x, s4y)$ in comparison with the centers of the images (centers of the broken lines). This deviation is caused by a combination of parallax resulting from the origin correction chart 206 being disposed at a finite distance from the imaging device 201 and manufacturing variability resulting from deviation of lens units during manufacture, positional deviation of the imaging element or the like. Consequently, subtracting the coefficients contributing to parallax from the respective deviations $(s1x, s1y)$, $(s2x, s2y)$, $(s3x, s3y)$ and $(s4x, s4y)$ from the centers of the crosses gives the deviation resulting from manufacturing variability. The origin correction coefficient generating unit 252 generates the origin correction coefficients $g1x, g1y, g2x, g2y, g3x, g3y, g4x, g4y$ so as to eliminate the effect of this deviation, and writes the generated origin correction coefficients to the origin correction coefficient memory 138. The origin correcting unit 143 of the image processing unit 135 performs origin correction in step S1400 using the origin correction coefficients in the origin correction coefficient memory 138.

Figure 28:
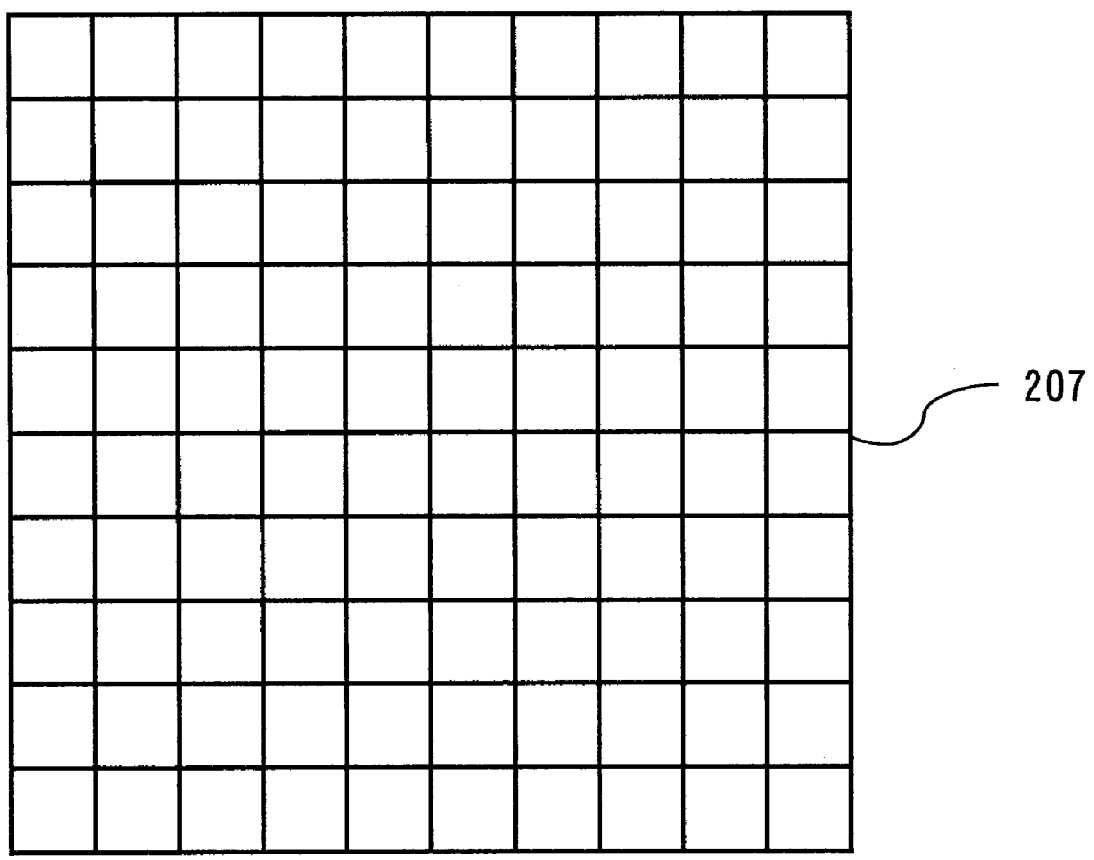
FIG. 28 is an external view of a distortion correction chart used in generating distortion correction coefficients according to Embodiment 2 of the present invention.
Figure 29:
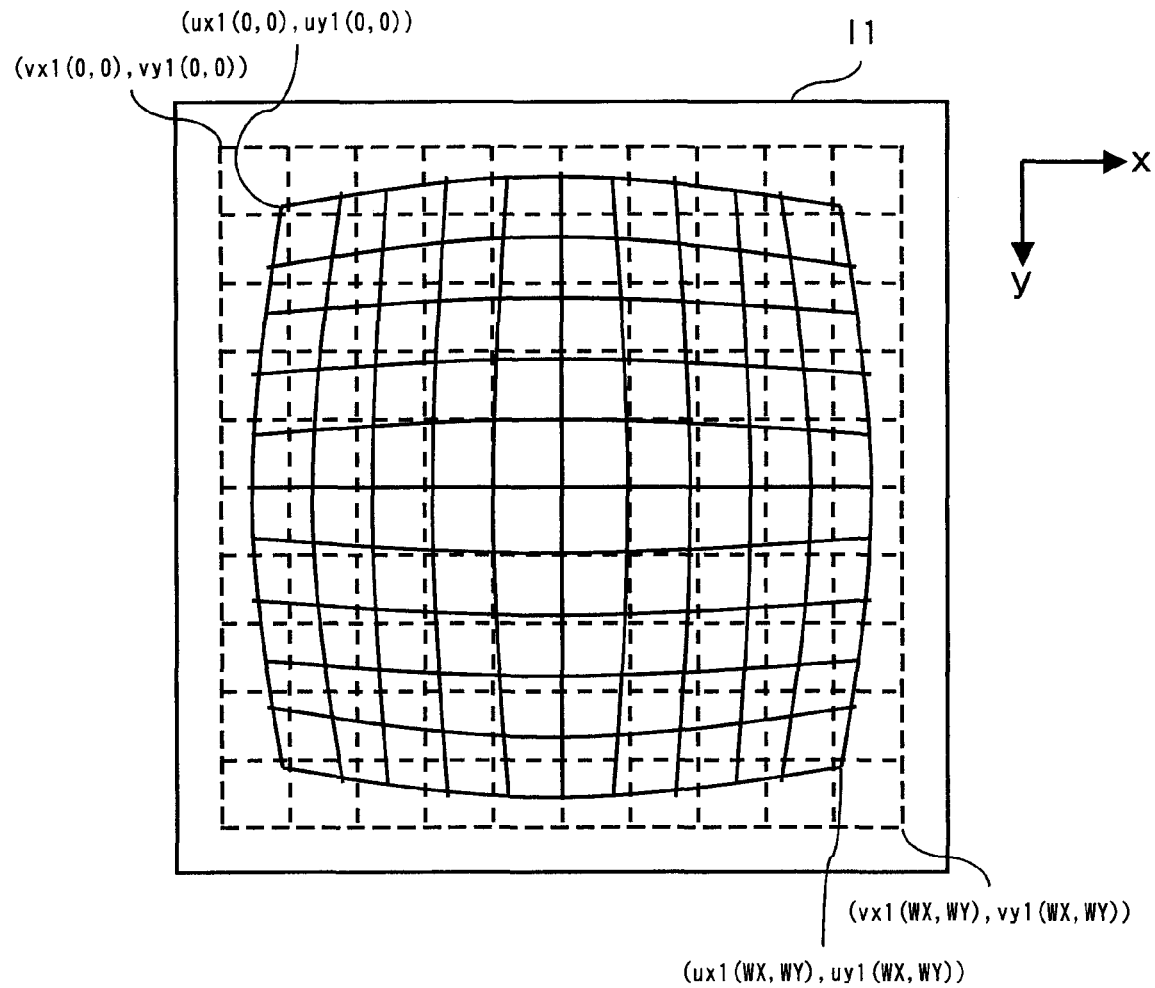
FIG. 29 shows an imaging signal when an image is captured of the distortion correction chart according to Embodiment 2 of the present invention.

FIG. 28 is an external view of a distortion correction chart used in generating distortion correction coefficients according to Embodiment 2 of the present invention. The imaging device of Embodiment 2 captures an image of a distortion correction chart 207, which is a uniform white subject with a lattice drawn thereon such as shown in FIG. 28, in the manufacturing process. The intervals in the lattice preferably equate to 10 to 15 pixels in the captured image. The imaging device 201 is disposed so as to directly oppose the distortion correction chart 207, and the centers of the optical axes of the plurality of lens of the imaging device 201 are disposed so as to coincide with the center of the lattice in the distortion correction chart 207. FIG. 29 shows an imaging signal of the distortion correction chart 207 when an image is captured according to Embodiment 2 of the present invention. In FIG. 29, only the first imaging signal I1 is shown for simplicity. By capturing an image of the distortion correction chart 207, a signal such as shown in FIG. 29 is obtained as the first imaging signal I1. The distorted, lattice-shaped solid lines in FIG. 29 result from capturing an image of the lattice drawn on the distortion correction chart 207. Note that the undistorted, lattice-shaped broken lines in FIG. 29 hypothetically show an image captured when there is no lens distortion for facilitating the comparison with the imaging signal, and are not included in the actual imaging signal. Note that in FIG. 29, origin deviation and deviation resulting from parallax has been omitted. The intersections in the distorted lattice of the imaging signal I1 (intersections of solid lines) are given by $(ux1(i, j), uy1(i, j))$, while the intersections in the lattice when there is no lens distortion (intersections of broken lines) are given by $(vx1(i, j), vy1(i, j))$. Here, $(i, j)$ shows the i-th and j-th intersection in the x and y directions, respectively. As shown in FIG. 29, the lattice has WX+1 intersections in the x direction including the edges, and WY+1 intersections in the y direction including the edges. The upper-left intersection is given by $(vx1(0, 0), vy1(0, 0))$, while the bottom-right intersection is given by $(vx1(WX, WY), vy1(WX, WY))$.

The distortion correction coefficient generating unit 253 generates a distortion correction coefficient $p1x(x, y), p1y(x, y)$, so as to use the imaging signal I1 of the coordinates $(ux1(i, j), uy1(i, j))$ as the imaging signal I1 of the coordinates $(vx1(i, j), vy1(i, j))$ after distortion correction. In relation to the coordinates of pixels other than at intersections, the distortion correction coefficient generating unit 253 generates a distortion correction coefficient $p1x(x, y), p1y(x, y)$, so as to use the imaging signal I1 of coordinates derived by interpolation from a neighboring intersection. Note that the distortion correction coefficient generating unit 253 also similarly generates distortion correction coefficients $p2x(x, y), p2y(x, y), p3x(x, y), p3y(x, y)$ and $p4x(x, y), p4y(x, y)$ in relation to the other imaging signals I2, I3 and I4. The generated distortion correction coefficients are stored in the distortion correction coefficient memory 139. Note that origin deviation and deviation resulting from parallax are corrected appropriately.

Figure 30:
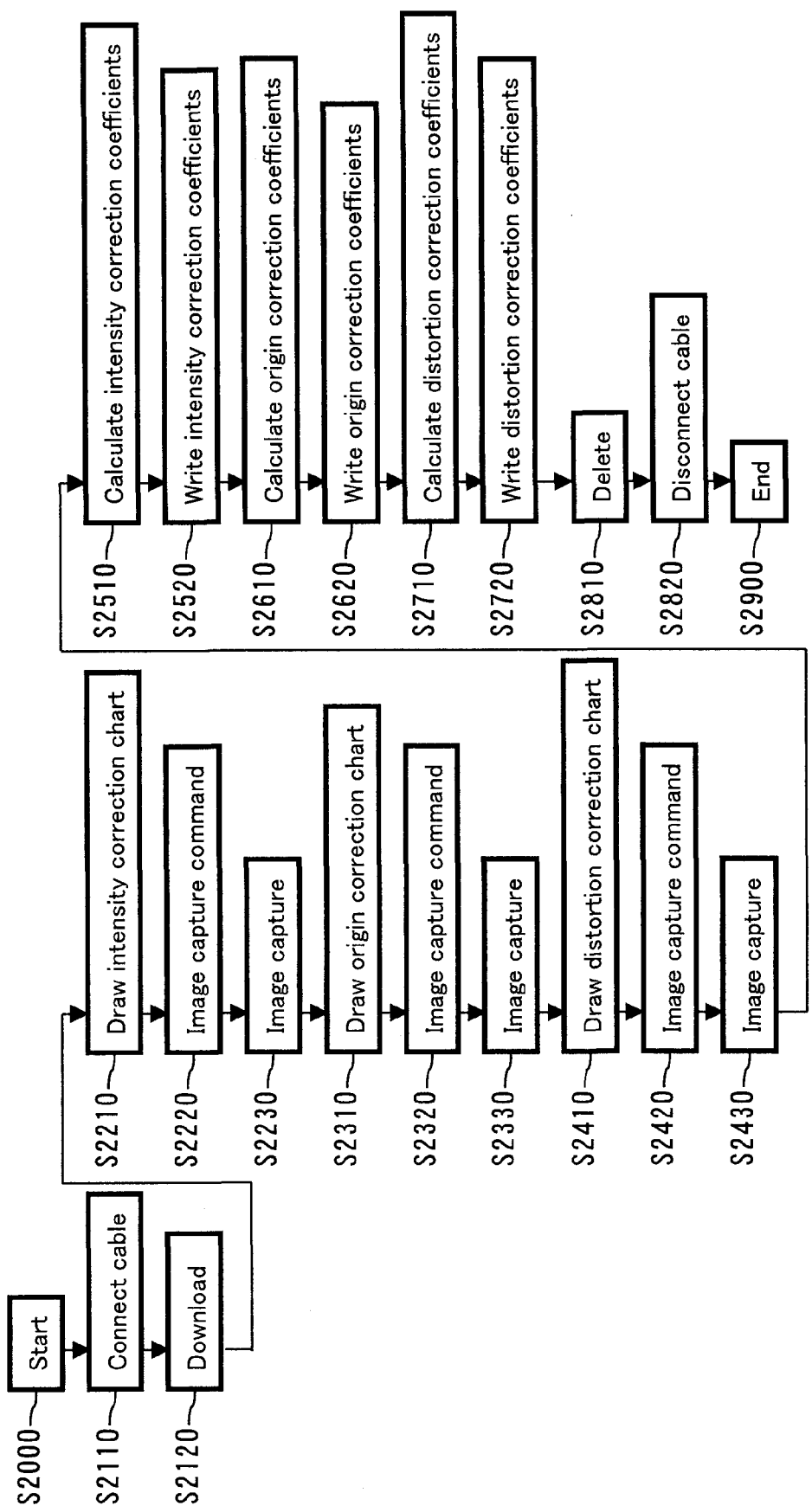
FIG. 30 is a flowchart showing a method of generating intensity correction coefficients, origin correction coefficients, and distortion correction coefficients according to Embodiment 2 of the present invention.

FIG. 30 is a flowchart showing a method of generating intensity correction coefficients, origin correction coefficients, and distortion correction coefficients according to Embodiment 2 of the present invention.

In step S2000, the imaging device 201 is disposed such that the centers of the optical axes of the plurality of lens units of the imaging device 201 coincide with the center of the drawing area on the display 203, and the generation of intensity correction coefficients, origin correction coefficients and distortion correction coefficients is started. Step S2110 is executed next.

In step S2110, the imaging device cable 204 is connected to the imaging device 201. This is performed by an industrial robot or the like. Power is fed from the correction coefficient generation controller 202 to the imaging device 201, making communication possible between the correction coefficient generation controller 202 and the imaging device 201. Step S2120 is executed next.

In step S2120, a correction coefficient generation program is downloaded to the imaging device 201. The correction coefficient generation controller 202 transmits the correction coefficient generation program to the imaging device 201 after detecting that the imaging device cable 204 is connected to the imaging device 201. The imaging device 201 receives the correction coefficient generation program, writes the received program to the memory of the system control unit 231, and thereinafter proceeds to generate intensity correction coefficients in accordance with this correction coefficient generation program. That is, while the intensity correction coefficient generating unit 251, the origin correction coefficient generating unit 252 and the distortion correction coefficient generating unit 253 arc illustrated in FIG. 22 as independent blocks relative to the system control unit 231, they are hypothetical blocks in which their functions are realized as a result of the system control unit 231 executing the correction coefficient generation program. Note that since this correction coefficient generation program is unnecessary and thus deleted after the correction coefficient have been generated, the program may be saved to a volatile memory or a nonvolatile memory. Consequently, the intensity correction coefficient generating unit 251, the origin correction coefficient generating unit 252 and the distortion correction coefficient generating unit 253 do not necessarily exist in the shipped imaging device 201. Step S2210 is executed next.

In step S2210, the correction coefficient generation controller 202 causes the intensity correction chart 205, which is uniform white light, to be drawn on the display 203. Step S2220 is executed next.

In step S2220, the correction coefficient generation controller 202 transmits a command to start image capture to the imaging device 201 via the imaging device cable 204. Step S2230 is executed next.

In step S2230, the imaging device 201 captures an image of the intensity correction chart 205. The imaging device 201 executes this step S2230 in response to the command in step S2220. Description of this operation, which is similar to step S1200, is omitted. The imaging device 201 then saves the imaging signals to the memory of the system control unit 231 as a first imaging signal I1(0, x, y), a second imaging signal I2(0, x, y), a third imaging signal I3(0, x, y), and a fourth imaging signal I4(0, x, y) for use in generating intensity correction coefficients. Note that an area for saving moving images or the like in normal usage is used as this memory. Step S2310 is executed next.

In step S2310, the correction coefficient generation controller 202 causes the origin correction chart 206, which has a cross disposed on background of uniform white light, to be drawn on the display 203. Here, the correction coefficient generation controller 202 causes the origin correction chart 206 to be drawn such that the center of the drawing area on the display 203, that is, the center of each optical axis of the plurality of lens of the imaging device 201, coincides with the intersection of the cross. Step S2320 is executed next.

In step S2320, the correction coefficient generation controller 202 transmits a command to start image capture to the imaging device 201 via the imaging device cable 204. Step S2330 is executed next.

In step S2330, the imaging device 201 captures an image of the origin correction chart 206. The imaging device 201 executes this step S2330 in response to the command in step S2320. Description of this operation, which is similar to step S1200, is omitted. The imaging device 201 then saves the imaging signals to the memory of the system control unit 231 as a first imaging signal I1(1, x, y), a second imaging signal I2(1, x, y), a third imaging signal I3(1, x, y) and a fourth imaging signal I4(1, x, y) for use in generating origin correction coefficients. Note that an area for saving moving images or the like in normal usage is used as this memory. Step S2410 is executed next.

In step S2410, the correction coefficient generation controller 202 causes the distortion correction chart 207, which has a lattice disposed on a background of uniform white light, to be drawn on the display 203. Here, the correction coefficient generation controller 202 causes the distortion correction chart 207 to be drawn such that the center of the drawing area on the display 203, that is, the center of each optical axis of the plurality of lens units of the imaging device 201 coincides with the center of the lattice. Step S2420 is executed next.

In step S2420, the correction coefficient generation controller 202 transmits a command to start image capture to the imaging device 201 via the imaging device cable 204. Step S2430 is executed next.

In step S2430, the imaging device 201 captures an image of the distortion correction chart 207. The imaging device 201 executes this step S2430 in response to the command in step S2420. Description of this operation, which is similar to step S1200, is omitted. The imaging device 201 then saves the imaging signals to the memory of the system control unit 231 as a first imaging signal I1(2, x, y), a second imaging signal I2(2, x, y), a third imaging signal I3(2, x, y), and a fourth imaging signal I4(2, x, y) for use in generating distortion correction coefficients. Note that an area for saving moving images or the like in normal usage is used as this memory. Step S2510 is executed next.

In step S2510, the intensity correction coefficient generating unit 251 generates the intensity correction coefficients $a1(x, y)$, $a2(x, y)$, $a3(x, y)$ and $a4(x, y)$, using the first imaging signal $I1(0, x, y)$, the second imaging signal $I2(0, x, y)$, the third imaging signal $I3(0, x, y)$, and the fourth imaging signal $I4(0, x, y)$ captured and saved to memory in step S2230. The intensity correction coefficient generating unit 251 sets the ratio between the first imaging signal $I1(0, L/2, H/2)$ for use in intensity correction coefficient generation positioned at the center of the image and the first imaging signal $I1(0, x, y)$ for use in intensity correction coefficient generation as the first intensity correction coefficient $a1(x, y)$, as in the following equation (49). Here, $I1(0, L/2, H/2)$ expresses the signal of the pixel positioned at the center of the image (i.e., pixel whose x coordinate is L/2 and y coordinate is H/2), out of the first imaging signals for use in generating intensity correction coefficients. Note that H is the number of pixels in the height direction and L is the number of pixels in the length direction of the image. The intensity correction coefficient generating unit 251 also sets the ratio between the second imaging signal $I2(0, L/2, H/2)$ for use in intensity correction coefficient generation positioned at the center of the image and the second imaging signal $I2(0, x, y)$ for use in intensity correction coefficient generation as the second intensity correction coefficient $a2(x, y)$, as in the following equation (50), sets the ratio between the third imaging signal $I3(0, L/2, H/2)$ for use in intensity correction coefficient generation positioned at the center of the image and the third imaging signal $I3(i, x, y)$ for use in intensity correction coefficient generation as the third intensity correction coefficient $a3(x, y)$, as in the following equation (51), and sets the ratio between the fourth imaging signal $I4(0, L/2, H/2)$ for use in intensity correction coefficient generation positioned at the center of the image and the fourth imaging signal $I4(i, x, y)$ for use in intensity correction coefficient generation as the fourth intensity correction coefficient $a4(x, y)$, as in the following equation (52). Note that image capture may be performed a plurality of times on the intensity correction chart 205 in step S2230, and an image obtained by averaging these images may be used as the imaging signal for use in generating intensity correction coefficients. In this case, the effect of random noise and the like can be reduced by averaging. Step S2520 is executed next.

$$a1(x,y)=I1(0,L/2,H/2)/I1(0,x,y) \tag{49}$$

$$a2(x,y)=I2(0,L/2,H/2)/I2(0,x,y) \tag{50}$$

$$a3(x,y)=I3(0,L/2,H/2)/I3(0,x,y) \tag{51}$$

$$a4(x,y)=I4(0,L/2,H/2)/I4(0,x,y) \tag{52}$$

In step S2520, the intensity correction coefficient generating unit 251 writes the intensity correction coefficients a1(x, y), a2(x, y), a3(x, y) and a4(x, y) to the intensity correction coefficient memory 137. These intensity correction coefficients a1(x, y), a2(x, y), a3(x, y) and a4(x, y) are used in the intensity correction of S1300. Step S2610 is executed next.

In step S2610, the origin correction coefficient generating unit 252 generates the origin correction coefficients g1x, g1y, g2x, g2y, g3x, g3y, g4x, g4y. The respective deviations (s1x, s1y), (s2x, s2y), (s3x, s3y) and (s4x, s4y) from the centers of the crosses of the first imaging signal I1(1, x, y) for use in origin correction coefficient generation, the second imaging signal I2(1, x, y) for use in origin correction coefficient generation, the third imaging signal I3(1, x, y) for use in origin correction coefficient generation, and the fourth imaging signal I4(1, x, y) for use in origin correction coefficient generation (centers of solid lines shown in FIG. 27A-27D) relative to the centers of the images (centers of broken lines shown in FIG. 27A-27D), as shown in FIG. 27, are detected. Here, methods of deriving the coordinates of the centers of the crosses in the respective imaging signals I1(1, x, y), I2(1, x, y), I3(1, x, y) and I4(1, x, y) for use in origin correction coefficient generation involve, for instance, pattern matching thumbnails of the crosses with the imaging signals I1(1, x, y), I2(1, x, y), I3(1, x, y) and I4(1, x, y), or deriving cross patterns by binarizing the imaging signals I1(1, x, y), I2(1, x, y), I3(1, x, y) and I4(1, x, y). Subtracting the coordinates of the centers of the images from the coordinates of the centers of the crosses obtained from the imaging signals I1(1, x, y), I2(1, x, y), I3(1, x, y) and I4(1, x, y) as a result of such methods gives the above deviations (s1x, s1y), (s2x, s2y), (s3x, s3y) and (s4x, s4y).

Next, in order to remove the effect of parallax, the origin correction coefficient generating unit 252 firstly calculates the amount of the parallax. The origin correction coefficient generating unit 252 derives the x component Δx of the parallax and the y component Δy of the parallax, as in the following equations (53) and (54). Here, f is the focal distance of the lens, and Dx is the x component of the distance between the optical axes of the lens units. Dx is the distance between the optical axis of the first lens 113a and the optical axis of the second lens 113b, or the distance between the optical axis of the third lens 113c and the optical axis of the fourth lens 113d, these distances being substantially equal. Dy is the y component of the distance between the optical axes of the lens units. Dy is the distance between the optical axis of the first lens 113a and the optical axis of the third lens 113c, or the distance between the optical axis of the second lens 113b and the optical axis of the fourth lens 113d, these distances being substantially equal. A is the distance from the principal point of a lens (principal point of the first lens 113a, principal point of the second lens 113b, principal point of the third lens 113c, or principal point of the fourth lens 113d) to the display 203 (origin correction chart 206) in the imaging device. Note that the distances from the principal points of the lenses to the display 203 are substantially equal. The origin correction coefficient generating unit 252 removes parallax (Δx or Δy) from the respective deviations (s1x, s1y), (s2x, s2y), (s3x, s3y) and (s4x, s4y) of the centers of the crosses of the first imaging signal I1, the second imaging signal I2, the third imaging signal I3 and the fourth imaging signal I4 (centers of solid lines shown in FIG. 27A-27D) relative to the centers of the images (centers of broken lines shown in FIG. 27A-27D), and generates the origin correction coefficients g1x, g1y, g2x, g2y, g3x, g3y, g4x, g4y, as in the following equations (55), (56), (57), (58), (59), (60), (61) and (62). Note that in step S2330, image capture may be performed a plurality of times on the origin correction chart 206, and an image obtained by averaging these images may be used as the imaging signal for use in generating origin correction coefficients. In this case, the effect of random noise and the like can be reduced by averaging. Also, the origin correction coefficients g1x, g1y, g2x, g2y, g3x, g3y, g4x, g4y may be derived with decimal point precision, by deriving the parallax (Δx or Δy) or the deviations (s1x, s1y), (s2x, s2y), (s3x, s3y) and (s4x, s4y) with decimal point precision. Step S2620 is executed next.

$$\Delta x = f * Dx / A \quad (53)$$

$$\Delta y = f * Dy / A \quad (54)$$

$$g1x = s1x - \Delta x / 2 \quad (55)$$

$$g1y = s1y - \Delta y / 2 \quad (56)$$

$$g2x = s2x + \Delta x / 2 \quad (57)$$

$$g2y = s2y - \Delta y / 2 \quad (58)$$

$$g3x = s3x - \Delta x / 2 \quad (59)$$

$$g3y = s3y + \Delta y / 2 \quad (60)$$

$$g4x = s4x + \Delta x / 2 \quad (61)$$

$$g4x = s4y + \Delta y / 2 \quad (62)$$

In step S2620, the origin correction coefficient generating unit 252 writes the origin correction coefficients g1x, g1y, g2x, g2y, g3x, g3y, g4x, g4y to the origin correction coefficient memory 138. These origin correction coefficients g1x, g1y, g2x, g2y, g3x, g3y, g4x, g4y are used in the origin correction of step S1400. Step S2710 is executed next.

In step S2710, the distortion correction coefficient generating unit 253 generates the distortion correction coefficients p1x(x, y), p1y(x, y), p2x(x, y), p2y(x, y), p3x(x, y), p3y(x, y), p4x(x, y), p4y(x, y). Hereinafter, the method for generating the first distortion correction coefficient p1x(x, y), p1y(x, y) will be described. With the first imaging signal I1(2, x, y) for use in generating distortion correction coefficients that result from capturing an image of the distortion correction chart 207, what should have been imaged as the lattice of FIG. 29 with no distortion (broken lines) when the lens units are not distorted is instead imaged as a distorted lattice (solid lines) due to distortion of the lens units. Firstly, the coordinates (ux1(i, j), uy1(i, j)) of the intersection of the distorted lattice (solid lines shown in FIG. 29) are derived by binarizing the first imaging signal I1(2, x, y) for use in distortion correction coefficient generation, and detecting the cross pattern. The intersection (ux1(i, j), uy1(i, j)) of this distorted lattice (solid lines shown in FIG. 29) would be at the intersection (vx1(i, j), vy1(i, j)) of the undistorted lattice (broken lines shown in FIG. 29) if the lens units were not distorted.

Figure 31:
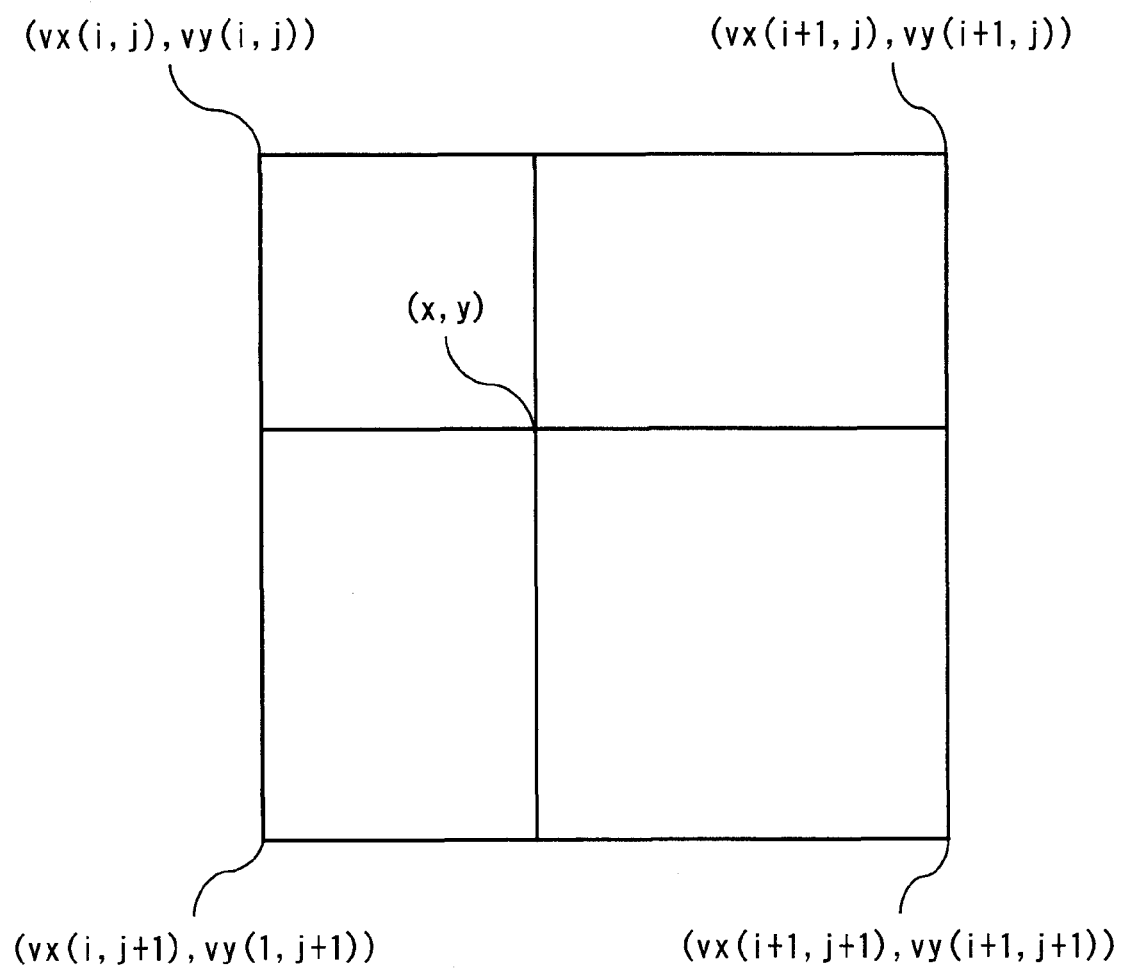
FIG. 31 shows coordinates referenced when generating distortion correction coefficients by linear interpolation.

In the undistorted lattice (broken lines shown in FIG. 29), each intersection (vx1(i, j), vy1(i, j)) of this lattice is expressed as in the following equations (63) and (64), where (vx10, vy10) are the coordinates of the upper-left intersection (vx1(0, 0), vy1(0, 0)), px is an interval of the lattice in the x direction, and py is an interval of the lattice in the y direction. vx10, vy10, px, py are determined from the focal distance of the lens, the distance between the imaging device 201 and the display 203, the lattice size of the distortion correction chart 207, or the like. Since the intersection (ux1(i, j), uy1(i, j)) of the distorted lattice (solid lines shown in FIG. 29) would be at the intersection (vx1(i, j), vy1(i, j)) of the undistorted lattice (broken lines shown in FIG. 29) if there were no distortion, the first distortion correction coefficient p1x(vx1(i, j), vy1(i, j)), p1y(vx1(i, j), vy1(i, j)) at the intersection (vx1(i, j), vy1(i, j)) is as shown in the following expressions (65) and (66). The first distortion correction coefficient p1x(x, y), p1y(x, y) for coordinates other than the intersection (vx1(i, j), vy1(i, j)) is generated by linearly interpolating the distortion correction coefficients (shown by equations (65), (66)) for intersections of the undistorted lattice (broken lines shown in FIG. 29) neighboring the coordinates (x, y), as in the following equations (67) and (68). FIG. 31 shows the coordinates referenced when generating a distortion correction coefficient by linear interpolation. Here, (vx1(i, j), vy1(i, j)) is the intersection of the undistorted lattice (broken lines shown in FIG. 29) on the upper-left of the coordinates (x, y) that are being derived. The distortion correction coefficient generating unit 253 then removes the effect of origin deviation and parallax using the origin correction coefficient g1x, g1y and the parallaxes Δx (see equation (53)) and Δy (see equation (54)), as in the following equations (69) and (70).

$$vx1(i, j) = vx10 + px * i \quad (63)$$

$$vy1(i, j) = vy10 + py * i \quad (64)$$

$$p1x(vx1(i, j), vy1(i, j)) = ux1(i, j) - vx1(i, j) \quad (65)$$

$$p1y(vx1(i, j), vy1(i, j)) = uy1(i, j) - vy1(i, j) \quad (66)$$

$$p1x(x, y) = [(vx1(i+1, j+1) - x) * (vy1(i+1, j+1) - y) * \quad (67)$$
$$p1x(vx1(i, j), vy1(i, j)) + (vx1(i+1, j) - x) *$$
$$(y - vy1(i+1, j)) * p1x(vx1(i, j+1), vy1(i, j+1)) +$$
$$(x - vx1(i, j+1)) * (vy1(i, j+1) - y) *$$
$$p1x(vx1(i+1, j), vy1(i+1, j)) +$$
$$(x - vx1(i, j)) * y(vy1(i, j)) *$$
$$p1x(vx1(i+1, j+1), vy1(i+1, j+1))] / (px * py)$$

$$p1y(x, y) = [(vx1(i+1, j+1) - x) * (vy1(i+1, j+1) - y) * \quad (68)$$
$$p1y(vx1(i, j), vy1(i, j)) + (vx1(i+1, j) - x) *$$
$$(y - vy1(i+1, j)) * p1y(vx1(i, j+1), vy1(i, j+1)) +$$
$$(x - vx1(i, j+1)) * (vy1(i, j+1) - y) *$$
$$p1y(vx1(i+1, j), vy1(i+1, j)) + (x - vx1(i, j)) * (y - vy1(i, j)) *$$
$$p1y(vx1(i+1, j+1), vy1(i+1, j+1))] / (px * py)$$

$$p1x(x, y) = p1x(x, y) - g1x - \Delta x / 2 \quad (69)$$

$$p1y(x, y) = p1y(x, y) - g1y - \Delta y / 2 \quad (70)$$

The distortion correction coefficient generating unit 253 also similarly derives the second distortion correction coefficient p2x(x, y), p2y(x, y), the third distortion correction coefficient p3x(x, y), p3y(x, y), and the fourth distortion correction coefficient p4x(x, y), p4y(x, y). That is, the coordinates (ux2(i, j), uy2(i, j)), (ux3(i, j), uy3(i, j)) and (ux4(i, j), uy4(i, j)) of the intersections of the distorted lattice are derived based on the second imaging signal I2(2, x, y) for use in distortion correction coefficient generation, the third imaging signal I3(2, x, y) for use in distortion correction coefficient generation, and the fourth imaging signal I4(2, x, y) for use in distortion correction coefficient generation. The intersections (vx2(i, j), vy2(i, j)), (vx3(i, j), vy3(i, j)) and (vx4(i, j), vy4(i, j)) of the undistorted lattice are as shown in the following equations (71), (72), (73), (74), (75) and (76).

The second distortion correction coefficient p2x(vx2(i, j), vy2(i, j)), p2y(vx2(i, j), vy2(i, j)) at (vx2(i, j), vy2(i, j)) is as shown in the following equations (77) and (78), the third distortion correction coefficient p3x(vx3(i, j), vy3(i, j)), p3y(vx3(i, j), vy3(i, j)) at (vx3(i, j), vy3(i, j)) is as shown in the following equations (79) and (80), and the fourth distortion correction coefficient p4x(vx4(i, j), vy4(i, j)), p4y(vx4(i, j), vy4(i, j)) at (vx4(i, j), vy4(i, j)) is as shown in the following equations (81) and (82). Further, the distortion correction coefficient generating unit 253 generates the second distortion correction coefficient p2x(x, y), p2y(x, y) for coordinates other than the intersection (vx2(i, j), vy2(i, j)) by linearly interpolating the distortion correction coefficients (shown by equations (77), (78)) for intersections of the undistorted lattice neighboring the coordinates (x, y), as in the following equations (83) and (84). The distortion correction coefficient generating unit 253 also generates the third distortion correction coefficient p3x(x, y), p3y(x, y) for coordinates other than the intersection (vx3(i, j), vy3(i, j)) by linearly interpolating the distortion correction coefficients (shown by equations (79), (80)) for intersections of the undistorted lattice neighboring the coordinates (x, y), as in the following equations (85) and (86). Further, the distortion correction coefficient generating unit 253 generates the fourth distortion correction coefficient p4x(x, y), p4y(x, y) for coordinates other than the intersection (vx4(i, j), vy4(i, j)) by linearly interpolating the distortion correction coefficients (shown by equations (81), (82)) for intersections of the undistorted lattice neighboring the coordinates (x, y), as in the following equations (87) and (88). The distortion correction coefficient generating unit 253 then removes the effect of origin deviation and parallax using the origin correction coefficient g2x, g2y, g3x, g3y, g4x, g4y and the parallaxes Δx (see equation (53)) and Δy (see equation (54)), as in the following equations (89), (90), (91), (92), (93) and (94). Step S2720 is executed next.

$$vx2(i, j) = vx20 + px * i \quad (71)$$

$$vy2(i, j) = vy20 + py * i \quad (72)$$

$$vx3(i, j) = vx30 + px * i \quad (73)$$

$$vy3(i, j) = vy30 + py * i \quad (74)$$

$$vx4(i, j) = vx40 + px * i \quad (75)$$

$$vy4(i, j) = vy40 + py * i \quad (76)$$

$$p2x(vx2(i, j), vy2(i, j)) = ux2(i, j) - vx2(i, j) \quad (77)$$

$$p2y(vx2(i, j), vy2(i, j)) = uy2(i, j) - vy2(i, j) \quad (78)$$

$$p3x(vx3(i, j), vy3(i, j)) = ux3(i, j) - vx3(i, j) \quad (79)$$

$$p3y(vx3(i, j), vy3(i, j)) = uy3(i, j) - vy3(i, j) \quad (80)$$

$$p4x(vx4(i, j), vy4(i, j)) = ux4(i, j) - vx4(i, j) \quad (81)$$

$$p4y(vx4(i, j), vy4(i, j)) = uy4(i, j) - vy4(i, j) \quad (82)$$

$$p2x(x, y) = [(vx2(i+1, j+1) - x) * (vy2(i+1, j+1) - y) * \quad (83)$$
$$p2x(vx2(i, j), vy2(i, j)) + (vx2(i+1, j) - x) *$$
$$(y - vy2(i+1, j)) * p2x(vx2(i, j+1), vy2(i, j+1)) +$$
$$(x - vx2(i, j+1)) * (vy2(i, j+1) - y) *$$
$$p2x(vx2(i+1, j), vy2(i+1, j)) + (x - vx2(i, j)) * (y - vy2(i, j)) *$$
$$p2x(vx2(i+1, j+1), vy2(i+1, j+1))] / (px * py)$$

$$p2y(x, y) = [(vx2(i+1, j+1) - x) * (vy2(i+1, j+1) - y) * \quad (84)$$
$$p2y(vx2(i, j), vy2(i, j)) + (vx2(i+1, j) - x) *$$
$$(y - vy2(i+1, j)) * p2y(vx2(i, j+1), vy2(i, j+1)) +$$
$$(x - vx2(i, j+1)) * (vy2(i, j+1) - y) *$$
$$p2y(vx2(i+1, j), vy2(i+1, j)) + (x - vx2(i, j)) * (y - vy2(i, j)) *$$
$$p2y(vx2(i+1, j+1), vy2(i+1, j+1))] / (px * py)$$

-continued $$p3x(x, y) = [(vx3(i+1, j+1) - x) * (vy3(i+1, j+1) - y) * \\ p3x(vx3(i, j), vy3(i, j)) + (vx3(i+1, j) - x) * \\ (y - vy3(i+1, j)) * p3x(vx3(i, j+1), vy3(i, j+1)) + \\ (x - vx3(i, j+1)) * (vy3(i, j+1) - y) * \\ p3x(vx3(i+1, j), vy3(i+1, j)) + (x - vx3(i, j)) * (y - vy3(i, j)) * \\ p3x(vx3(i+1, j+1), vy3(i+1, j+1))]/(px*py) \quad (85)$$

$$p3y(x, y) = [(vx3(i+1, j+1) - x) * (vy3(i+1, j+1) - y) * \\ p3y(vx3(i, j), vy3(i, j)) + (vx3(i+1, j) - x) * \\ (y - vy3(i+1, j)) * p3y(vx3(i, j+1), vy3(i, j+1)) + \\ (x - vx3(i, j+1)) * (vy3(i, j+1) - y) * \\ p3y(vx3(i+1, j), vy3(i+1, j)) + (x - vx3(i, j)) * (y - vy3(i, j)) * \\ p3y(vx3(i+1, j+1), vy3(i+1, j+1))]/(px*py) \quad (86)$$

$$p4x(x, y) = [(vx4(i+1, j+1) - x) * (vy4(i+1, j+1) - y) * \\ p4x(vx4(i, j), vy4(i, j)) + (vx4(i+1, j) - x) * \\ (y - vy4(i+1, j)) * p4x(vx4(i, j+1), vy4(i, j+1)) + \\ (x - vx4(i, j+1)) * (vy4(i, j+1) - y) * \\ p4x(vx4(i+1, j), vy4(i+1, j)) + (x - vx4(i, j)) * (y - vy4(i, j)) * \\ p4x(vx4(i+1, j+1), vy4(i+1, j+1))]/(px*py) \quad (87)$$

$$p4y(x, y) = [(vx4(i+1, j+1) - x) * (vy4(i+1, j+1) - y) * \\ p4y(vx4(i, j), vy4(i, j)) + (vx4(i+1, j) - x) * \\ (y - vy4(i+1, j)) * p4y(vx4(i, j+1), vy4(i, j+1)) + \\ (x - vx4(i, j+1)) * (vy4(i, j+1) - y) * \\ p4y(vx4(i+1, j), vy4(i+1, j)) + (x - vx4(i, j)) * (y - vy4(i, j)) * \\ p4y(vx4(i+1, j+1), vy4(i+1, j+1))]/(px*py) \quad (88)$$

$$p2x(x, y) = p2x(x, y) - g2x - \Delta x/2 \quad (89)$$

$$p2y(x, y) = p2y(x, y) - g2y - \Delta y/2 \quad (90)$$

$$p3x(x, y) = p3x(x, y) - g3x - \Delta x/2 \quad (91)$$

$$p3y(x, y) = p3y(x, y) - g3y - \Delta y/2 \quad (92)$$

$$p4x(x, y) = p4x(x, y) - g4x - \Delta x/2 \quad (93)$$

$$p4y(x, y) = p4y(x, y) - g4y - \Delta x/2 \quad (94)$$

In step S2720, the distortion correction coefficient generating unit 253 writes the distortion correction coefficients p1x(x, y), p1y(x, y), p2x(x, y), p2y(x, y), p3x(x, y), p3y(x, y), p4x(x, y), p4y(x, y) to the distortion correction coefficient memory 139. These distortion correction coefficients p1x(x, y), p1y(x, y), p2x(x, y), p2y(x, y), p3x(x, y), p3y(x, y), p4x(x, y), p4y(x, y) are used in the distortion correction of step S1500. Step S2810 is executed next.

In step S2810, the system control unit 231 deletes the correction coefficient generation program. The correction coefficient generation program is only necessary when generating intensity correction coefficients, origin correction coefficients, and distortion correction coefficients, and is not required when capturing images of normal subjects. Consequently, downloading the correction coefficient generation program at step S2120, and deleting the correction coefficient generation program at this step enables memory that can be utilized in normal usage to be increased. Step S2820 is executed next.

In step S2820, the imaging device cable 204 is disconnected from the imaging device 201. This is carried out by an industrial robot. This imaging device cable 204 is next connected to another imaging device and used in generating intensity correction coefficients, origin correction coefficients and distortion correction coefficients for that imaging device. Step S2900 is executed next.

In step S2900, the generation of intensity correction coefficients, origin correction coefficients, and distortion correction coefficients is ended.

The imaging device 201 then operates similarly to Embodiment 1 when in normal usage.

As a result of being configured and operated as above, the imaging device of Embodiment 2 has the following effects.

The imaging device 201 of Embodiment 2, in the manufacturing process, captures an image of the intensity correction chart 205 in step S2230, generates the intensity correction coefficients a1(x, y), a2(x, y), a3(x, y) and a4(x, y) in step S2510, and writes the intensity correction coefficients a1(x, y), a2(x, y), a3(x, y) and a4(x, y) to the intensity correction coefficient memory 137 in step S2520. Then, in normal usage, the imaging device 201 performs intensity correction based on these intensity correction coefficients a1(x, y), a2(x, y), a3(x, y) and a4(x, y) in step S1300. Biasing of light intensity distribution is thereby compensated and the occurrence of false colors is suppressed, enabling fine images to be synthesized even if the variability in component precision or assembly is different for each imaging device 201.

Note that the imaging device 201 of Embodiment 2 may also have the effect of suppressing the occurrence of false colors even if the sensitivity bias for the first imaging unit 123a, the second imaging unit 123b, the third imaging unit 123c, and the fourth imaging unit 123d respectively differ.

The imaging device 201 of Embodiment 2, in the manufacturing process, captures an image of the origin correction chart 206 in step S2330, generates the origin correction coefficients g1x, g1y, g2x, g2y, g3x, g3y, g4x, g4y in step S2610, and writes the origin correction coefficients g1x, g1y, g2x, g2y, g3x, g3y, g4x, g4y to the origin correction coefficient memory 138 in step S2620. Then, in normal usage, the imaging device 201 performs origin correction based on the origin correction coefficients g1x, g1y, g2x, g2y, g3x, g3y, g4x, g4y in step 1400. Since origin deviation is thereby compensated, correct parallax derived, and image synthesis performed based on this correct parallax, fine images can be synthesized even if the variability in component precision or assembly is different for each imaging device 201.

The imaging device 201 of Embodiment 2, in the manufacturing process, captures an image of the distortion correction chart 207 in step S2430, generates the distortion correction coefficients p1x(x, y), p1y(x, y), p2x(x, y), p2y(x, y), p3x(x, y), p3y(x, y), p4x(x, y), p4y(x, y) in step S2710, and writes the distortion correction coefficients p1x(x, y), p1y(x, y), p2x(x, y), p2y(x, y), p3x(x, y), p3y(x, y), p4x(x, y), p4y(x, y) to the distortion correction coefficient memory 139 in step S2720. Then, in normal usage, the imaging device 201 performs distortion correction based on these distortion correction coefficients p1x(x, y), p1y(x, y), p2x(x, y), p2y(x, y), p3x(x, y), p3y(x, y), p4x(x, y), p4y(x, y) in step S1500. Since the effect of distortion is thereby reduced, correct parallax derived, and image synthesis performed based on this correct parallax, fine images can be synthesized even if the variability in component precision or assembly is different for each imaging device 201.

Note that in the imaging device 201 of Embodiment 2, images were captured of the intensity correction chart 205, the origin correction chart 206, and the distortion correction chart 207 drawn on the display 203, although images may be captured of paper charts that have been appropriately illuminated. Also, images may be captured of transmissive charts such as glass or transparent resin that have been disposed in front of diffuse white illumination.

In Embodiment 2, the imaging device 201 generates the intensity correction coefficients a1, a2, a3 and a4 in S2510, generates the origin correction coefficients g1x, g1y, g2x, g2y, g3x, g3y, g4x, g4y in step S2610, and generates the distortion correction coefficients p1x(x, y), p1y(x, y), p2x(x, y), p2y(x, y), p3x(x, y), p3y(x, y), p4x(x, y), p4y(x, y) in step S2710. However, the imaging device 201 may instead transfer digitized imaging signals I1(0, x, y), I2(0, x, y), I3(0, x, y) and I4(0, x, y) for use in intensity correction coefficient generation, imaging signals I1(1, x, y), I2(1, x, y), I3(1, x, y) and I4(1, x, y) for use in origin correction coefficient generation, and imaging signals I1(2, x, y), I2(2, x, y), I3(2, x, y) and I4(2, x, y) for use in distortion correction coefficient generation to the correction coefficient generation controller 202, and the correction coefficient generation controller 202 may compute the intensity correction coefficients a1, a2, a3 and a4, the origin correction coefficients g1x, g1y, g2x, g2y, g3x, g3y, g4x, g4y, and the distortion correction coefficients p1x(x, y), p1y(x, y), p2x(x, y), p2y(x, y), p3x(x, y), p3y(x, y), p4x(x, y), p4y(x, y), and transfer the resultant correction coefficients to the imaging device 201. In this case, the imaging device 201 may save the intensity correction coefficients a1, a2, a3 and a4 computed by the correction coefficient generation controller 202 to the intensity correction coefficient memory 137, save the origin correction coefficients g1x, g1y, g2x, g2y, g3x, g3y, g4x, g4y to the origin correction coefficient memory 138, and save the distortion correction coefficients p1x(x, y), p1y(x, y), p2x(x, y), p2y(x, y), p3x(x, y), p3y(x, y), p4x(x, y), p4y(x, y) to the distortion correction coefficient memory 139.

In the imaging device 201 of Embodiment 2, the correction coefficient generation program is placed in the memory of the system control unit 231, although the correction coefficient generation program may instead be stored in an external memory such as a flash memory like an SD card, and the system control unit 231 may execute this correction coefficient generation program by accessing the external memory via the input/output unit 136. Similarly, the imaging signals captured at steps S2510, S2610, and S2710 may also be saved to an external memory.

The imaging device 201 of Embodiment 2 sets in step S2510 the reciprocal of imaging signals I1(0, x, y), I2(0, x, y), I3(0, x, y) and I4(0, x, y) for use in intensity correction as the intensity correction coefficients a1, a2, a3 and a4, although a spatial LPF or a temporal LPF may be used. For example, a spatial LPF such as in equation (12) may be applied.

The imaging device 201 of Embodiment 2 respectively derives the intensity correction coefficients a1, a2, a3, a4, the origin correction coefficients g1x, g1y, g2x, g2y, g3x, g3y, g4x, g4y and the distortion correction coefficients p1x(x, y), p1y(x, y), p2x(x, y), p2y(x, y), p3x(x, y), p3y(x, y), p4x(x, y), p4y(x, y) in steps S2510, S2610 and S2710 using imaging signals obtained by performing one-off image capture in steps S2230, S2330 and S2430, although the result of averaging imaging signals obtained by performing image capture a plurality of times may be used. Using the average of a plurality of captured imaging signals is equivalent to applying a temporal LPF. Since the effect of random noise and the like is reduced by applying this LPF, enabling precise intensity correction coefficients a1, a2, a3 and a4, origin correction coefficients g1x, g1y, g2x, g2y, g3x, g3y, g4x, g4y, and distortion correction coefficients p1x(x, y), p1y(x, y), p2x(x, y), p2y(x, y), p3x(x, y), p3y(x, y), p4x(x, y), p4y(x, y) to be generated, fineer images can be synthesized.

The imaging device 201 of Embodiment 2 generates the intensity correction coefficients a1(x, y), a2(x, y), a3(x, y) and a4(x, y) for each pixel (x, y), although approximation may be used. For example, an approximation obtained by multiplying intensity correction coefficients exponentially expanded in the x and y directions as in the following equation (95) or an approximation exponentially expanded as in the following equation (96) may be determined as the first intensity correction coefficient, coefficients (a1x0, a1x1, a1x2, a1x3, a1xz, a1y0, a1y1, a1y2, a1y3, a1yz or a100, a110, a101, a120, a111, a102, a130, a121, a112, a103, a1xz, a1yz) may be generated by least squares or the like in step S2510, these coefficients may be written to the intensity correction coefficient memory 137 in step S2520, and the first intensity correction value b1(x, y) for the pixel (x, y) may be generated using equations (95) or (96) in step S1320. Note that the symbol "^" in equations (95) and (96) expresses exponentiation. The second intensity correction coefficient, the third intensity correction coefficient, and the fourth intensity correction coefficient may be determined similarly to the first intensity correction coefficient, and in step S1320 the second intensity correction value b2(x, y), the third intensity correction value b3(x, y) and the fourth intensity correction value b4(x, y) may be derived similarly to equations (95) and (96).

$$[a1x0 + a1x1*(x - a1xz) + a1x2*(x - a1xz) \wedge 2 + \quad (95)$$
$$a1x3*(x - a1xz) \wedge 3]*[a1y0 + a1y1*(y - a1yz) +$$
$$a1y2*(y - a1yz) \wedge 2 + a1y3*(y - a1yz) \wedge 3]$$

$$a100 + a110*(x - a1xz) + a101*(y - a1yz) + a120*(x - a1xz) \wedge 2 + \quad (96)$$
$$a111*(x - a1xz)*(y - a1yz) + a102*(y - a1yz) \wedge 2 +$$
$$a130*(x - a1xz) \wedge 3 + a121*(x - a1xz) \wedge 2*(y - a1yz) +$$
$$a112*(x - a1xz)*(y - a1yz) \wedge 2 + a103*(y - a1yz) \wedge 3$$

The imaging device 201 of Embodiment 2 captures an image of uniform white light of constant illuminance in step S2230, and generates one set of intensity correction coefficients a1(x, y), a2(x, y), a3(x, y) and a4(x, y), although a plurality of images may be captured of uniform white light of varying illuminance, and a plurality of sets of intensity correction coefficients may be generated. In this case, one of the plural sets of intensity correction coefficients may be selected according to intensity in step S1300, and the selected set may be used. Also, a term that changes according to intensity may be added to the approximation. In this case, nonlinear change due to intensity can also be compensated.

The imaging device 201 of Embodiment 2 captures an image of uniform white light of constant illuminance in step S2230, and generates intensity correction coefficients a1(x, y), a2(x, y), a3(x, y) and a4(x, y), such that the imaging signals I1, I2, I3 and I4 are uniform, although the intensity correction coefficients may be generated to reduce intensity at the periphery of the image. That is, the result of multiplying a coefficient (1−ksh*[(x−L/2)^2+(y−H/2)^2]) that decreases towards the periphery of the image by the ratio between a first imaging signal I1(0, L/2, H/2) for use in intensity correction coefficient generation positioned at the center of the image and a first imaging signal I1(0, x, y) for use in intensity correction coefficient generation is set as the first intensity correction coefficient a1(x, y), as in the following equation (97). Also, the result of multiplying a coefficient (1−ksh*[(x−L/2)^2+(y−H/2)^2]) that decreases towards the periphery of the image by the ratio between a second imaging signal I2(0, L/2, H/2) for use in intensity correction coefficient generation positioned at the center of the image and a second imaging signal I2(0p, x, y) for use in intensity correction coefficient generation is set as the second intensity correction coefficient a2(x, y), as in the following equation (98). Also, the result of multiplying a coefficient (1−ksh*[(x−L/2)^2+(y−H/2)^2]) that decreases towards the periphery of the image by the ratio between a third imaging signal I3(0, L/2, H/2) for use in intensity correction coefficient generation positioned at the center of the image and a third imaging signal I3(i, x, y) for use in intensity correction coefficient generation is set as the third intensity correction coefficient a3(x, y), as in the following equation (99). Further, the result of multiplying a coefficient (1−ksh*[(x−L/2)^2+(y−H/2)^2]) that decreases towards the periphery of the image by the ratio between a fourth imaging signal I4(0, L/2, H/2) for use in intensity correction coefficient generation positioned at the center of the image and a fourth imaging signal I4(i, x, y) for use in intensity correction coefficient generation is set as the fourth intensity correction coefficient a4(x, y), as in the following equation (100). Note that ksh shows a set value, (x−L/2)^2 shows (x−L/2) squared, and (y−H/2)^2 shows (y−H/2) squared. More natural images, in which illumination around the periphery of the image has been reduced, can thereby be created.

$$a1(x, y) = I1(0, L/2, H/2)/I1(0, x, y) * \qquad (97)$$
$$(1 - ksh * [(x - L/2) \wedge 2 + (y - H/2) \wedge 2])$$

$$a2(x, y) = I2(0, L/2, H/2)/I2(0, x, y) * \qquad (98)$$
$$(1 - ksh * [(x - L/2) \wedge 2 + (y - H/2) \wedge 2])$$

$$a3(x, y) = I3(0, L/2, H/2)/I3(0, x, y) * \qquad (99)$$
$$(1 - ksh * [(x - L/2) \wedge 2 + (y - H/2) \wedge 2])$$

$$a4(x, y) = I4(0, L/2, H/2)/I4(0, x, y) * \qquad (100)$$
$$(1 - ksh * [(x - L/2) \wedge 2 + (y - H/2) \wedge 2])$$

As described above, the imaging device 201 of Embodiment 2 sets the ratio between the first imaging signal I1(0, L/2, H/2) for use in intensity correction coefficient generation positioned at the center of the image and the first imaging signal I1(0, x, y) for use in intensity correction coefficient generation as the first intensity correction coefficient a1(x, y) in step S2510, as in equation (49), and sets the ratio between the fourth imaging signal I4(0, L/2, H/2) for use in intensity correction coefficient generation positioned at the center of the image and the fourth imaging signal I4(i, x, y) for use in intensity correction coefficient generation as the fourth intensity correction coefficient a4(x, y), as in equation (52). The imaging device 201 then uses these intensity correction coefficients, and calculates correction values for each pixel (x, y) in step S1320. The imaging device 201 then sets the result of respectively multiplying the set values kab1 and kab4 with the first intensity correction coefficient a1(x, y) and the fourth intensity correction coefficient a4(x, y) to the first intensity correction value b1(x, y) and the fourth intensity correction value b4(x, y), as in equations (18) and (21). Further, the imaging device 201, in step S1330, corrects the first imaging signal I1(x, y) and the fourth imaging signal I4(x, y), by respectively multiplying these imaging signals by the first intensity correction value b1(x, y) and the fourth intensity correction value b4(x, y), as in equations (22) and (25).

Here, as a modification of Embodiment 2, the intensity levels of the first imaging signal I1 and the fourth imaging signal I4 may be made equal. That is, the ratio between the first imaging signal I1(0, L/2, H/2) for use in intensity correction coefficient generation positioned at the center of the image and the fourth imaging signal I4(i, x, y) for use in intensity correction coefficient generation may be set as the fourth intensity correction coefficient a4(x, y), as in the following equation (101) rather than equation (52). Also, the result of multiplying the set value kab1 by the fourth intensity correction coefficient a4(x, y) may be set as the fourth intensity correction value b4(x, y), as in the following equation (102) rather than equation (21). Also, the fourth intensity correction coefficient a4(x, y) may be corrected by being multiplied by the fourth imaging signal I4(x, y), as in equation (25). Since the intensity levels of the first imaging signal I1 and the fourth imaging signal I4 are thereby made equal, truer parallax is derived and image synthesis is performed based on the this true parallax, enabling fineer images to be synthesized even if there is variability in the intensity levels of the first imaging signal I1 and the fourth imaging signal I4 due to variability in the imaging element or assembly.

$$a4(x,y)=I1(0,L/2,H/2)/I4(0,x,y) \qquad (101)$$

$$b4(x,y)=kab1*a4(x,y) \qquad (102)$$

Note that merely matching the levels of the first imaging element and the fourth imaging element has the effect of equalizing the intensity levels. That is, where the light intensity distributions are equal, and only the average intensity levels differ, parallax precision improves even when only the intensity levels are corrected. Specifically, the first intensity correction coefficient a1 and the fourth intensity correction coefficient a4 may be set as constants (not dependant on x or y), the set values kab1 and kab4 may be made the same, and the ratio between the first intensity correction coefficient a1 and the fourth intensity correction coefficient a4 may be set as the ratio between the average of the fourth imaging signals I4 (avg(I4)) and the average of the first imaging signals I1 (avg (I1)), as in the following equation (103). Since the intensity correction coefficients are thereby set as constants, enabling the capacity of the intensity correction coefficient memory 137 to be cut, cost reductions can be achieved.

$$a1/a4=avg(I4)/avg(I1) \qquad (103)$$

The imaging device 201 of Embodiment 2 generates the distortion correction coefficients p1x(x, y), p1y(x, y), p2x(x, y), p2y(x, y), p3x(x, y), p3y(x, y), p4x(x, y), p4y(x, y) for each pixel (x, y), although approximation may be used. For example, an approximation obtained by multiplying distortion correction coefficients exponentially expanded in the x and y directions as in the following equation (104) or an approximation exponentially expanded as in the following equation (105) may be determined as the first distortion correction coefficient, coefficients (p1x0, p1x1, p1x2, p1x3, p1xz, p1y0, p1y1, p1y2, p1y3, p1yz or p100, p110, p101, p120, p111, p102, p130, p121, p112, p103, p1xz, p1yz) may be generated by least squares or the like in step S2710, and these coefficients may be written to the distortion correction coefficient memory 139 in step S2720. Also, in step S1520, the first distortion correction coordinates (q1x(x, y), q1y(x, y)) may be generated using equations (104) and (105) and the coordinates (x, y) of each pixel. Note that the symbol in equations (104) and (105) expresses exponentiation. The second distortion correction coefficient, the third distortion correction coefficient and the fourth distortion correction coefficient may be determined similarly to the first distortion correction coefficient, and in step S1520 the second distortion correction coordinates (q2x(x, y), q2y(x, y)), the third distortion correction coordinates (q3x(x, y), q3y(x, y)) and the fourth distortion correction coordinates (q4x(x, y), q4y(x, y)) may be derived using equations (104) and (105) and the coordinates (x, y) of each pixel, similarly to the first distortion correction coordinates (q1x(x, y), q1y(x, y)).

$$[p1x0 + p1x1*(x - p1xz) + p1x2*(x - p1xz) \wedge 2 + \qquad (104)$$
$$p1x3*(x - p1xz) \wedge 3]*[p1y0 + p1y1*(y - p1yz) +$$
$$p1y2*(y - p1yz) \wedge 2 + p1y3*(y - p1yz) \wedge 3]$$

$$p100 + p110*(x - p1xz) + p101*(y - p1yz) + \qquad (105)$$
$$p120*(x - p1xz) \wedge 2 + p111*(x - p1xz)*(y - p1yz) +$$
$$p102*(y - p1yz) \wedge 2 + p130*(x - p1xz) \wedge 3 +$$
$$p121*(x - p1xz) \wedge 2*(y - p1yz) +$$
$$p112*(x - p1xz)*(y - p1yz) \wedge 2 + p103*(y - p1yz) \wedge 3$$

In Embodiment 2, the imaging device 201 captures an image of the origin correction chart 206 which has a cross drawn thereon, although the origin correction chart is not limited to this. For example, an image may be captured of a chart with a dot drawn in the central portion thereof, and origin correction coefficients may be derived by deriving the coordinates of the dot. Alternatively, an image may be captured of a chart with a circle drawn thereon, and origin correction coefficients may be derived by deriving the center of the circle.

Figure 32B:
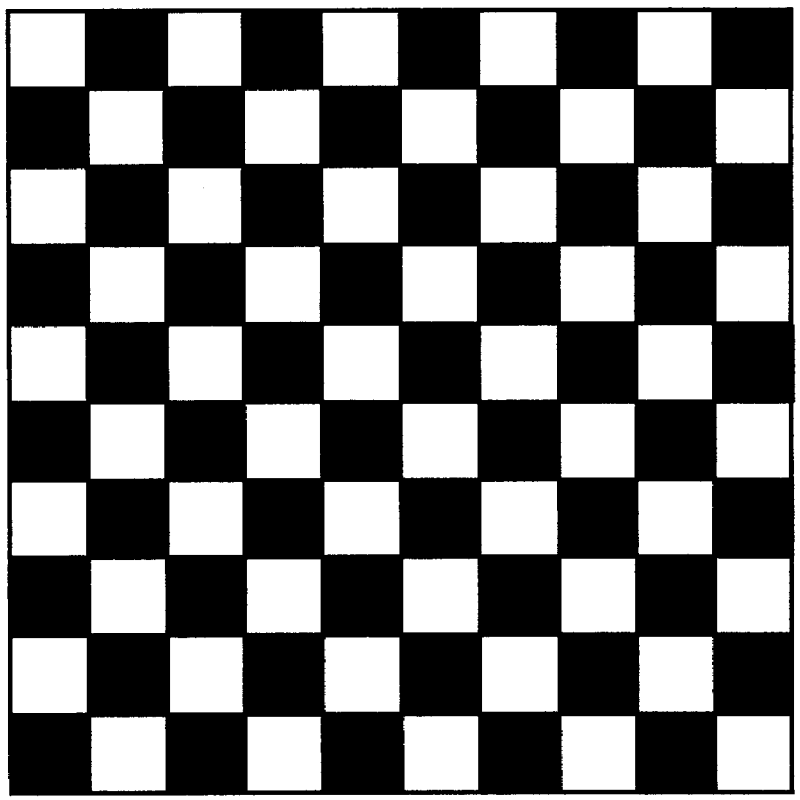
FIGS. 32A and 32B are external views of distortion correction charts used in generating distortion correction coefficients in a modification of Embodiment 2 of the present invention.
Figure 32A:
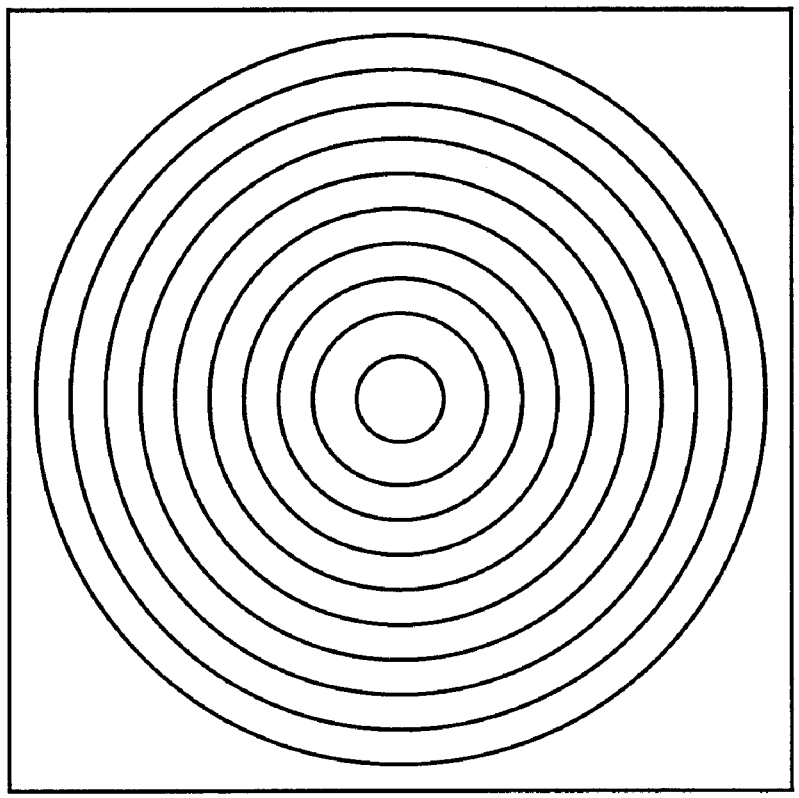

In Embodiment 2, the imaging device 201 captures an image of the distortion correction chart 207 that has a lattice drawn thereon, although the distortion correction chart is not limited to this. FIGS. 32A and 32B are external views of distortion correction charts used in generating distortion correction coefficients in a modification of Embodiment 2 of the present invention. For example, an image may be captured of a chart with a circle drawn thereon as in FIG. 32A, and distortion correction coefficients may be derived by deriving the distortion of the circle. An image may also be captured of a checkered chart as in FIG. 32B, and distortion correction coefficients may be derived by deriving the intersections of the extracted edges.

In the imaging device 201 of Embodiment 2, only the intensity correction coefficients a1(x, y), a2(x, y), a3(x, y), a4(x, y), the origin correction coefficients g1x, g1y, g2x, g2y, g3x, g3y, g4x, g4y, and the distortion correction coefficients p1x(x, y), p1y(x, y), p1x(x, y), p1y(x, y), p3x(x, y), p3y(x, y), p1x(x, y), p4y(x, y) are generated, although other subjects may be drawn, and other correction coefficients may be generated. For example, an image of the intensity correction chart 205 may be captured similar to Embodiment 2, and correction coefficients may be generated for black dots (places where the imaging signals are always approximately zero) and white dots (places where the imaging signals are always extremely large). Also, correction coefficients for γ (gamma) correction may be generated. Further, an image of the distortion correction chart 207 may be captured, and correction coefficients may be generated for correcting differences in magnification between the imaging signals (first imaging signal I1, second imaging signal I2, third imaging signal I3, fourth imaging signal I4) or differences in rotation angle. Images may be drawn that enable a plurality of these to be measured simultaneously, and a plurality of correction coefficients may be generated. Also, signals obtained by capturing these plurality of different subjects may be saved, and correction coefficients may be generated later.

In Embodiment 2, the imaging element 123 is constituted by the first imaging element 123a, the second imaging element 123b, the third imaging element 123c and the fourth imaging element 123d, and the imaging signal input unit 133 is constituted by the first imaging signal input unit 133a, the second imaging signal input unit 133b, the third imaging signal input unit 133c, and the fourth imaging signal input unit 133d. However, the imaging element 123 may be constituted by a single imaging element, and four images may be formed at different positions on a light receiving surface thereof by the first to fourth lens units 113a to 113d. Also, the imaging signal input unit 133 may be constituted by a single imaging signal input unit that receives as input signals from the single imaging element 123. In this case, the first imaging signal I1, the second imaging signal I2, the third imaging signal I3, and the fourth imaging signal I4 should be set by setting four areas in data placed in the memory of the system control unit 231, and extracting the data corresponding to each area. Also, when generating correction coefficients in the manufacturing process, the first imaging signal I1, the second imaging signal I2, the third imaging signal I3, and the fourth imaging signal I4 may be generated using the above area settings, and during actual operation of the imaging device 201, the first imaging signal I1, the second imaging signal I2, the third imaging signal I3, and the fourth imaging signal I4 may be generated using the areas corrected with the origin correction coefficients g1x, g1y, g2x, g2y, g3x, g3y, g4x, g4y as the above area settings.

Note that although the above description illustrates the configuration and operations of a device that performs various corrections on imaging signals obtained through image capture and corrects parallax before synthesizing images from the imaging signals, the imaging device of the present invention can also be applied as a measuring device for detecting distance to the subject. That is, the imaging device of the present invention can also be implemented as a device that calculates distance based on parallax obtained as aforementioned, and outputs the obtained distance, with practical application as a surveying device, inter-vehicular distance detecting device or the like being conceivable. That is, equation (1), when solved for distance A, is as shown in equation (46). Accordingly, the distance to the subject from the block $B_i$ is as calculated in equation (47), and the distance to the subject from a pixel (x, y) included in the block $B_i$ is as shown in equation (48), and saved in the memory of the system control unit 231. Note that the units of measurement are changed appropriately when the calculations are performed. If the distance information A(x, y) is then output externally via the input/output unit 136, an imaging device that functions as a measuring device for detecting distance can be realized.

Embodiment 3

The imaging device 201 of the aforementioned Embodiment 2 generates three types of correction coefficients from images captured of three types of charts. That is, the intensity correction coefficients a1(x, y), a2(x, y), a3(x, y), a4(x, y) are generated from an image captured of the intensity correction chart 205, the origin correction coefficients g1x, g1y, g2x, g2y, g3x, g3y, g4x, g4y are generated from an image captured of the origin correction chart 206, and the distortion correction coefficients p1x(x, y), p1y(x, y), p2x(x, y), p2y(x, y), p3x(x, y), p3y(x, y), p4x(x, y), p4y(x, y) are generated from an image captured of the distortion correction chart 207. The imaging device according to Embodiment 3 of the present invention creates three types of correction coefficients from images captured of two types of charts. That is, the intensity correction coefficients a1(x, y), a2(x, y), a3(x, y), a4(x, y) and the origin correction coefficients g1x, g1y, g2x, g2y, g3x, g3y, g4x, g4y are generated from an image captured of an intensity/origin correction chart, and the distortion correction coefficients p1x(x, y), p1y(x, y), p2x(x, y), p2y(x, y), p3x(x, y), p3y(x, y), p4x(x, y), p4y(x, y) are generated from an image captured of the distortion correction chart 207. Thus, the imaging device of Embodiment 3 is able to shorten the time taken to generate correction coefficients in the manufacturing process.

Figure 33:
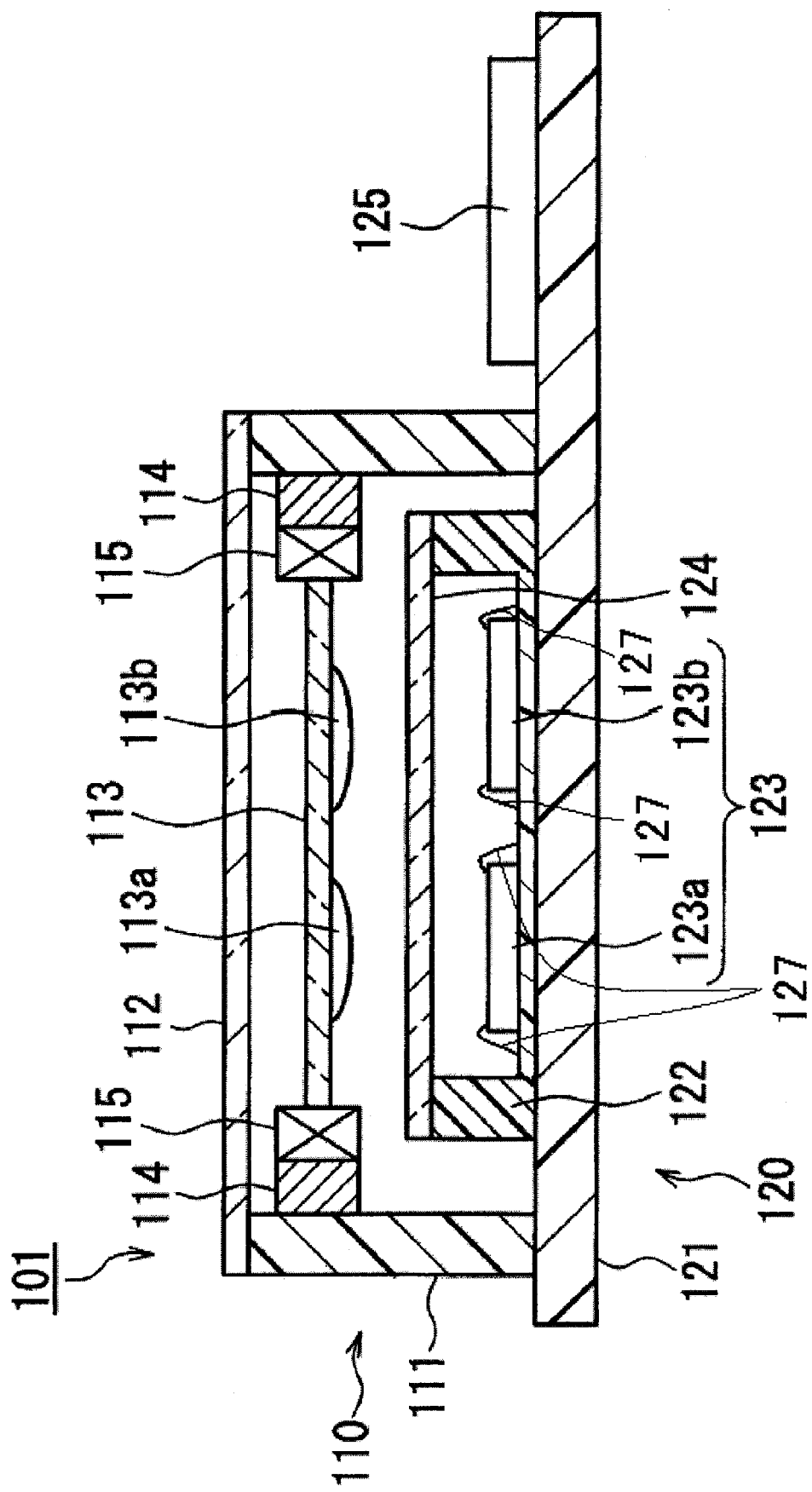
FIG. 33 is a cross-sectional view showing the configuration of an imaging device according to Embodiment 3 of the present invention.

The imaging device according to Embodiment 3 of the present invention will be described with reference to the drawings. FIG. 33 is a cross-sectional view showing the configuration of the imaging device according to Embodiment 3 of the present invention. In FIG. 33, an imaging device 301 has a lens module unit 110 and a circuit unit 320.

The lens module unit 110 has a lens barrel 111, an upper cover glass 112, a lens 113, a fixed actuator portion 114, and a movable actuator portion 115. The circuit unit 320 has a substrate 121, a package 122, an imaging element 123, a package cover glass 124, and a system LSI (hereinafter, SLSI) 325. The configurations and operations apart from the SLSI 325 are similar to Embodiment 1, with the same reference numerals attached and redundant description omitted.

Figure 34:
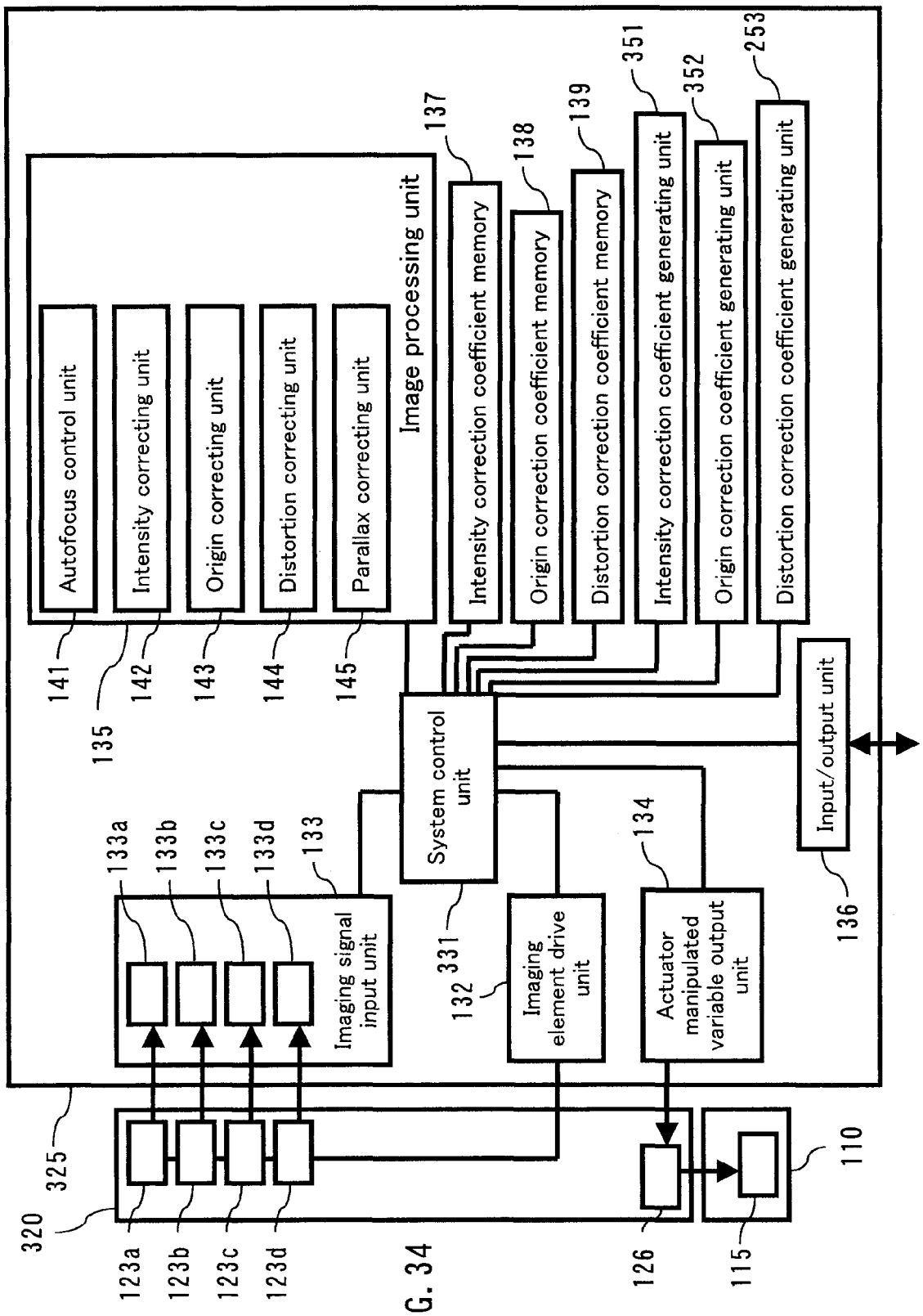
FIG. 34 is a block diagram of the imaging device according to Embodiment 3 of the present invention.

FIG. 34 is a block diagram of the imaging device according to Embodiment 3 of the present invention. The SLSI 325 has a system control unit 331, an imaging element drive unit 132, an imaging signal input unit 133, an actuator manipulated variable output unit 134, an image processing unit 135, an input/output unit 136, an intensity correction coefficient memory 137, an origin correction coefficient memory 138, a distortion correction coefficient memory 139, an intensity correction coefficient generating unit 351, an origin correction coefficient generating unit 352, and a distortion correction coefficient generating unit 253. The circuit unit 320 has an amplifier 126 in addition to the above configuration.

In an inspection process during the manufacturing process after assembly of the imaging device 301, the intensity correction coefficient generating unit 351 generates intensity correction coefficients $a1(x, y)$, $a2(x, y)$, $a3(x, y)$, $a4(x, y)$, and writes the intensity correction coefficients $a1(x, y)$, $a2(x, y)$, $a3(x, y)$, $a4(x, y)$ to the intensity correction coefficient memory 137. The origin correction coefficient generating unit 352 also generates origin correction coefficients $g1x$, $g1y$, $g2x$, $g2y$, $g3x$, $g3y$, $g4x$, $g4y$, and writes the origin correction coefficients $g1x$, $g1y$, $g2x$, $g2y$, $g3x$, $g3y$, $g4x$, $g4y$ to the origin correction coefficient memory 138. Further, the distortion correction coefficient generating unit 253 generates distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$, and writes the distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$ to the distortion correction coefficient memory 139.

Figure 35:
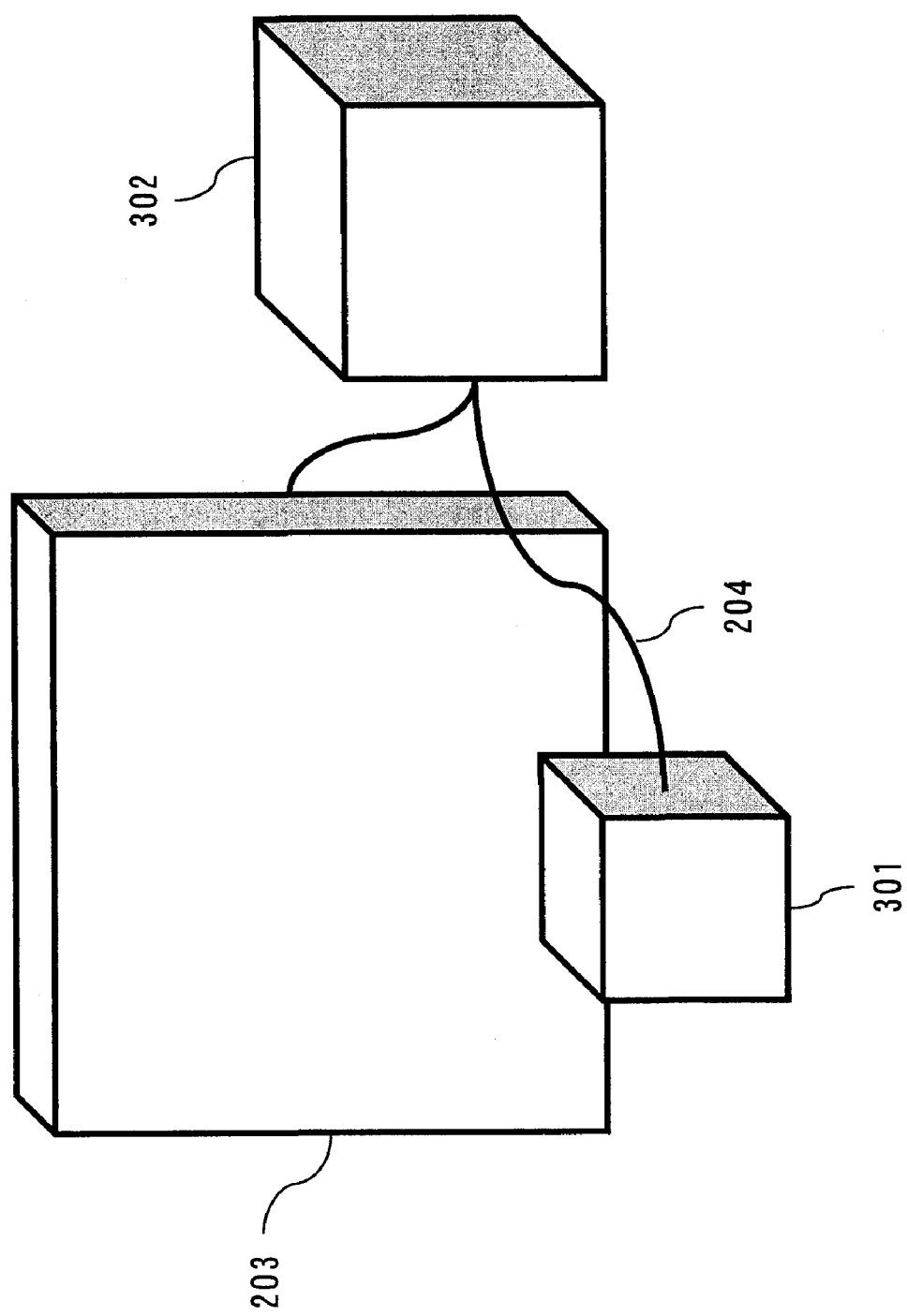
FIG. 35 is an external view of the imaging device and other devices when generating correction coefficients according to Embodiment 3 of the present invention.

FIG. 35 is an external view of the imaging device and other devices when generating correction coefficients according to Embodiment 3 of the present invention. 301 is the imaging device according to Embodiment 3 of the present invention, 302 is a correction coefficient generation controller, 203 is a display, and 204 is a cable for connecting the imaging device. The correction coefficient generation controller 302, which is constituted by a computer, performs coordinated control, of the imaging device 301 and the display 203, and causes the imaging device 301 to generate the intensity correction coefficients $a1(x, y)$, $a2(x, y)$, $a3(x, y)$, $a4(x, y)$, the origin correction coefficients $g1x$, $g1y$, $g2x$, $g2y$, $g3x$, $g3y$, $g4x$, $g4y$, and the distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$. The display 203, which is constituted by a CRT display or the like, is controlled by the correction coefficient generation controller 302, operates in coordination with the imaging device 301, and draws images (charts) used in generating the intensity correction coefficients $a1(x, y)$, $a2(x, y)$, $a3(x, y)$, $a4(x, y)$, the origin correction coefficients $g1x$, $g1y$, $g2x$, $g2y$, $g3x$, $g3y$, $g4x$, $g4y$, and the distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$. The imaging device cable 204, which is constituted by a USB cable or the like, connects the imaging device 301 and the correction coefficient generation controller 302, feeds power to the imaging device 301, and is the medium through which communication is performed between the imaging device 301 and the correction coefficient generation controller 302.

Figure 36:
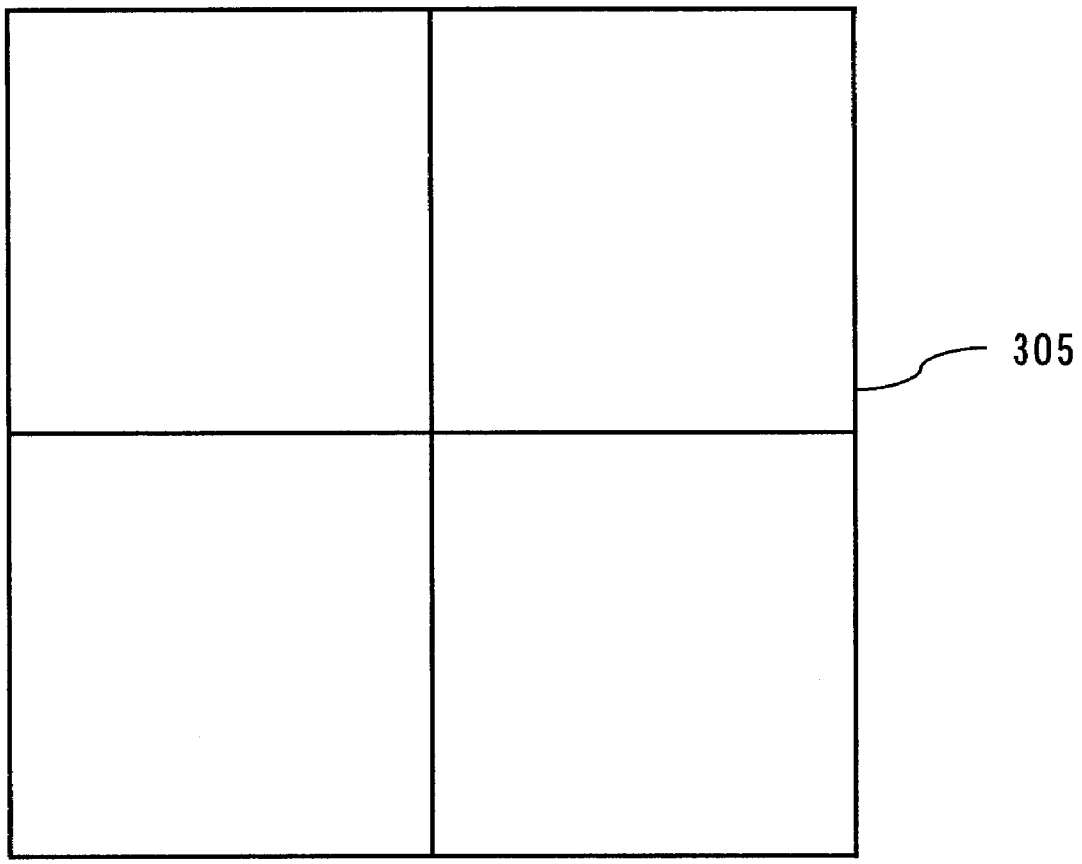
FIG. 36 is an external view of an intensity/origin correction chart used in generating intensity correction coefficients and origin correction coefficients according to Embodiment 3 of the present invention.

The operations of the imaging device according to Embodiment 3 of the present invention will be described next. FIG. 36 is an external view of an intensity/origin correction chart used in generating intensity correction coefficients and origin correction coefficients according to Embodiment 3 of the present invention. As shown in FIG. 36, the intensity/origin correction chart 305 is a uniform white subject with a cross drawn thereon. The imaging device 301 is disposed so as to directly oppose the intensity/origin correction chart 305, and the centers of the optical axes of the plurality of lens of the imaging device 301 are disposed so as to coincide with the center of the cross in the intensity/origin correction chart 305. The origin correction coefficients $g1x$, $g1y$, $g2x$, $g2y$, $g3x$, $g3y$, $g4x$, $g4y$ are generated with a similar method to Embodiment 2, using the cross portion of imaging signals. The intensity correction coefficients $a1(x, y)$, $a2(x, y)$, $a3(x, y)$, $a4(x, y)$ are generated with a similar method to Embodiment 2 with regard to portions other than the cross portion of the imaging signals, and are derived by interpolating from portions other than the cross portion with regard to the cross portion of the imaging signals.

The distortion correction coefficients $p1x(x, y)$, $p1y(x, y)$, $p2x(x, y)$, $p2y(x, y)$, $p3x(x, y)$, $p3y(x, y)$, $p4x(x, y)$, $p4y(x, y)$ are generated with a similar method to Embodiment 2 by capturing an image of the distortion correction chart 207.

Figure 37:
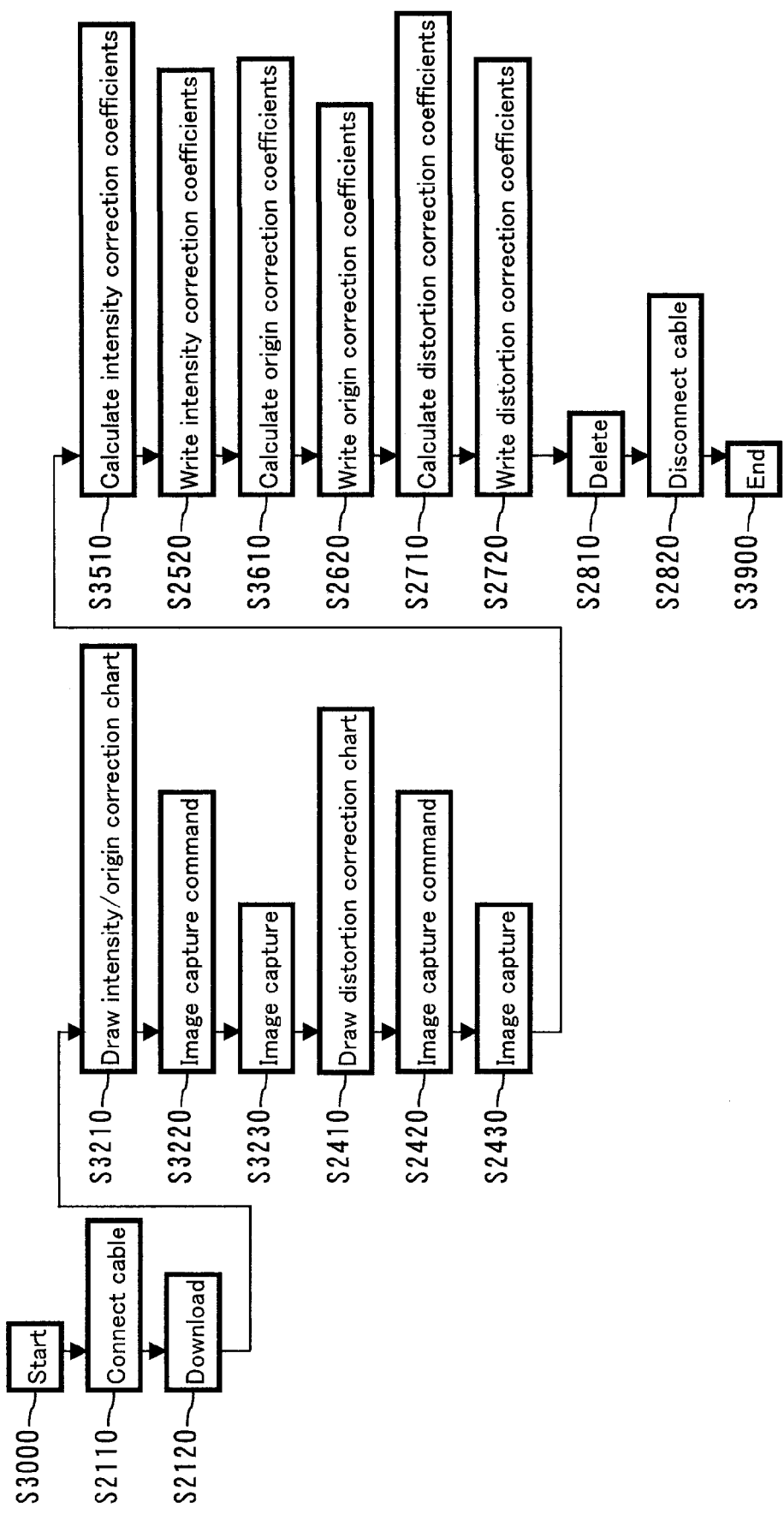
FIG. 37 is a flowchart showing a method of generating intensity correction coefficients, origin correction coefficients, and distortion correction coefficients according to Embodiment 3 of the present invention.

FIG. 37 is a flowchart showing the method of generating intensity correction coefficients, origin correction coefficients, and distortion correction coefficients according to Embodiment 3 of the present invention.

In step S3000, the imaging device 301 is disposed such that the centers of the optical axes of the plurality of lens units of the imaging device 301 coincide with the center of the drawing area on the display 203, and the generation of intensity correction coefficients, origin correction coefficients, and distortion correction coefficients is started. Step S2110 is executed next.

In step S2110, the imaging device cable 204 is connected to the imaging device 301. Description of this step, which is similar to Embodiment 2, is omitted. Step S2120 is executed next.

In step S2120, a correction coefficient generation program is downloaded to the imaging device 301. Description of this step, which is similar to Embodiment 2, is omitted. Step S3210 is executed next.

In step S3210, the correction coefficient generation controller 302 causes the intensity/origin correction chart 305, which has a cross disposed on a background of uniform white light, to be drawn on the display 203 (see FIG. 36). Here, the intensity/origin correction chart 305 is drawn such that the center of the drawing area on the display 203, that is, the center of each optical axis of the plurality of lens units of the imaging device 301 coincides with the intersection of the cross. Step S3220 is executed next.

In step S3220, the correction coefficient generation controller 302 transmits a command to start image capture to the imaging device 301 via the imaging device cable 204. Step S3230 is executed next.

In step S3230, the imaging device 301 performs image capture. The imaging device 301 executes this step in response to the command in step S3220. Description of this operation, which is similar to step S1200, is omitted. The imaging signals are saved to the memory of the system control unit 331 as a first imaging signal I1(0, x, y), a second imaging signal I2(0, x, y), a third imaging signal I3(0, x, y), and a fourth imaging signal I4(0, x, y) for use in generating intensity and origin correction coefficients. Note that an area for saving moving images or the like in normal usage of the imaging device 301 is used as this memory. Step S2410 is executed next.

In step S2410, the correction coefficient generation controller 302 draws the distortion correction chart 207. Description of this step, which is similar to Embodiment 2, is omitted. Step S2420 is executed next.

In step S2420, the correction coefficient generation controller 302 transmits a command to start image capture to the imaging device 301 via the imaging device cable 204. This step is similar to Embodiment 2. Step S2430 is executed next.

In step S2430, the imaging device 301 performs image capture. Description of this step, which is similar to Embodiment 2, is omitted. Step S3510 is executed next.

In step S3510, the intensity correction coefficient generating unit 351 generates the intensity correction coefficients a1(x, y), a2(x, y), a3(x, y) and a4(x, y). The intensity correction coefficient generating unit 351 sets the reciprocal of the first imaging signal I1(0, x, y) for use in intensity and origin correction coefficient generation as the first intensity correction coefficient a1(x, y) in relation to pixels in portions of the intensity/origin correction chart 305 other than where the cross is drawn, as in the following equation (106). Similarly, the intensity correction coefficient generating unit 351 sets the reciprocal of the second imaging signal I2(0p, x, y) for use in intensity and origin correction coefficient generation as the second intensity correction coefficient a2(x, y) as in the following equation (107), sets the reciprocal of the third imaging signal I3(1, x, y) for use in intensity and origin correction coefficient generation as the third intensity correction coefficient a3(x, y) as in the following equation (108), and sets the reciprocal of the fourth imaging signal I4(i, x, y) for use in intensity and origin correction coefficient generation as the fourth intensity correction coefficient a4(x, y) as in the following equation (109). Next, the intensity correction coefficient generating unit 351 derives the correction coefficients for pixels in portions of the intensity/origin correction chart 305 where the cross is drawn, using the intensity correction coefficients of nearest neighboring pixels where the cross is not drawn. That is, the intensity correction coefficient generating unit 351, in relation to portions where the cross is drawn, sets the first intensity correction coefficient a1(x, y) of the pixel (x, y) to the first intensity correction coefficient a1(xn1(x, y), yn1(x, y)) of the nearest neighboring pixel (xn1(x, y), yn1(x, y)) where the cross is not drawn, as in the following equation (110). Similarly, the intensity correction coefficient generating unit 351 sets the second intensity correction coefficient a2(x, y) of the pixel (x, y) to the second intensity collection coefficient a2(xn2(x, y), yn2(x, y)) of the nearest neighboring pixel (xn2(x, y), yn2(x, y)) where the cross is not drawn, as in the following equation (111). Also, the intensity correction coefficient generating unit 351 sets the third intensity correction coefficient a3(x, y) of the pixel (x, y) to the third intensity correction coefficient a3(xn3(x, y), yn3(x, y)) of the nearest neighboring pixel (xn3(x, y), yn3(x, y)) where the cross is not drawn, as in the following equation (112). Further, the intensity correction coefficient generating unit 351 sets the fourth intensity correction coefficient a4(x, y) of the pixel (x, y) to the fourth intensity correction coefficient a4(xn4(x, y), yn4(x, y)) of the nearest neighboring pixel (xn4(x, y), yn4(x, y)) where the cross is not drawn, as in the following equation (113). Note that image capture may be performed a plurality of times in step S3230, and an image obtained by averaging these images may be used. In this case, the effect of random noise and the like can be reduced by averaging. Also, approximation may be used, by using the average of the coefficients of the two nearest vertical neighboring pixels, using the average of the coefficients of the two nearest lateral neighboring pixels, using the average of the coefficients of the four nearest vertical and lateral neighboring pixels, or predicting the coefficients by extrapolation. Step S2520 is executed next.

$$a1(x,y)=1/I1(0,x,y) \quad (106)$$

$$a2(x,y)=1/I2(0,x,y) \quad (107)$$

$$a3(x,y)=1/I3(0,x,y) \quad (108)$$

$$a4(x,y)=1/I4(0,x,y) \quad (109)$$

$$a1(x,y)=a1(xn1(x,y),yn1(x,y)) \quad (110)$$

$$a2(x,y)=a2(xn2(x,y),yn2(x,y)) \quad (111)$$

$$a3(x,y)=a3(xn3(x,y),yn3(x,y)) \quad (112)$$

$$a4(x,y)=a4(xn4(x,y),yn4(x,y)) \quad (113)$$

In step S2520, the intensity correction coefficient generating unit 351 writes the intensity correction coefficients a1(x, y), a2(x, y), a3(x, y) and a4(x, y) to the intensity correction coefficient memory 137. These intensity correction coefficients a1(x, y), a2(x, y), a3(x, y) and a4(x, y) are used in the intensity correction of S1300. This step is similar to Embodiment 2. Step S3610 is executed next.

In step S3610, the origin correction coefficient generating unit 352 generates the origin correction coefficients g1x, g1y, g2x, g2y, g3x, g3y, g4x, g4x. Description of this step, which is performed with a similar method to Embodiment 2, is omitted. The first imaging signal I1(0, x, y) for use in intensity and origin correction coefficient generation, the second imaging signal I2(0, x, y) for use in intensity and origin correction coefficient generation, the third imaging signal I3(0, x, y) for use in intensity and origin correction coefficient generation, and the fourth imaging signal I4(0, x, y) for use in intensity and origin correction coefficient generation, however, are used as the imaging signals. Step S2620 is executed next.

In step S2620, the origin correction coefficient generating unit 352 writes the origin correction coefficients g1x, g1y, g2x, g2y, g3x, g3y, g4x, g4y to the origin correction coefficient memory 138. These origin correction coefficients g1x, g1y, g2x, g2y, g3x, g3y, g4x, g4y are used in the origin correction of step S1400. This step is similar to Embodiment 2. Step S2710 is executed next.

In step S2710, the distortion correction coefficient generating unit 253 generates the distortion correction coefficients p1x(x, y), p1y(x, y), p2x(x, y), p2y(x, y), p3x(x, y), p3y(x, y), p4x(x, y), p4y(x, y). Description of this step, which is similar to Embodiment 2, is omitted. Step S2720 is executed next.

In step S2720, the distortion correction coefficient generating unit 253 writes the distortion correction coefficients p1x(x, y), p1y(x, y), p2x(x, y), p2y(x, y), p3x(x, y), p3y(x, y), p4x(x, y), p4y(x, y) to the distortion correction coefficient memory 139. These distortion correction coefficients p1x(x, y), p1y(x, y), p2x(x, y), p2y(x, y), p3x(x, y), p3y(x, y), p4x(x, y), p4y(x, y) are used in the distortion correction of step S1500. This step is similar to Embodiment 2. Step S2810 is executed next.

In step S2810, the system control unit 331 deletes the correction coefficient generation program. Description of this step, which is similar to Embodiment 2, is omitted. Step S2820 is executed next.

In step S2820, the imaging device cable 204 is disconnected from the imaging device 301. Description of this step, which is similar to Embodiment 2, is omitted. Step S3900 is executed next.

In step S3900, the generation of intensity correction coefficients, origin correction coefficients, and distortion correction coefficients is ended.

As a result of being configured and operated as described above, the imaging device of Embodiment 3 obtains similar effects to Embodiment 2. Further, the imaging device of Embodiment 3 is able to suppress the number of times that image capture is performed in the manufacturing process and shorten the tact time of the manufacturing process, since the intensity correction coefficients a1(x, y), a2(x, y), a3(x, y), a4(x, y) and the origin correction coefficients g1x, g1y, g2x, g2y, g3x, g3y, g4x, g4y are generated using the same imaging signal obtained by capturing an image of a single intensity/origin correction chart 305.

Note that although the above description illustrates the configuration and operations of a device that performs various corrections on imaging signals obtained through image capture and corrects parallax before synthesizing images from the imaging signals, the imaging device of the present invention can also be applied as a measuring device for detecting distance to the subject. That is, the imaging device of the present invention can also be implemented as a device that calculates distance based on parallax obtained as aforementioned, and outputs the obtained distance, with practical application as a surveying device, inter-vehicular distance detecting device or the like being conceivable. That is, equation (1), when solved for distance A, is as shown in equation (46). Accordingly, the distance to the subject from the block $B_i$ is as calculated in equation (47), and the distance to the subject from a pixel (x, y) included in the block $B_i$ is as shown in equation (48), and saved in the memory of the system control unit 331. Note that the units of measurement are changed appropriately when the calculations are performed. If the distance information A(x, y) is then output externally via the input/output unit 136, an imaging device that functions as a measuring device for detecting distance can be realized.

Embodiment 4

The imaging device of the aforementioned Embodiment 2 generates three types of correction coefficients from images captured of three types of charts. That is, the intensity correction coefficients a1(x, y), a2(x, y), a3(x, y) and a4(x, y) are generated from an image captured of the intensity correction chart 205, the origin correction coefficients g1x, g1y, g2x, g2y, g3x, g3y, g4x, g4y are generated from an image captured of the origin correction chart 206, and the distortion correction coefficients p1x(x, y), p1y(x, y), p2x(x, y), p2y(x, y), p3x(x, y), p3y(x, y), p4x(x, y), p4y(x, y) are generated from an image captured of the distortion correction chart 207. In contrast, the imaging device according to Embodiment 4 of the present invention creates three types of correction coefficients from an image captured of one type of chart. That is, the intensity correction coefficients a1(x, y), a2(x, y), a3(x, y) and a4(x, y), the origin correction coefficients g1x, g1y, g2x, g2y, g3x, g3y, g4x, g4y, and the distortion correction coefficients p1x(x, y), p1y(x, y), p2x(x, y), p2y(x, y), p3x(x, y), p3y(x, y), p4x(x, y), p4y(x, y) are generated from a captured image of an intensity/origin/distortion correction chart. Thus, the imaging device of Embodiment 4 is able to shorten the time taken to generate correction coefficients in the manufacturing process.

Figure 38:
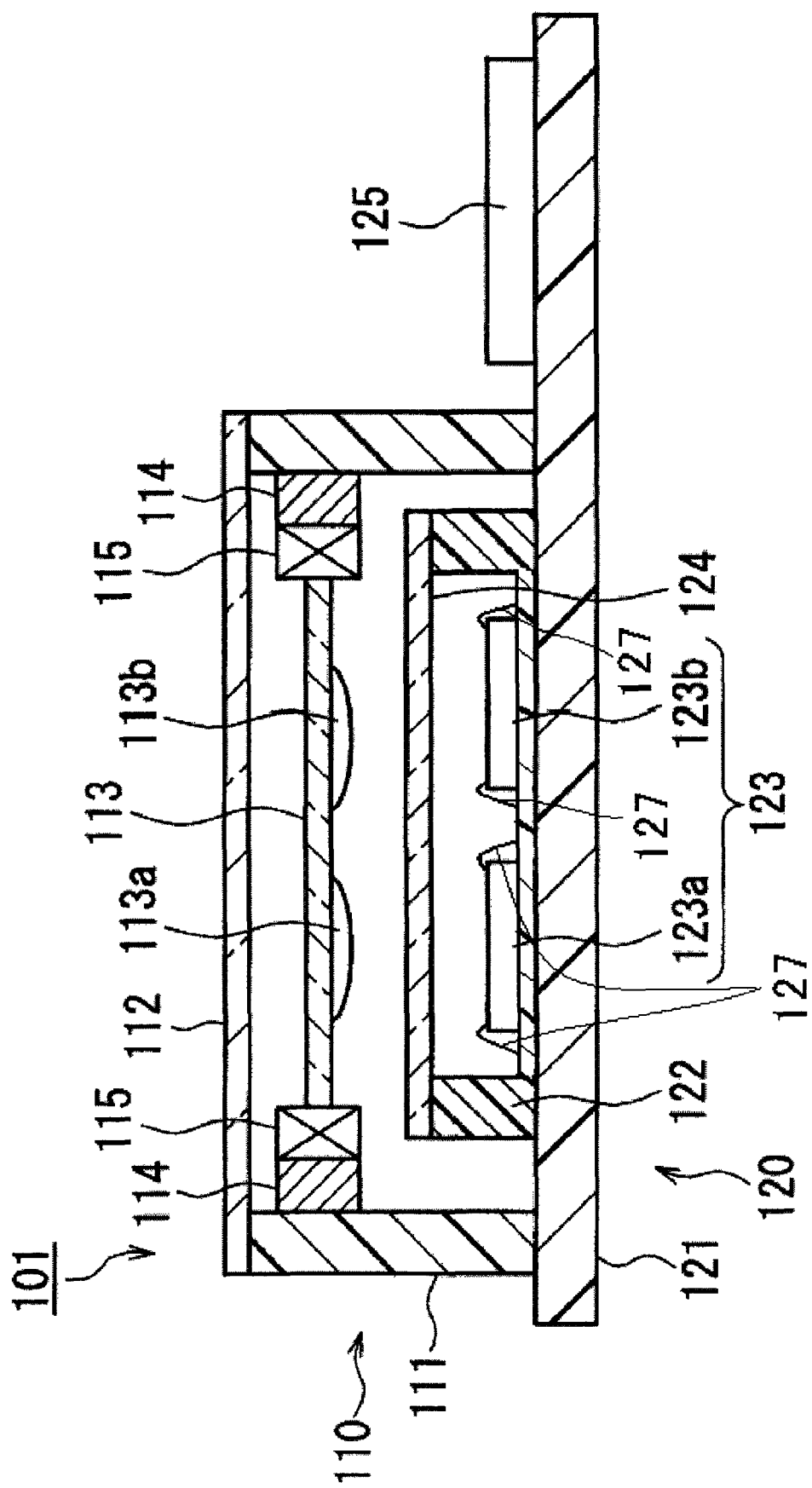
FIG. 38 is a cross-sectional view showing the configuration of an imaging device according to Embodiment 4 of the present invention.

The imaging device according to Embodiment 4 of the present invention will be described with reference to the drawings. FIG. 38 is a cross-sectional view showing the configuration of the imaging device according to Embodiment 4 of the present invention. In FIG. 38, an imaging device 401 has a lens module unit 110 and a circuit unit 420.

The lens module unit 110 has a lens barrel 111, an upper cover glass 112, a lens 113, a fixed actuator portion 114, and a movable actuator portion 115. The circuit unit 420 has a substrate 121, a package 122, an imaging element 123, a package cover glass 124, and a system LSI (hereinafter, SLSI) 425. The configurations and operations apart from the SLSI 425 are similar to Embodiment 1, with the same reference numerals attached and redundant description omitted.

Figure 39:
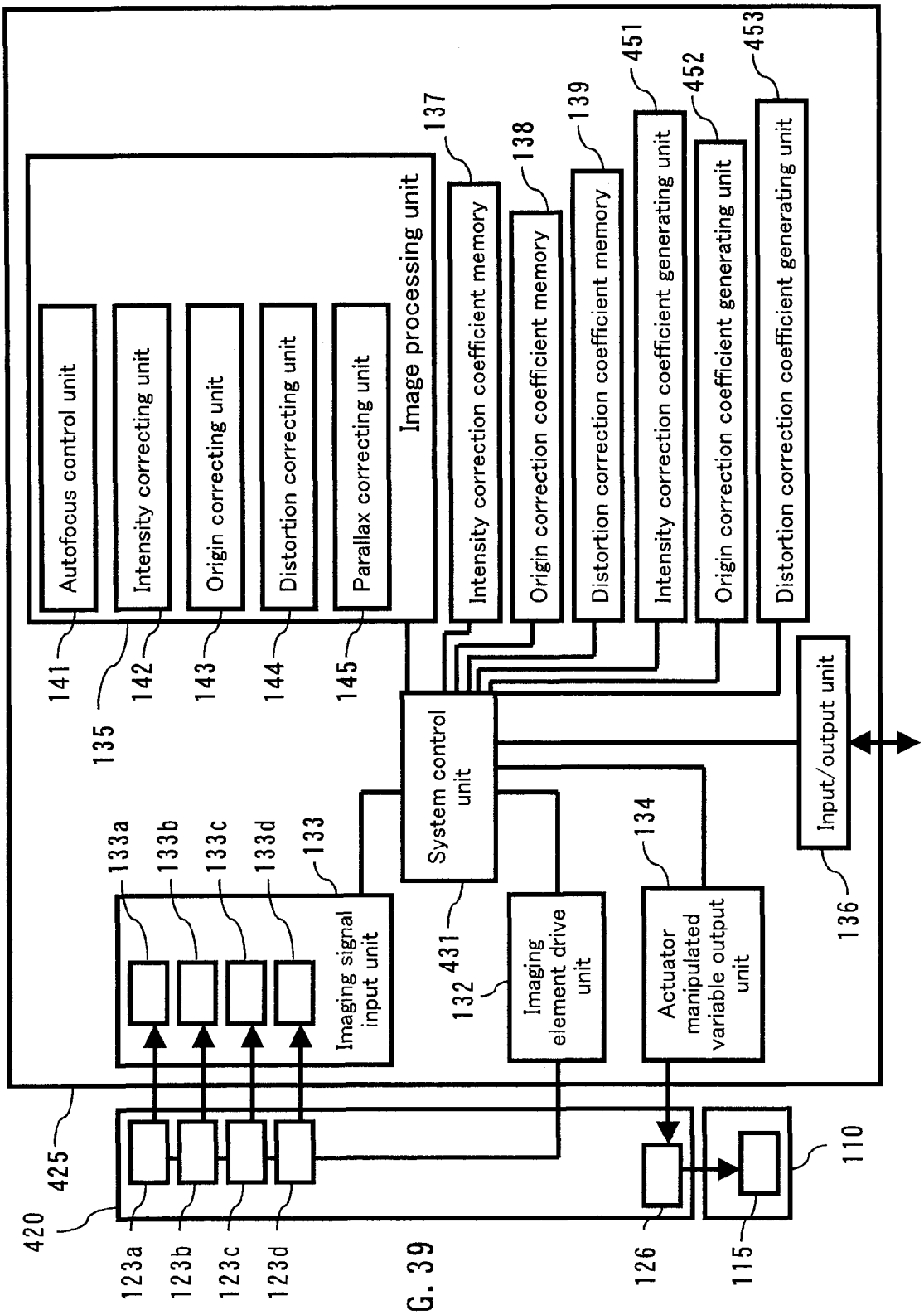
FIG. 39 is a block diagram of the imaging device according to Embodiment 4 of the present invention.

FIG. 39 is a block diagram of the imaging device according to Embodiment 4 of the present invention. The SLSI 425 has a system control unit 431, an imaging element drive unit 132, an imaging signal input unit 133, an actuator manipulated variable output unit 134, an image processing unit 135, an input/output unit 136, an intensity correction coefficient memory 137, an origin correction coefficient memory 138, a distortion correction coefficient memory 139, an intensity correction coefficient generating unit 451, an origin correction coefficient generating unit 452, and a distortion correction coefficient generating unit 453. The circuit unit 420 has an amplifier 126 in addition to the above configuration.

In an inspection process during the manufacturing process after assembly of the imaging device 401, the intensity correction coefficient generating unit 451 generates intensity correction coefficients a1(x, y), a2(x, y), a3(x, y), a4(x, y), and writes the intensity correction coefficients a1(x, y), a2(x, y), a3(x, y), a4(x, y) to the intensity correction coefficient memory 137, as a result of configuring and operating the imaging device 401 as described hereinafter. Also, the origin correction coefficient generating unit 452 generates origin correction coefficients g1x, g1y, g2x, g2y, g3x, g3y, g4x, g4y, and writes the origin correction coefficients g1x, g1y, g2x, g2y, g3x, g3y, g4x, g4y to the origin correction coefficient memory 138. Further, the distortion correction coefficient generating unit 453 generates distortion correction coefficients p1x(x, y), p1y(x, y), p2x(x, y), p2y(x, y), p3x(x, y), p3y(x, y), p4x(x, y), p4y(x, y), and writes the distortion correction coefficients p1x(x, y), p1y(x, y), p2x(x, y), p2y(x, y), p3x(x, y), p3y(x, y), p4x(x, y), p4y(x, y) to the distortion correction coefficient memory 139.

Figure 40:
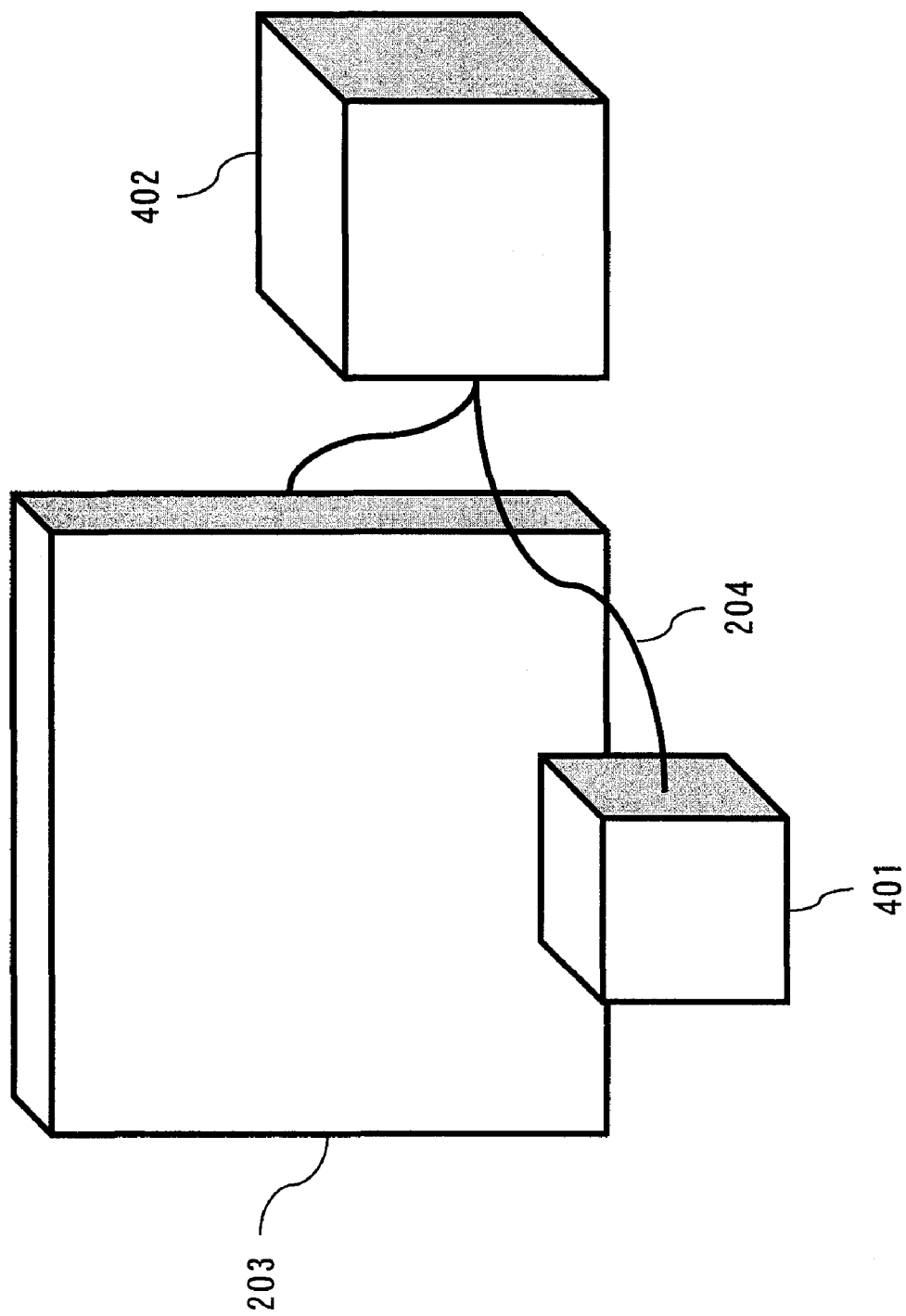
FIG. 40 is an external view of the imaging device and other devices when generating correction coefficients according to Embodiment 4 of the present invention.

FIG. 40 is an external view of the imaging device and other devices when generating correction coefficients according to Embodiment 4 of the present invention. 401 is the imaging device according to Embodiment 4 of the present invention, 402 is a correction coefficient generation controller, 203 is a display, and 204 is a cable for connecting the imaging device. The correction coefficient generation controller 402, which is constituted by a computer, performs coordinated control of the imaging device 401 and the display 203, and causes the imaging device 401 to generate the intensity correction coefficients a1(x, y), a2(x, y), a3(x, y), a4(x, y), the origin correction coefficients g1x, g1y, g2x, g2y, g3x, g3y, g4x, g4y, and the distortion correction coefficients p1x(x, y), p1y(x, y), p2x(x, y), p2y(x, y), p3x(x, y), p3y(x, y), p4x(x, y), p4y(x, y). The display 203, which is constituted by a CRT display or the like, is controlled by the correction coefficient generation controller 402, operates in coordination with the imaging device 401, and draws images (charts) used in generating the intensity correction coefficients a1(x, y), a2(x, y), a3(x, y), a4(x, y), the origin correction coefficients g1$x$, g1$y$, g2$x$, g2$y$, g3$x$, g3$y$, g4$x$, g4$y$, and the distortion correction coefficients p1$x$(x, y), p1$y$(x, y), p2$x$(x, y), p2$y$(x, y), p3$x$(x, y), p3$y$(x, y), p4$x$(x, y), p4$y$(x, y). The imaging device cable 204, which is constituted by a USB cable or the like, connects the imaging device 401 and the correction coefficient generation controller 402, feeds power to the imaging device 401, and is the medium through which communication is performed between the imaging device 401 and the correction coefficient generation controller 402.

Figure 41:
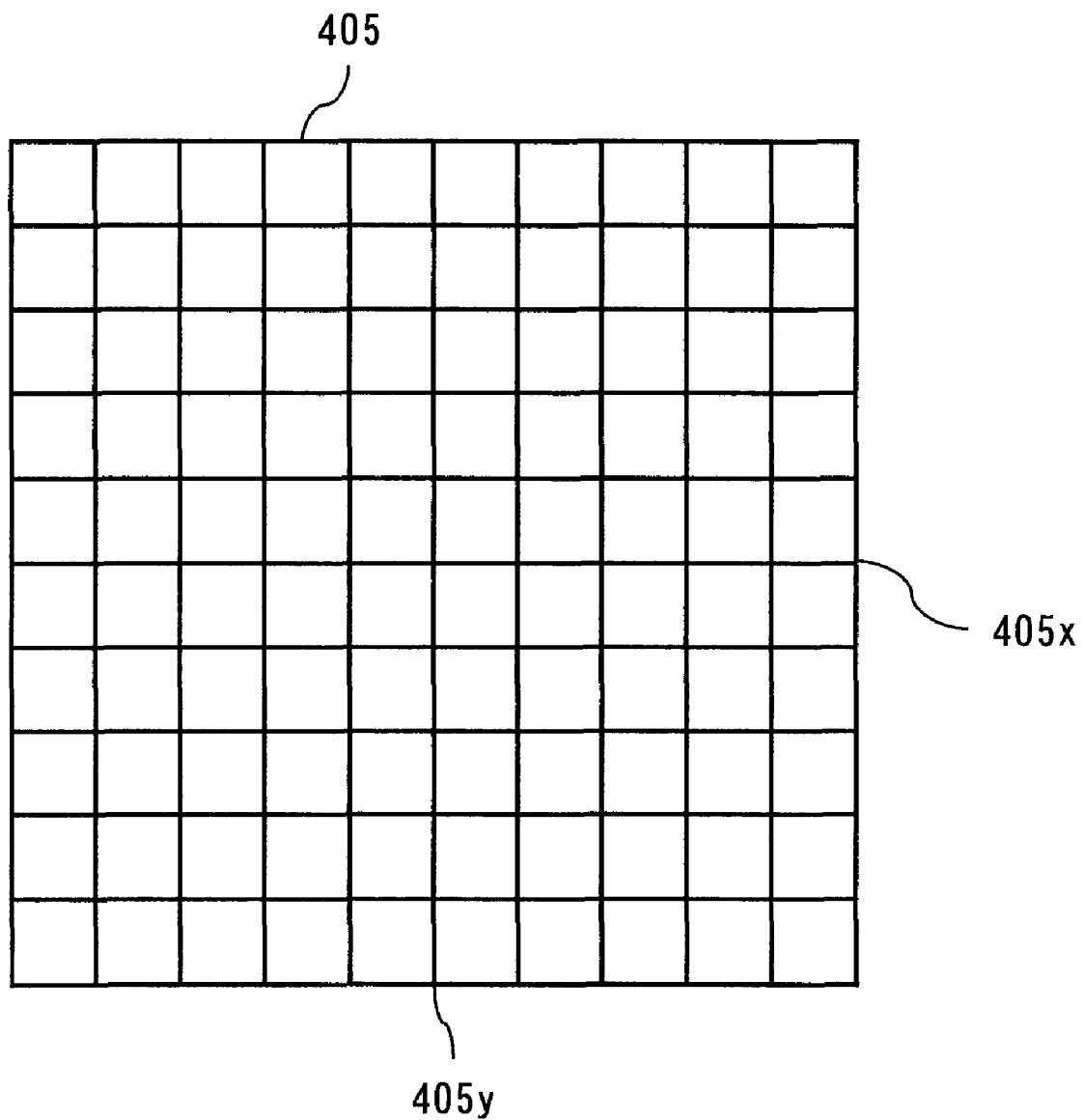
FIG. 41 is an external view of an intensity/origin/distortion correction chart used in generating intensity correction coefficients, origin correction coefficients, and distortion correction coefficients according to Embodiment 4 of the present invention.

The operations of the imaging device according to Embodiment 4 of the present invention will be described next. FIG. 41 is an external view of an intensity/origin/distortion correction chart used in generating intensity correction coefficients, origin correction coefficients and distortion correction coefficients according to Embodiment 4 of the present invention. As shown in FIG. 41, the intensity/origin/distortion correction chart 405 is a uniform white subject with a lattice drawn thereon. The imaging device 401 is disposed so as to directly oppose the intensity/origin/distortion correction chart 405, and the centers of the optical axes of the plurality of lens of the imaging device 401 are disposed so as to coincide with the center of the lattice in the intensity/origin/distortion correction chart. The distortion correction coefficients p1$x$(x, y), p1$y$(x, y), p2$x$(x, y), p2$y$(x, y), p3$x$(x, y), p3$y$(x, y), p4$x$(x, y), p4$y$(x, y) are generated with a similar method to Embodiment 2, using the lattice portion of the imaging signals. The origin correction coefficients g1$x$, g1$y$, g2$x$, g2$y$, g3$x$, g3$y$, g4$x$, g4$y$ are generated by a similar method to Embodiment 2, using the cross portion at the center of the lattice of the imaging signals (cross constituted by 405$x$ & 405$y$ in FIG. 41). The intensity correction coefficients a1(x, y), a2(x, y), a3(x, y), a4(x, y) are generated with a similar method to Embodiment 2 with regard to portions other than the lattice portion of the imaging signals, and are derived by interpolating from portions other than the lattice portion with regard to the lattice portion of the imaging signals.

Figure 42:
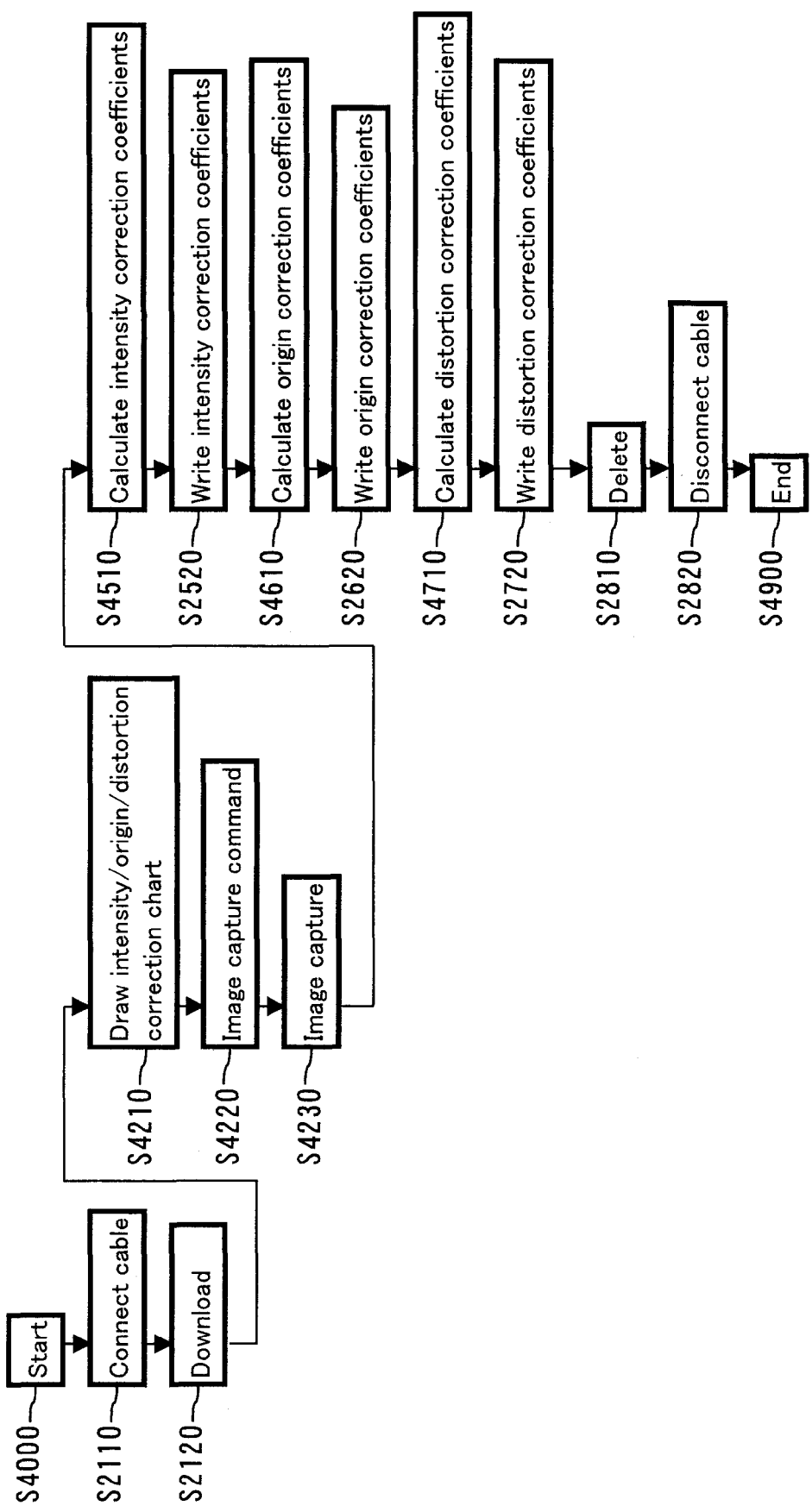
FIG. 42 is a flowchart showing a method of generating intensity correction coefficients, origin correction coefficients, and distortion correction coefficients according to Embodiment 4 of the present invention.

FIG. 42 is a flowchart showing the method of generating intensity correction coefficients, origin correction coefficients, and distortion correction coefficients according to Embodiment 4 of the present invention.

In step S4000, the imaging device 401 is disposed such that the centers of the optical axes of the plurality of lens units of the imaging device 401 coincide with the center of the drawing area on the display, and the generation of intensity correction coefficients, origin correction coefficients, and distortion correction coefficients is started. Step S2110 is executed next.

In step S2110, the imaging device cable 204 is connected to the imaging device 401. Description of this step, which is similar to Embodiment 2, is omitted. Step S2120 is executed next.

In step S2120, a correction coefficient generation program is downloaded to the imaging device 401. Description of this step, which is similar to Embodiment 2, is omitted. Step S4210 is executed next.

In step S4210, the correction coefficient generation controller 402 causes the intensity/origin/distortion correction chart 405, which has a lattice disposed on a background of uniform white light, to be drawn on the display 203. Here, the intensity/origin/distortion correction chart 405 is drawn such that the center of drawing area of the display 203, that is, the center of each optical axis of the plurality of lens units of the imaging device 401 coincides with the center of the lattice (intersection of 405$x$ & 405$y$ in FIG. 41). Step S4220 is executed next.

In step S4220, the correction coefficient generation controller 402 transmits a command to start image capture to the imaging device 401 via the imaging device cable 204. Step S4230 is executed next.

In step S4230, the imaging device 401 captures an image of the intensity/origin/distortion correction chart 405. The imaging device 401 executes this step in response to the command in step S4220. Description of this operation, which is similar to step S1200, is omitted. The imaging signals are saved to the memory of the system control unit 431 as a first imaging signal I1(0, x, y), a second imaging signal I2(0, x, y), a third imaging signal I3(0, x, y), and a fourth imaging signal I4(0, x, y) for use in intensity, origin and distortion correction. Note that an area for saving moving images or the like in normal usage of the imaging device 401 is used as this memory. Step S4510 is executed next.

In step S4510, the intensity correction coefficient generating unit 451 generates the intensity correction coefficients a1(x, y), a2(x, y), a3(x, y) and a4(x, y). The intensity correction coefficient generating unit 451 sets the reciprocal of the first imaging signal I1(0, x, y) for use in intensity, origin and distortion correction as the first intensity correction coefficient a1(x, y) in relation to pixels in portions other than where the cross is drawn, as in the following equation (114). Similarly, the intensity correction coefficient generating unit 451 sets the reciprocal of the second imaging signal I2(0p, x, y) for use in intensity, origin and distortion correction as the second intensity correction coefficient a2(x, y) as in the following equation (115), sets the reciprocal of the third imaging signal I3(i, x, y) for use in intensity, origin and distortion correction as the third intensity correction coefficient a3(x, y) as in the following equation (116), and sets the reciprocal of the fourth imaging signal I4(i, x, y) for use in intensity, origin and distortion correction as the fourth intensity correction coefficient a4(x, y), as in the following equation (117). Next, the intensity correction coefficient generating unit 451 uses the intensity correction coefficients of nearest neighboring pixels where the lattice is not drawn for pixels in portions of the intensity/origin/distortion correction chart 405 where the lattice is drawn. That is, the intensity correction coefficient generating unit 451, in relation to portions where the lattice is drawn, sets the first intensity correction coefficient a1(x, y) of the pixel (x, y) to the first intensity correction coefficient a1(xn1(x, y), yn1(x, y)) of the nearest neighboring pixel (xn1 (x, y), yn1(x, y)) where the lattice is not drawn, as in the following equation (118). Similarly, the intensity correction coefficient generating unit 451 sets the second intensity correction coefficient a2(x, y) of the pixel (x, y) to the second intensity correction coefficient a2(xn2(x, y), yn2(x, y)) of the nearest neighboring pixel (xn2(x, y), yn2(x, y)) where the lattice is not drawn, as in the following equation (119). The intensity correction coefficient generating unit 451 also sets the third intensity correction coefficient a3(x, y) of the pixel (x, y) to the third intensity correction coefficient a3(xn3(x, y), yn3(x, y)) of the nearest neighboring pixel (xn3(x, y), yn3(x, y)) where the lattice is not drawn, as in the following equation (120), and sets the fourth intensity correction coefficient a4(x, y) of the pixel (x, y) to the fourth intensity correction coefficient a4(xn4(x, y), yn4(x, y)) of the nearest neighboring pixel (xn4(x, y), yn4(x, y)) where the lattice is not drawn, as in the following equation (121). Note that image capture may be performed a plurality of times in step S4230, and an image obtained by averaging these images may be used. In this case, the effect of random noise and the like can be reduced by averaging. Also, approximation may be used, by using the average of the coefficients of the two nearest vertical neighboring pixels, using the average of the coefficients of the two nearest lateral neighboring pixels, using the average of the coefficients of the four nearest vertical and lateral neighboring pixels, or predicting the coefficients by extrapolation Step S2520 is executed next.

$$a1(x,y)=1/I1(0,x,y) \quad (114)$$

$$a2(x,y)=1/I2(0,x,y) \quad (115)$$

$$a3(x,y)=1/I3(0,x,y) \quad (116)$$

$$a4(x,y)=1/I4(0,x,y) \quad (117)$$

$$a1(x,y)=a1(xn1(x,y),yn1(x,y)) \quad (118)$$

$$a2(x,y)=a2(xn2(x,y),yn2(x,y)) \quad (119)$$

$$a3(x,y)=a3(xn3(x,y),yn3(x,y)) \quad (120)$$

$$a4(x,y)=a4(xn4(x,y),yn4(x,y)) \quad (121)$$

In step S2520, the intensity correction coefficient generating unit 451 writes the intensity correction coefficients a1(x, y), a2(x, y), a3(x, y) and a4(x, y) to the intensity correction coefficient memory 137. These intensity correction coefficients a1(x, y), a2(x, y), a3(x, y) and a4(x, y) are used in the intensity correction of S1300. This step is similar to Embodiment 2. Step S4610 is executed next.

In step S4610, the origin correction coefficient generating unit 452 generates the origin correction coefficients g1x, g1y, g2x, g2y, g3x, g3y, g4x, g4y. Description of this step, which is performed with a similar method to Embodiment 2, is omitted. However, the origin correction coefficient generating unit 452 uses the first imaging signal I1(0, x, y) for use in intensity, origin and distortion correction coefficient generation, the second imaging signal I2(0, x, y) for use in intensity, origin and distortion correction coefficient generation, the third imaging signal I3(0, x, y) for use in intensity, origin and distortion correction coefficient generation, and the fourth imaging signal I4(0, x, y) for use in intensity, origin and distortion correction coefficient generation as the imaging signals. Also, the origin correction coefficient generating unit 452 uses 405x and 405y in FIG. 41 as the cross. Step S2620 is executed next.

In step S2620, the origin correction coefficient generating unit 452 writes the origin correction coefficients g1x, g1y, g2x, g2y, g3x, g3y, g4x, g4y to the origin correction coefficient memory 138. These origin correction coefficients g1x, g1y, g2x, g2y, g3x, g3y, g4x, g4y are used in the origin correction of step S1400. This step is similar to Embodiment 2. Step S4710 is executed next.

In step S4710, the distortion correction coefficient generating unit 453 generates the distortion correction coefficients p1x(x, y), p1y(x, y), p2x(x, y), p2y(x, y), p3x(x, y), p3y(x, y), p4x(x, y), p4y(x, y). Description of this step, which is similar to Embodiment 2, is omitted. The distortion correction coefficient generating unit 453, however, uses the first imaging signal I1(0, x, y) for use in intensity, origin and distortion correction coefficient generation, the second imaging signal I2(0, x, y) for use in intensity, origin and distortion correction coefficient generation, the third imaging signal I3(0, x, y) for use in intensity, origin and distortion correction coefficient generation, and the fourth imaging signal I4(0, x, y) for use in intensity, origin and distortion correction coefficient generation as the imaging signals. Step S2720 is executed next.

In step S2720, the distortion correction coefficient generating unit 453 writes the distortion correction coefficients p1x(x, y), p1y(x, y), p2x(x, y), p2y(x, y), p3x(x, y), p3y(x, y), p4x(x, y), p4y(x, y) to the distortion correction coefficient memory 139. These distortion correction coefficients p1x(x, y), p1y(x, y), p2x(x, y), p2y(x, y), p3x(x, y), p3y(x, y), p4x(x, y), p4y(x, y) are used in the distortion correction of step S1500. This step is similar to Embodiment 2. Step S2810 is executed next.

In step S2810, the system control unit 431 deletes the correction coefficient generation program. Description of this step, which is similar to Embodiment 2, is omitted. Step S2820 is executed next.

In step S2820, the imaging device cable 204 is disconnected from the imaging device 401. Description of this step, which is similar to Embodiment 2, is omitted. Step S4900 is executed next.

In step S4900, the generation of intensity correction coefficients, origin correction coefficients, and distortion correction coefficients is ended.

As a result of being configured and operated as described above, the imaging device of Embodiment 4 obtains similar effects to Embodiment 2.

Further, the imaging device 401 of Embodiment 4 is able to suppress the number of times that image capture is performed in the manufacturing process and shorten the tact time of the manufacturing process, since the intensity correction coefficients a1(x, y), a2(x, y), a3(x, y), a4(x, y), the origin correction coefficients g1x, g1y, g2x, g2y, g3x, g3y, g4x, g4y, and the distortion correction coefficients p1x(x, y), p1y(x, y), p2x(x, y), p2y(x, y), p3x(x, y), p3y(x, y), p4x(x, y), p4y(x, y) are generated using the same imaging signal obtained by capturing an image of a single intensity/origin/distortion correction chart 405.

Note that although the above description illustrates the configuration and operations of a device that performs various corrections on imaging signals obtained through image capture and corrects parallax before synthesizing images from the imaging signals, the imaging device of the present invention can also be applied as a measuring device for detecting distance to the subject. That is, the imaging device of the present invention can also be implemented as a device that calculates distance based on parallax obtained as aforementioned, and outputs the obtained distance, with practical application as a surveying device, inter-vehicular distance detecting device or the like being conceivable. That is, equation (1), when solved for distance A, is as shown in equation (46). Accordingly, the distance to the subject from the block $B_i$ is as calculated in equation (47), and the distance to the subject from a pixel (x, y) included in the block $B_i$ is as shown in equation (48), and saved in the memory of the system control unit 431. Note that the units of measurement are changed appropriately when the calculations are performed. If the distance information A(x, y) is then output externally via the input/output unit 136, an imaging device that functions as a measuring device for detecting distance can be realized.

Embodiment 5

The imaging device of Embodiment 1 has four lens units, each of which detects a single color. The imaging device of Embodiment 5 has two lens units, each of which detects all of the colors. Also, the imaging device of Embodiment 5 outputs not only image information but also distance information calculated from parallax.

The imaging device according to Embodiment 5 of the present invention will be described with reference to the drawings.

Figure 43:
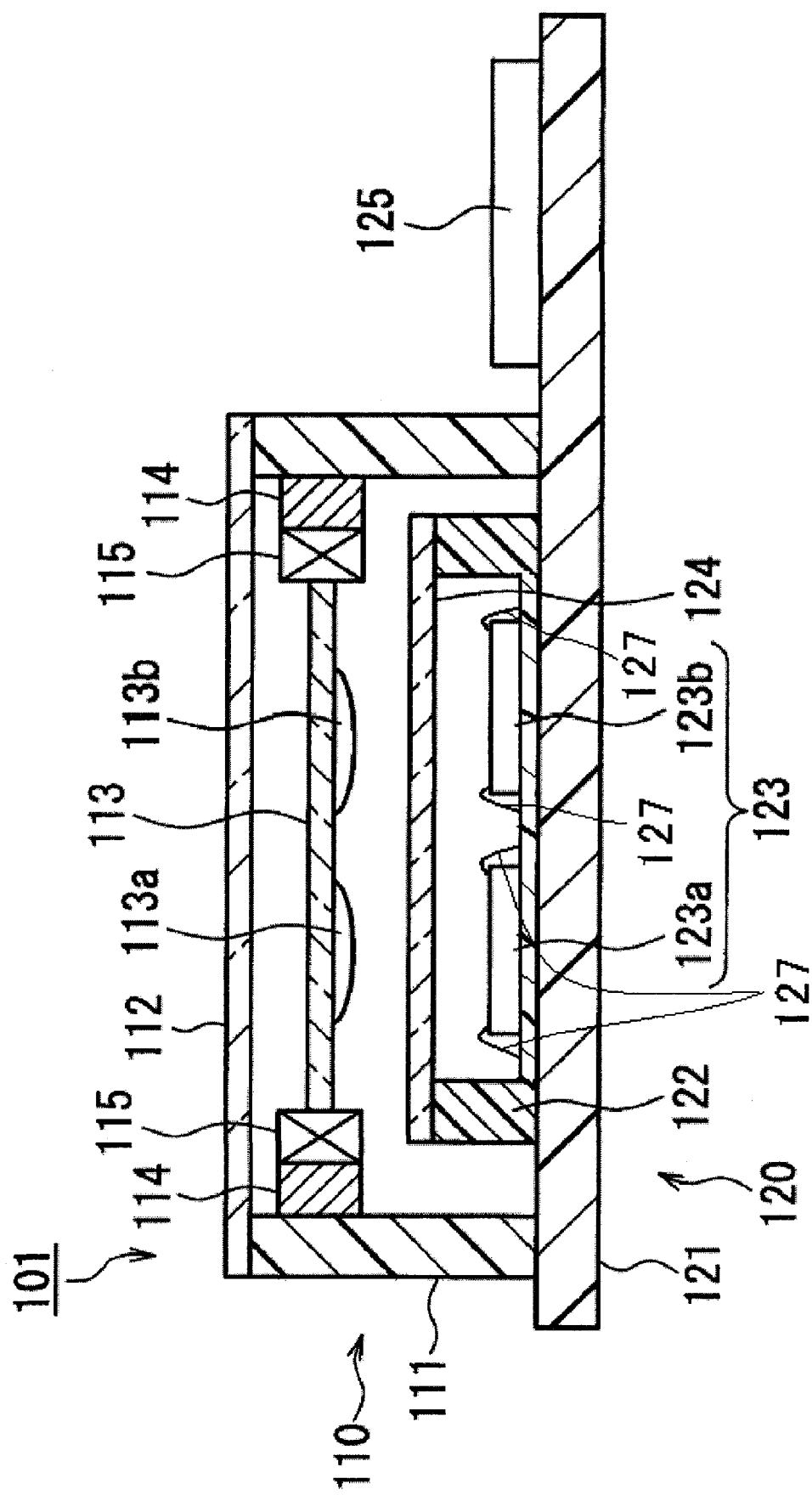
FIG. 43 is a cross-sectional view showing the configuration of an imaging device according to Embodiment 5 of the present invention.

FIG. 43 is a cross-sectional view showing the configuration of an imaging device 501 according to Embodiment 5 of the present invention. In FIG. 43, the imaging device 501 has a lens module unit 510 and a circuit unit 520.

The lens module unit 510 has a lens barrel 511, an upper cover glass 512, a lens 513, a fixed actuator portion 514, and a movable actuator portion 515. The circuit unit 520 has a substrate 521, a package 522, an imaging element 523, a package cover glass 524, and a system LSI (hereinafter, SLSI) 525.

The lens barrel 511 is cylindrical and formed by injection-molding resin, and the inner surface thereof is lusterless black in order to prevent diffused reflection of light. The upper cover glass 512 is discoid, formed from transparent resin, and anchored to the top surface of the lens barrel 511 using adhesive or the like, and the surface thereof is provided with a protective film for preventing damage caused by abrasion or the like and an antireflective film for preventing reflection of incident light.

Figure 44:
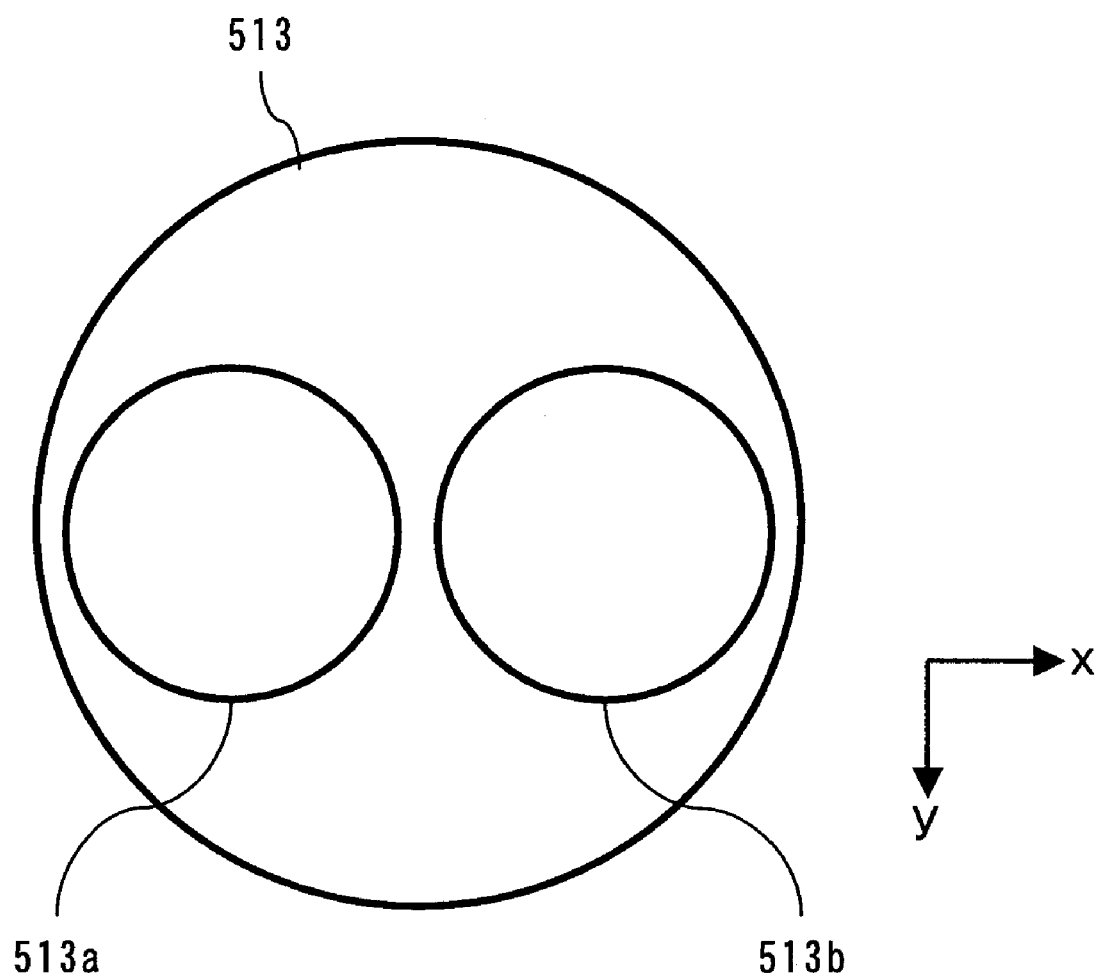
FIG. 44 is a top view of the lens of the imaging device according to Embodiment 5 of the present invention.

FIG. 44 is a top view of the lens 513 of the imaging device according to Embodiment 5 of the present invention. The lens 513 is substantially discoid and formed from glass or transparent resin, and has a first lens unit 513a and a second lens unit 513b disposed therein. The X-axis and the Y-axis are set as shown in FIG. 44, along the directions in which the first and second lens units 513a and 513b are disposed. Light incident on the first lens unit 513a and the second lens unit 513b from an upper curved portion is emitted from a bottom curved portion, and two images are formed on the imaging element 523.

The fixed actuator portion 514 is anchored to the inner surface of the lens barrel 511 by adhesive or the like. The movable actuator portion 515 is anchored to the outer periphery of the lens 513 by adhesive or the like. Description of the fixed actuator portion 514 and the movable actuator portion 515, whose detailed configuration is similar to the fixed actuator portion 114 and the movable actuator portion 115 of Embodiment 1, is omitted.

The substrate 521 is constituted by a resin substrate, and is anchored by adhesive or the like, with the bottom surface of the lens barrel 511 contacting the top thereof. The circuit unit 520 is thus anchored to the lens module unit 510 to constitute the imaging device 501.

The package 522 is formed from resin having a metal terminal, and is anchored inside the lens barrel 511 by soldering or the like the metal terminal unit to the top surface of the substrate 521. The imaging element 523 is constituted by a first imaging element 523a and a second imaging element 523b. The first imaging element 523a and the second imaging element 523b are solid state imaging elements such as CCD sensors or CMOS sensors, and are disposed such that the centers of the light receiving surfaces thereof are substantially aligned with the centers of the optical axes of the first lens unit 513a and the second lens unit 513b, and such that the light receiving surfaces of the imaging elements are substantially perpendicular to the optical axes of the corresponding lens units. The terminals of the first imaging element 523a and the second imaging element 523b are connected with gold wires 527 by wire bonding to the metal terminal on a bottom portion of the package 522 on the inside thereof, and electrically connected to the SLSI 525 via the substrate 521. Light emitted from the first lens unit 513a and the second lens unit 513b forms images on the light receiving surfaces of the first imaging element 523a and the second imaging element 523b, and electrical information converted from optical information by a photodiode is output to the SLSI 525.

Figure 45:
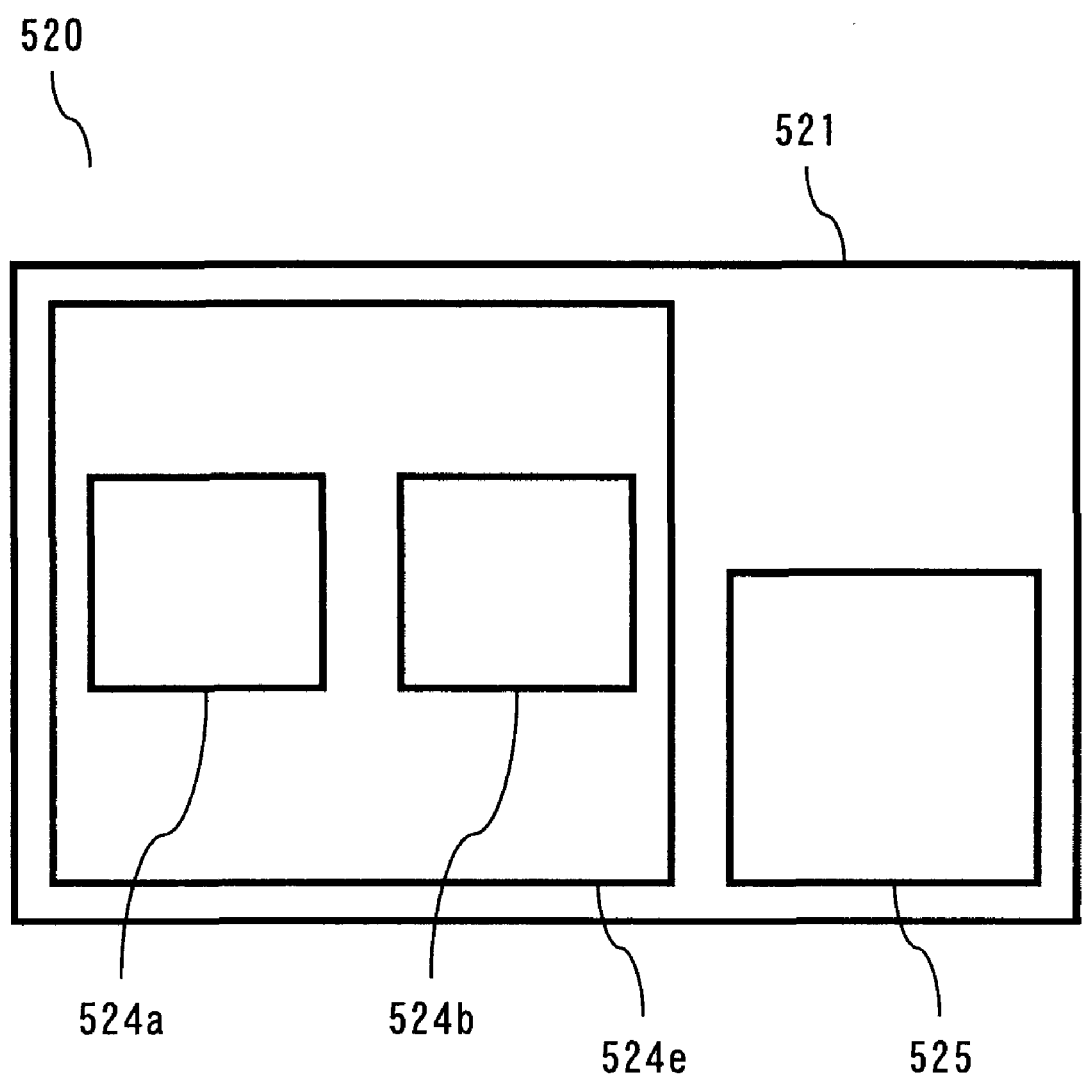
FIG. 45 is a top view of the circuit unit of the imaging device according to Embodiment 5 of the present invention.

FIG. 45 is a top view of the circuit unit 520 of the imaging device according to Embodiment 5 of the present invention. The package cover glass 524 is flat, formed using transparent resin, and anchored to the top surface of the package 522 by adhesive or the like. A shading portion 524e is provided on the top surface of the package cover glass 524 by vapor deposition or the like.

Consequently, object light incident from a top portion of the first lens unit 513a is emitted from a bottom portion of the first lens unit 513a, passes through a cover glass 524a, and forms an image on the light receiving portion of the first imaging element 523a. Object light incident from a top portion of the second lens unit 513b is emitted from a bottom portion of the second lens unit 513b, passes through a cover glass 524b, and forms an image on the light receiving portion of the second imaging element 523b.

The SLSI 525 controls the energizing of the coil of the movable actuator portion 515, drives the imaging element 523, receives as input electrical information from the imaging element 523, performs various image processing, communicates with a host CPU, and outputs images externally as described later.

The relationship between subject distance and parallax will be described next. Since the camera module according to Embodiment 5 of the present invention has two lens units (first lens unit 513a, second lens unit 513b), the relative position of the two object images respectively formed by the two lens units changes according to subject distance, as described in Embodiment 1 (see equation (1)).

Figure 46:
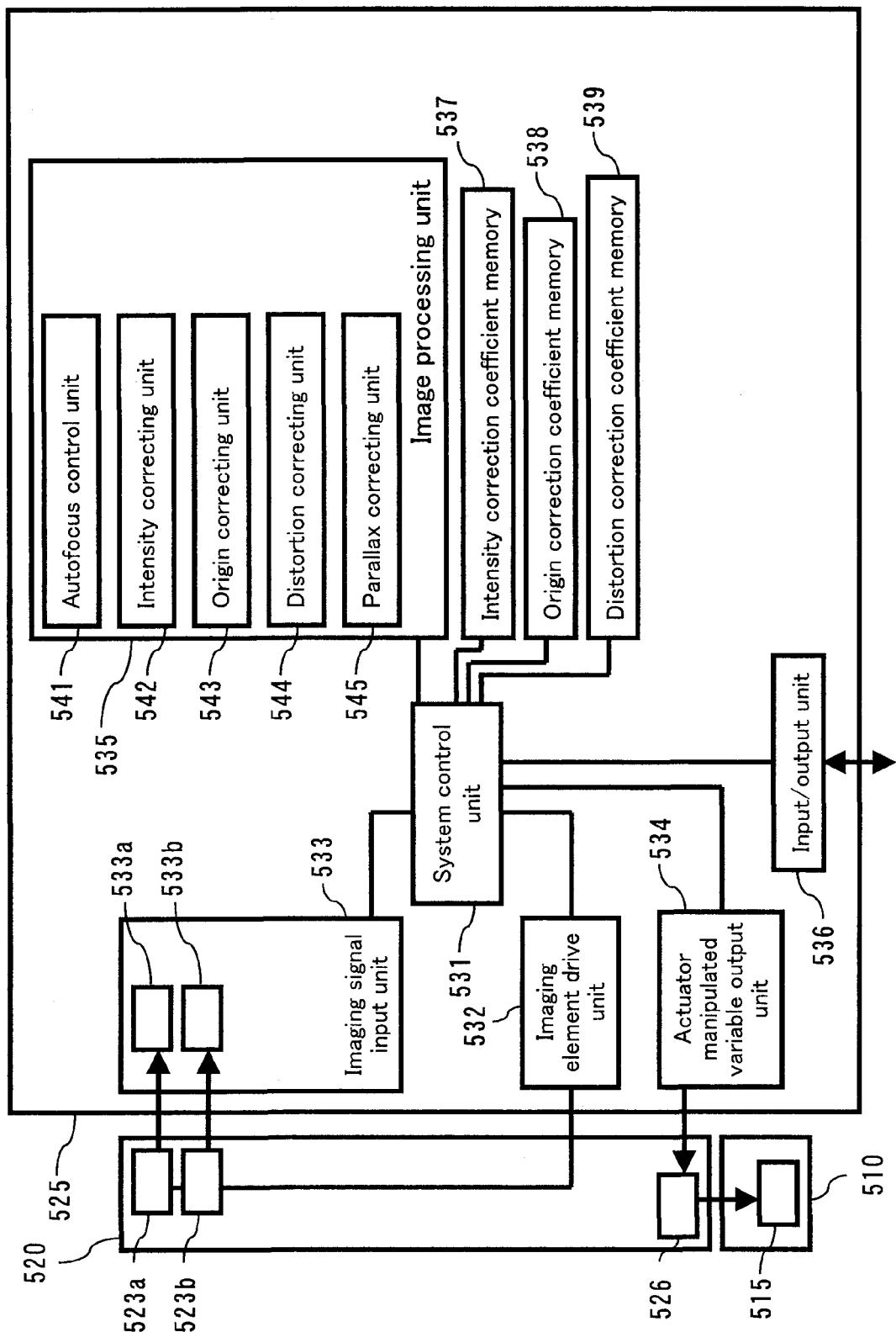
FIG. 46 is a block diagram of the imaging device according to Embodiment 5 of the present invention.

The operations of the imaging device according to Embodiment 5 of the present invention will be described next. FIG. 46 is a block diagram of the imaging device according to Embodiment 5 of the present invention. The SLSI 525 has a system control unit 531, an imaging element drive unit 532, an imaging signal input unit 533, an actuator manipulated variable output unit 534, an image processing unit 535, an input/output unit 536, an intensity correction coefficient memory 537, an origin correction coefficient memory 538, and a distortion correction coefficient memory 539. The circuit unit 520 has an amplifier 526 in addition to the above configuration. The amplifier 526 applies a voltage that depends on the output from the actuator manipulated variable output unit 534 to the coil of the movable actuator portion 515.

The system control unit 531, which is constituted by a CPU, a memory and the like, controls the overall SLSI 525.

The imaging element drive unit 532, which is constituted by a logic circuit and the like, generates a signal for driving the imaging element 523, and applies a voltage that depends on this signal to the imaging element 523.

The imaging signal input unit 533 is constituted by a first imaging signal input unit 533a and a second imaging signal input unit 533b. The first imaging signal input unit 533a and the second imaging signal input unit 533b are each configured with a CDS circuit, an AGC and an ADC connected in series. The first imaging signal input unit 533a and the second imaging signal input unit 533b are respectively connected to the first imaging element 523a and the second imaging element 523b, and receive as input electrical signals from the imaging elements, remove static noise using the CDS circuit, adjust gains using the AGC, convert the analog signals to digital values using the ADC, and write the digital values to the memory of the system control unit 531.

The actuator manipulated variable output unit 534, which is constituted by a DAC, outputs a voltage signal that depends on the voltage to be applied to the coil of the movable actuator portion 515.

The image processing unit 535, which is configured to include a logic circuit or a DSP, or both, performs various image processing, using information saved in the memory of the system control unit 531. The image processing unit 535 has an autofocus control unit 541, an intensity correcting unit 542, an origin correcting unit 543, a distortion correcting unit 544, and a distance calculating unit 545.

The input/output unit 536 communicates with the host CPU (not shown), and outputs image signals to the host CPU, an external memory (not shown) and an external display device such as an LCD (not shown).

The intensity correction coefficient memory 537, which is constituted by a nonvolatile memory such as a flash memory or a FeRAM, saves intensity correction coefficients for use by the intensity correcting unit 542. The origin correction coefficient memory 538, which is constituted by a nonvolatile memory such as a flash memory or a FeRAM, saves origin correction coefficients for use by the origin correcting unit 543. The distortion correction coefficient memory 539, which is constituted by a nonvolatile memory such as a flash memory or a FeRAM, saves distortion correction coefficients for use by the distortion correcting unit 544.

Figure 47:
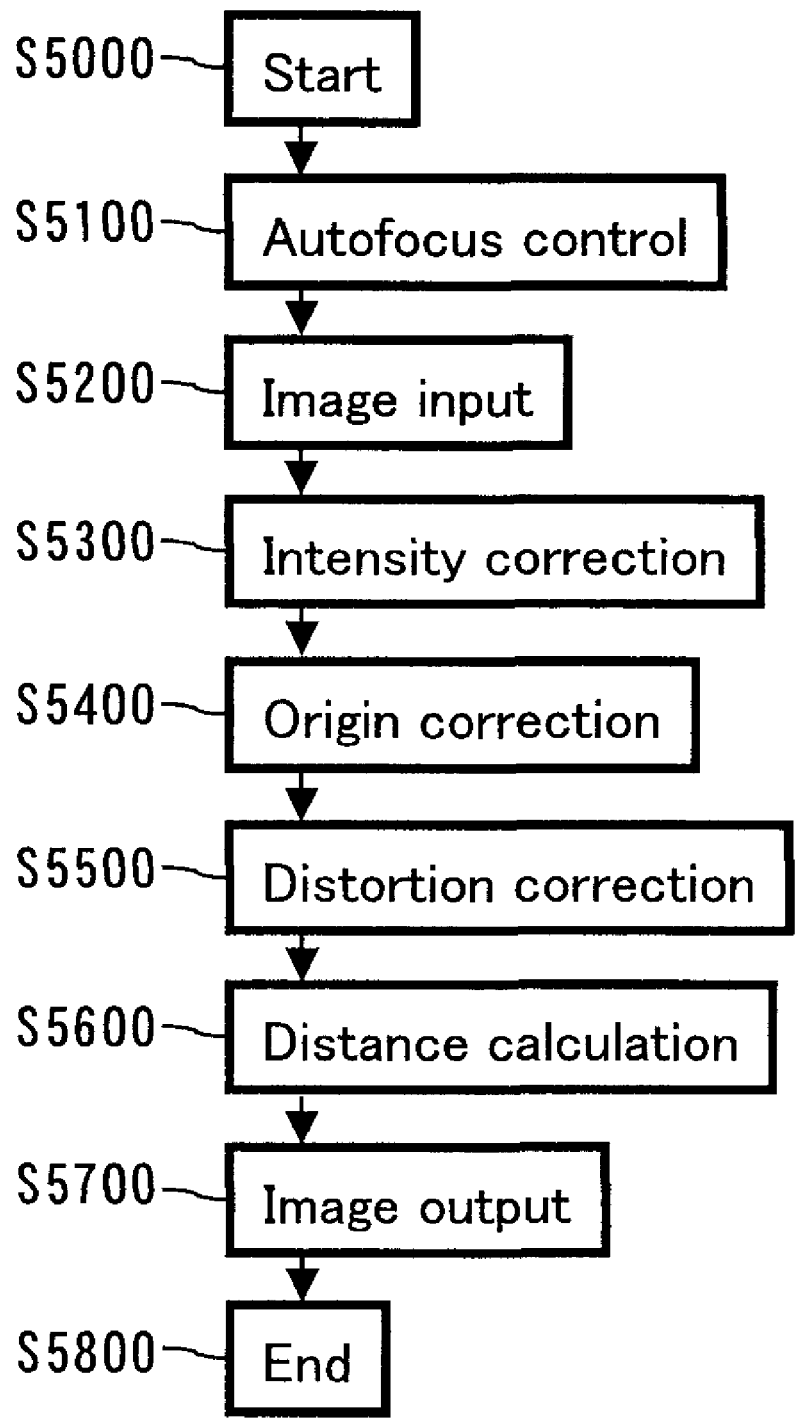
FIG. 47 is a flowchart showing the operations of the imaging device according to Embodiment 5 of the present invention.

FIG. 47 is a flowchart showing the operations of the imaging device according to Embodiment 5 of the present invention. The imaging device 501 is operated by the system control unit 531 of the SLSI 525 as per this flowchart.

In step S5000, operations are started. For example, the imaging device 501 starts operations as the result of the host CPU (not shown) detecting that a shutter button (not shown) has been pressed, and instructing the imaging device 501 to start operations via the input/output unit 536. Step S5100 is executed next.

In step S5100, the autofocus control unit 541 executes autofocus controls. Description of this step, which is similar to Embodiment 1, is omitted. Step S5200 is executed next.

In step S5200, an image is input. The imaging element drive unit 532 outputs signals for operating an electronic shutter and performing transfer as needed, as a result of instructions from the system control unit 531. The first imaging signal input unit 533a and the second imaging signal input unit 533b, in sync with signals generated by the imaging element drive unit 532, respectively receive as input imaging signals, which are analog signals of images output by the first imaging element 523a and the second imaging element 523b, remove static noise using the CDS, automatically adjust input gains using the AGC, convert the analog signals to digital values using the ADC, and write the digital values to the memory of prescribed addresses in the system control unit 531 as a first imaging signal I1(x, y) and a second imaging signal I2(x, y). As shown in FIG. 13, I1(x, y) indicates the first imaging signal of the x-th horizontal and y-th vertical pixel. The total number of pixels is H×L, where H is the number of pixels in the height direction and L is the number of pixels in the length direction of the input image, with x changing from 0 to L−1, and y changing from 0 to H−1. The second imaging signal I2(x, y) similarly indicates the second imaging signal of the x-th horizontal and y-th vertical pixel. The total number of pixels is H×L, where H is the number of pixels in the height direction and L is the number of pixels in the length direction of the input image, with x changing from 0 to L−1, and y changing from 0 to H−1. Step S5300 is executed next.

In step S5300, the intensity correcting unit 542 corrects the first imaging signal I1 and the second imaging signal I2 using intensity correction coefficients saved in the intensity correction coefficient memory 537. The results are then written to the memory of the system control unit 531. Description of this step, which is similar to step S1300 in Embodiment 1, is omitted. Slight changes are, however, necessary, such as not using the third imaging signal I3 and the fourth imaging signal I4, or the third intensity correction coefficient a3(x, y) and the fourth intensity correction coefficient a4(x, y), which are used in Embodiment 1. Step S5400 is executed next.

In step S5400, the origin correcting unit 543 corrects the first imaging signal I1 and the second imaging signal I2 using origin correction coefficients saved in the origin correction coefficient memory 538. The results are then written to the memory of the system control unit 531. Description of this step, which is similar to step S1400 in Embodiment 1, is omitted. Slight changes are, however, necessary, such as not using the third imaging signal I3 and the fourth imaging signal I4, or the third origin correction coefficient g3x, g3y, and the fourth origin correction coefficient g4x, g4y, which are used in Embodiment 1. Step S5500 is executed next.

In step S5500, the distortion correcting unit 544 corrects the first imaging signal I1 and the second imaging signal I2 using distortion correction coefficients saved in the distortion correction coefficient memory 539. The results are then written to the memory of the system control unit 531. Description of this step, which is similar to step S1500 in Embodiment 1, is omitted. Slight changes are, however, necessary, such as not using the third imaging signal I3 and the fourth imaging signal I4, or the third distortion correction coefficient p3x(x, y), p3y(x, y), and the fourth distortion correction coefficient p4x(x, y), p4y(x, y), which are used in Embodiment 1. Step S5600 is executed next.

Figure 48:
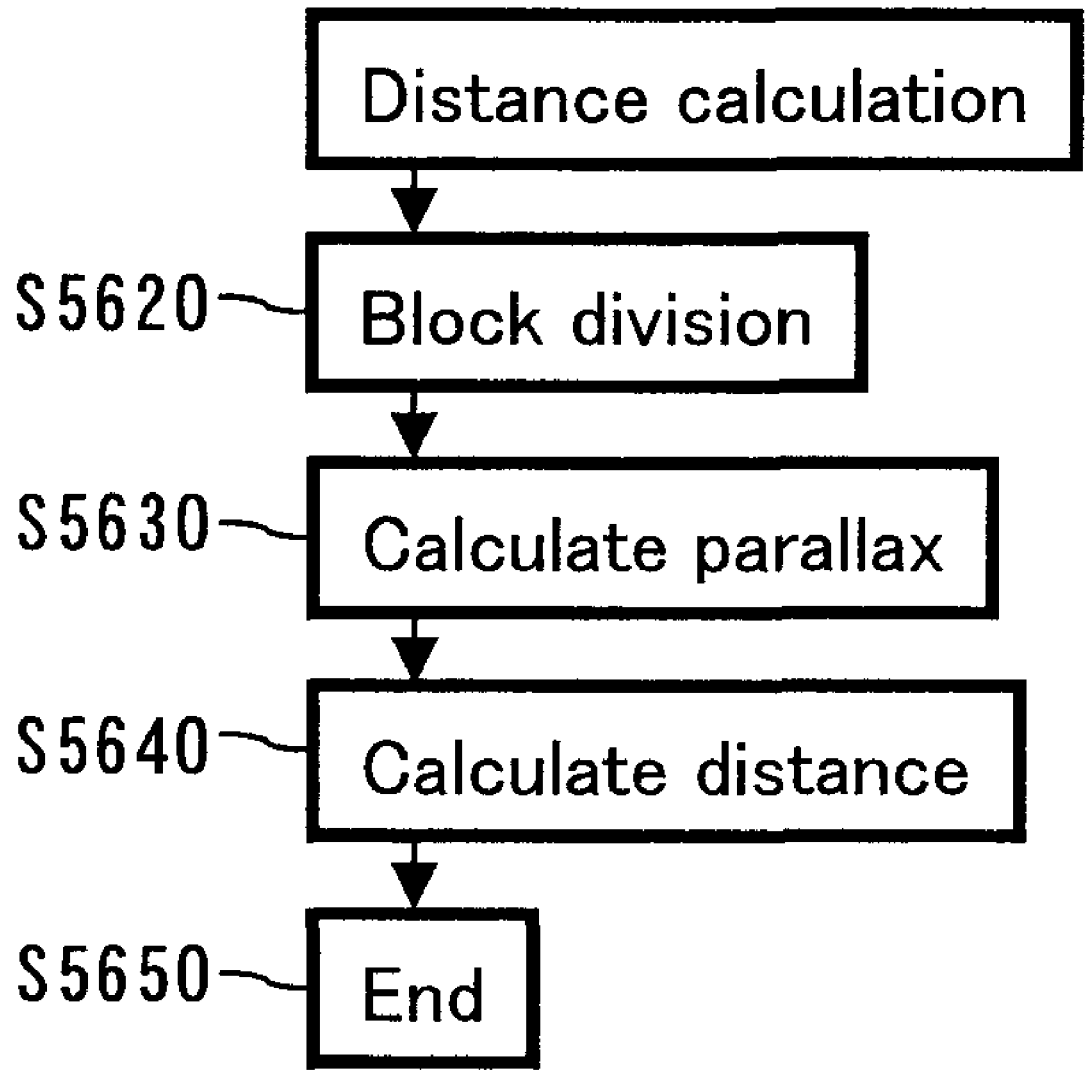
FIG. 48 is a flowchart showing a distance calculation operation according to Embodiment 5 of the present invention.

In step S5600, the distance calculating unit 545 executes distance calculation. FIG. 48 is a flowchart showing the distance calculation operation according to Embodiment 5 of the present invention. The flowchart of FIG. 48 shows the operations of step S5600 in detail.

Firstly, in step S5620, the distance calculating unit 545 performs block dividing. Description of this step, which is similar to step S1620 in Embodiment 1, is omitted. Step S5630 is executed next.

Figure 49:
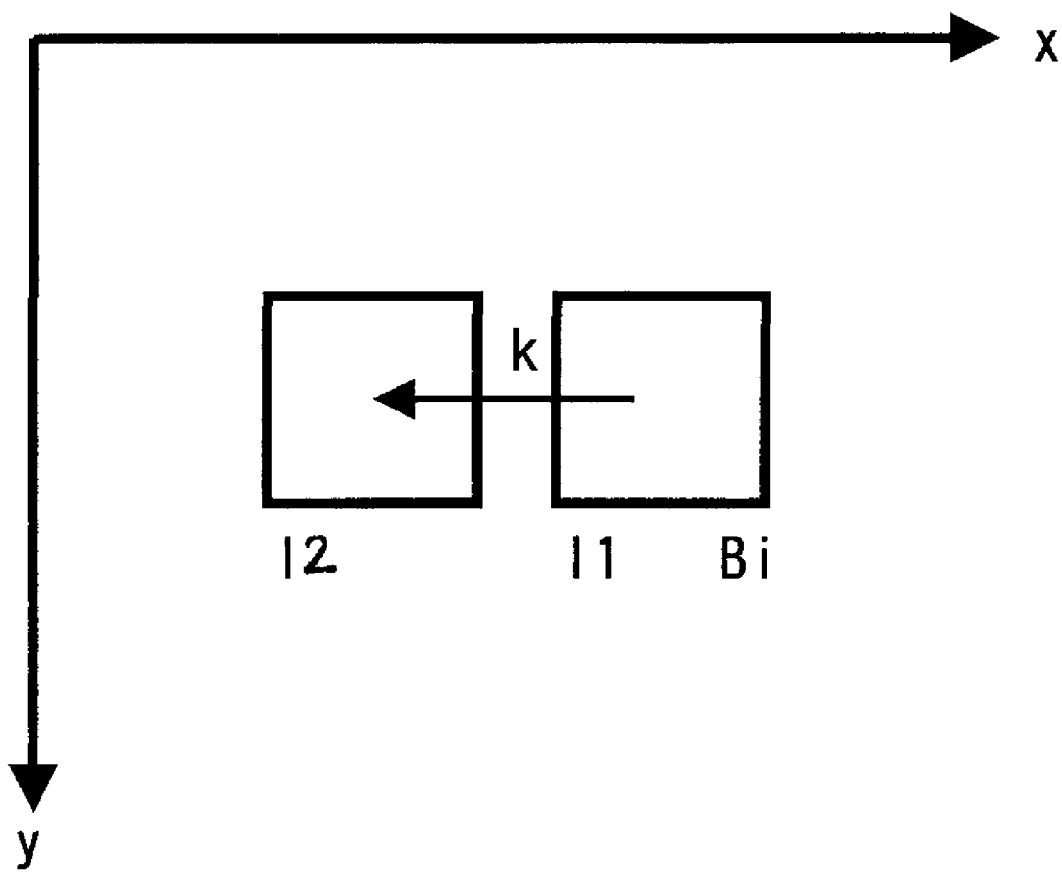
FIG. 49 illustrates a calculation area for calculating parallax evaluation values in the imaging device according to Embodiment 5 of the present invention.
Figure 50:
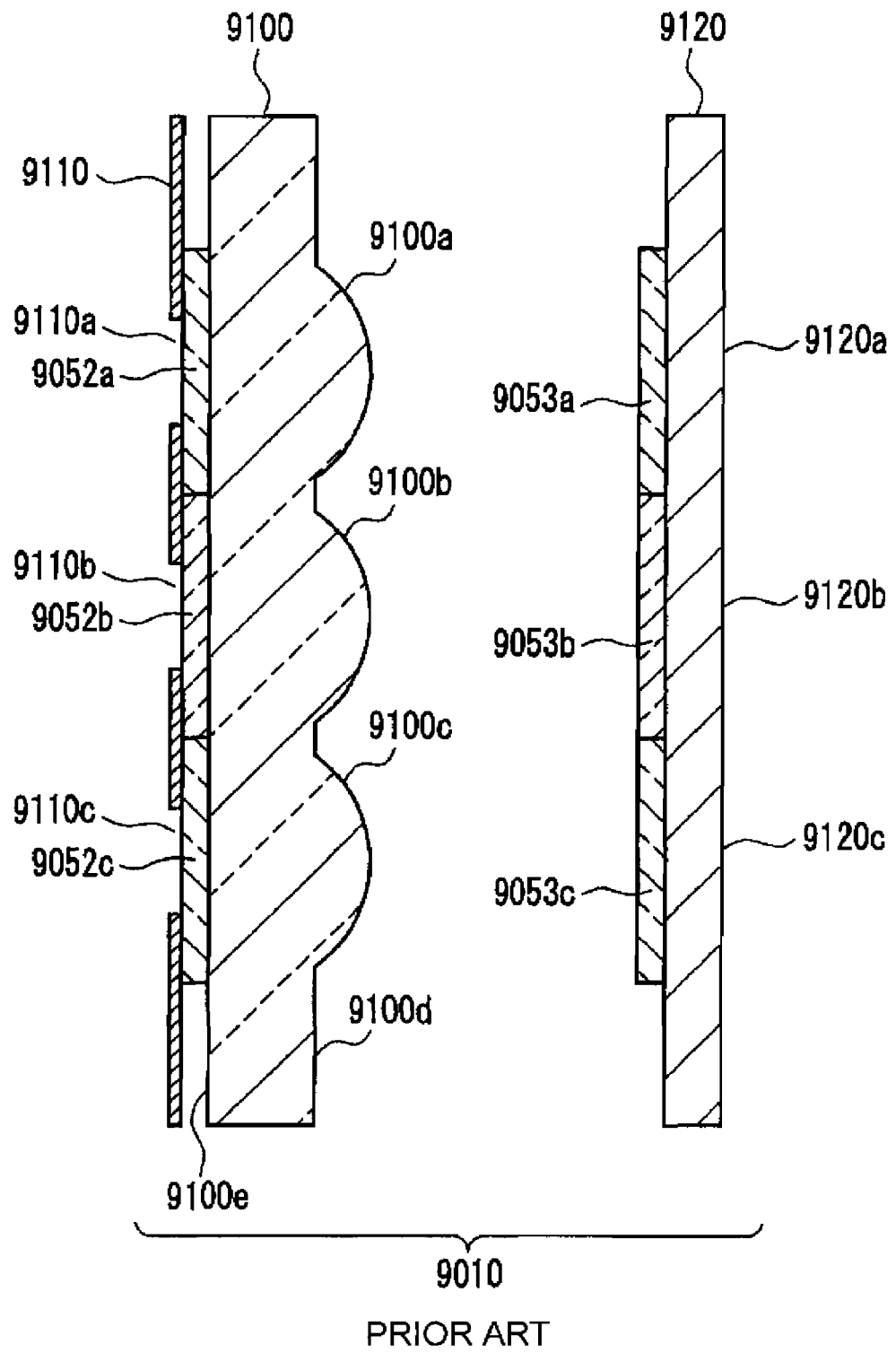
FIG. 50 is a cross-sectional view showing the configuration of a conventional imaging device.
Figure 51:
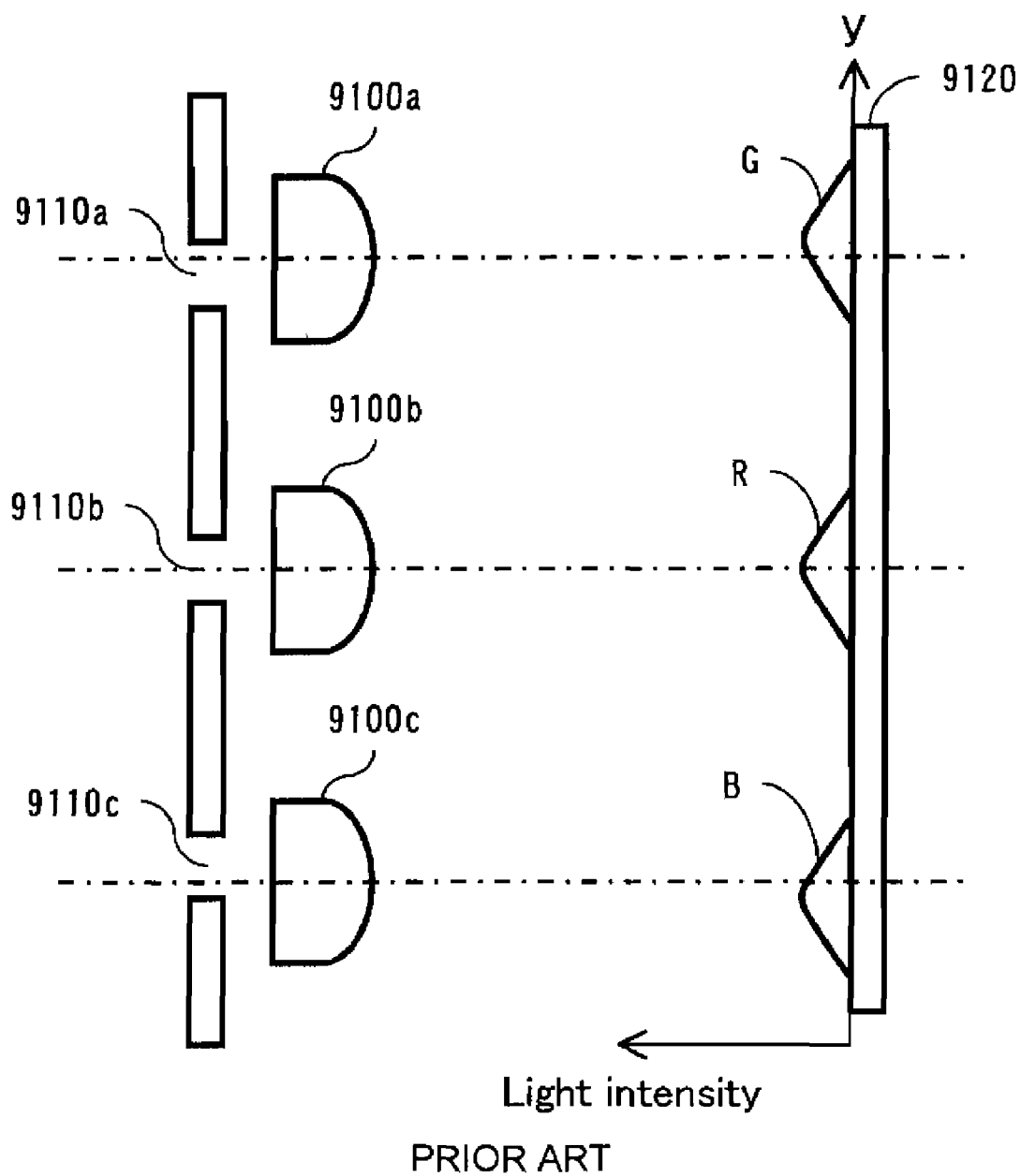
FIG. 51 illustrates the relationship between the aperture, the lens units, and peripheral brightness.
Figure 52:
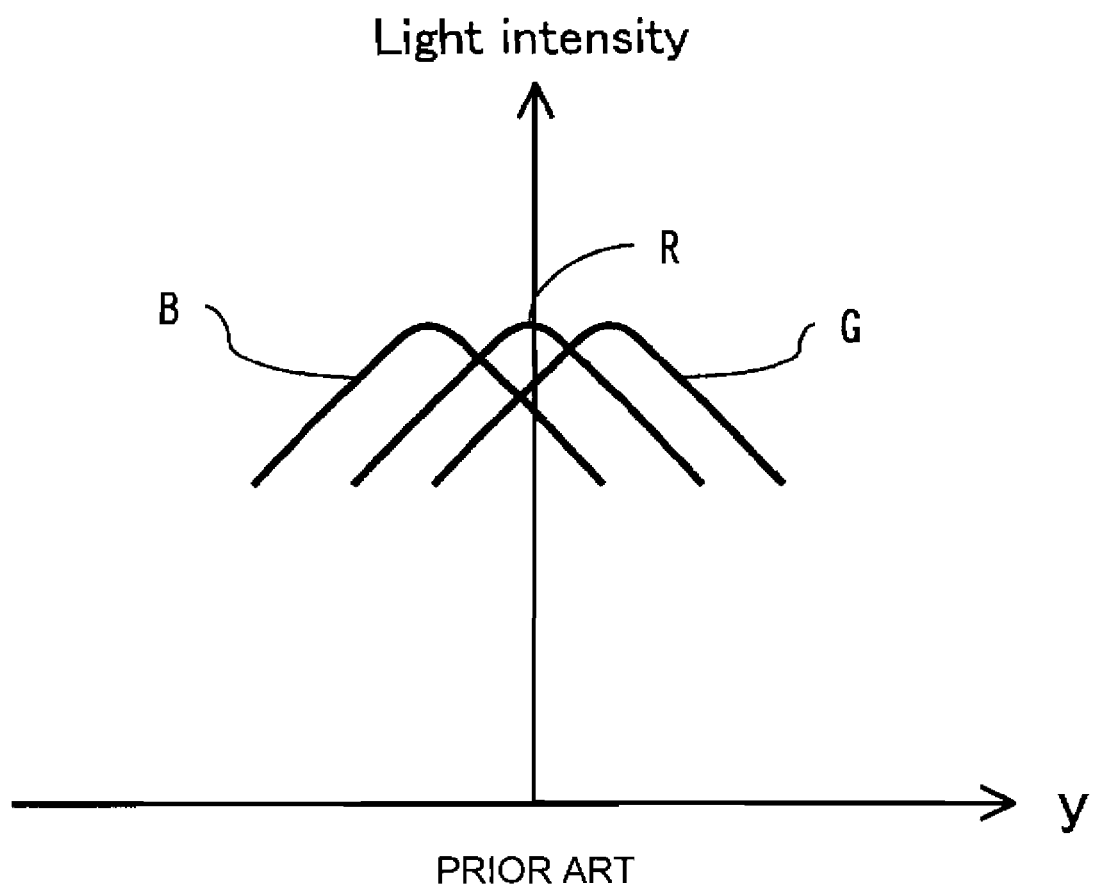
FIG. 52 shows the light intensity distributions for the green, red and blue components.

In step S5630, the distance calculating unit 545 calculates a parallax value for each block. Firstly, a parallax evaluation value $(R_{0(k)}, R_{1(k)}, \ldots, R_{i(k)}, \ldots R_{MN-1(k)}, k=0, 1, \ldots, kmax)$ is calculated for each block $(B_0, B_1, \ldots, B_i, \ldots, B_{MN-1})$. FIG. 49 illustrates a calculation area for calculating parallax evaluation values in the imaging device according to Embodiment 5 of the present invention. The area shown by $B_i$ (also shown as I1) is the i-th block derived at step S5620 from the first imaging signal I1. The area shown by I2 is an area in which $B_i$ has been moved by k in the x direction. The total sum of absolute differences shown by the following expression (122) then is calculated as a parallax evaluation value $R_i(k)$ for all image signals I1(x, y) and I2(x−k, y) of the respective areas. Here, ΣΣ shows the total sum of all pixels in the block $B_i$.

$$R_{i(k)} = \Sigma\Sigma |I1(x,y) - I2(x-k,y)| \tag{122}$$

This parallax evaluation value $R_{i(k)}$ shows the level of correlation between the first imaging signal I1 of the i-th block $B_i$ and the second imaging signal I2 in an area removed by k in the x direction. The smaller the value, the greater the correlation (similarity). As shown in FIG. 20, the parallax evaluation value $R_{i(k)}$ changes depending on the value of k, and is minimized when k=Δi. This shows that the imaging signal of the block obtained by moving the i-th block $B_i$ of the first imaging signal I1 by (Δi, 0) in the x and y directions, respectively, is most closely correlated to (most closely resembles) the second imaging signal I2. Consequently, we know that the parallax in the x and y directions between the first imaging signal I1 and the second imaging signal I2 in relation to i-th block $B_i$ is (Δi, 0). Hereinafter, this Δi will be called the parallax Δi of the i-th block $B_i$. The parallax Δi of $B_i$ is thus derived from i=0 to i=M×N−1. Step S5640 is executed next.

In step S5640, the distance calculating unit 545 performs distance calculation. Equation (1), when solved for distance A, is as shown in the following equation (123). Accordingly, the distance to the subject from the block $B_i$ is as calculated in the following equation (124), and the distance to the subject from a pixel (x, y) included in the block $B_i$ is as in the following equation (125). The derived distances are saved in the memory of the system control unit 531. Note that the units of measurement are changed appropriately when the calculations are performed. Step S5650 is executed next.

$$A = f*D/\Delta \tag{123}$$

$$A_i = f*D/\Delta_i \tag{124}$$

$$A(x,y) = A_i \ ((x, y) \text{ included in } B_i) \tag{125}$$

In step S5650, distance calculation is ended and processing returns to the main routine. Accordingly, step S5700 of FIG. 47 is executed next.

In step S5700, the input/output unit 536 outputs the result. The input/output unit 536 outputs I1(x, y), A(x, y), which is data in the memory of the system control unit 531, to the host CPU (not shown) or an external display device (not shown). Step S5800 is executed next.

In step S5800, operations are ended.

As a result of being configured and operated as above, the imaging device 501 has the following effects.

The imaging device 501 according to Embodiment 5, in step S5300, generates the intensity correction values b1(x, y) and b2(x, y), whose degree of correction changes depending on the position (x, y) of the imaging area, based on the intensity correction coefficients a1 and a2, corrects the imaging signals I1(x, y), I2(x, y), and compensates biasing of light intensity distribution. The imaging device 501 also divides the first imaging signal I1 into a plurality of blocks in step S5620, and derives a parallax for each block based on the corrected imaging signals I1(x, y) and I2(x, y) in step S5630. The imaging device 501 calculates distance for each block based on the parallax in step S5640. Since the imaging device 501 thus compensates biasing of light intensity distribution, derives correct parallax and performs distance calculation based on this correct parallax, correct distance can be generated.

The imaging device 501 according to Embodiment 5 saves the origin correction coefficients g1x, g2x, g1y, g2y to the origin correction coefficient memory 138, and corrects the origins of the imaging signals I1(x, y) and I2(x, y) based on the origin correction coefficients g1x, g2x, g1y, g2y in step S5400.

The imaging device 501 derives a parallax for each block based on the corrected imaging signals I1(x, y) and I2(x, y) in step S5630. Further, the imaging device 501 calculates distance for each block based on these parallaxes in step S5640. Since correct parallax thus is derived and distances calculated based on this correct parallax, the imaging device 501 can generate correct distances.

The imaging device 501 according to Embodiment 5 saves the distortion correction coefficients p1x(x, y), p2x(x, y), p1y(x, y), p2y(x, y), and calculates the distortion correction coordinates q1x(x, y), q2x(x, y), q1y(x, y), q2y(x, y), based on the distortion correction coefficients p1x(x, y), p2x(x, y), p1y(x, y), p2y(x, y) in step S5520. Further, the imaging device 501 corrects the imaging signal I1(x, y), I2(x, y) at the distortion correction coordinates q1x(x, y), q2x(x, y), q1y(x, y), q2y(x, y) in step S5530, so as to reduce the effect of distortion of the plurality of lens units, and derives a parallax for each block based on the corrected imaging signals I1(x, y) and I2(x, y) in step S5630. Also, the imaging device 501 calculates distance based on these parallaxes in step S5640. Since correct parallax is thus derived and distances calculated based on this correct parallax, the imaging device 501 can generate correct distances.

Note that although the imaging device of Embodiment 5 uses a monochrome imaging element, a Bayer array of imaging elements may be used. In this case, slight changes are necessary, including, for example, calculating luminance from a color image, performing intensity correction, origin correction and distortion correction on this luminance, calculating parallax, and calculating distance.

Note that in embodiments 1 to 5, a block is divided into a rectangular shape, although the present invention is not limited to this. For example, the edge may be detected, and the imaging signal may be divided into non-rectangular blocks based on the edge. The edge may also be divided into a plurality of segments, and the parallax of these segments may be derived, rather than deriving parallax for the area of each block. Further, blocks may be divided or joined based on the evaluation of parallax derived in a given block.

In the embodiments 1 to 5, focal point control may be omitted, and an actuator not included in the configuration. Where the lens used has a very long focal depth, the actuator does not need to be operated, since ample error tolerance is provided in the distance between the lens and the imaging element.

INDUSTRIAL APPLICABILITY

The imaging device of the present invention is useful in mobile telephones with camera function, digital still cameras, surveillance cameras, and in-vehicle cameras, or in measuring devices for detecting distance or the like, because of the possibilities for size and profile reductions.

The invention claimed is:

1. An imaging device comprising:
a plurality of lens units each including at least one lens;
a plurality of imaging areas corresponding one-to-one with the plurality of lens units, and each having a light receiving surface substantially perpendicular to an optical axis direction of the corresponding lens unit;
an imaging signal input unit that receives as input a plurality of imaging signals each output from a different one of the plurality of imaging areas;
an intensity correction coefficient saving unit that saves an intensity correction coefficient, which is information concerning intensity unevenness in the imaging areas that corresponds to a bias of light intensity distribution depending on a position within each of the imaging areas;
an intensity correcting unit that corrects an intensity of each of the plurality of imaging signals using the intensity correction coefficient such that the degree of correction changes depending on the position in the imaging area, so as to reduce an effect of intensity unevenness in the imaging areas that corresponds to the bias of light distribution depending on the position within each of the imaging areas; and
a parallax calculating unit that derives a parallax, representing shift amounts in relative positions of images of the same object formed respectively on the plurality of imaging areas by the plurality of lens units, based on the imaging signals whose intensity has been corrected by the intensity correcting unit.

2. The imaging device according to claim 1, further comprising:
an optical element on a light path of light incident on at least two of the plurality of imaging areas that has transmission characteristics substantially centered on a first wavelength; and
an optical element on a light path of light incident on the remaining imaging areas that has transmission characteristics substantially centered on a different wavelength from the first wavelength.

3. The imaging device according to claim 2, wherein the intensity correcting unit corrects the intensity of at least the imaging signals corresponding to the imaging areas, of the plurality of the imaging areas, that receive light passing through the optical elements having transmission characteristics substantially centered on the first wavelength.

4. The imaging device according to claim 2, wherein the first wavelength is perceived as substantially green by human vision.

5. The imaging device according to claim 1, further comprising:
a parallax correcting unit that corrects the plurality of imaging signals and performs image synthesis based on the parallax.

6. The imaging device according to claim 5, further comprising:
a block dividing unit that divides at least one of the plurality of imaging signals into a plurality of blocks, wherein
the parallax calculating unit calculates the parallax between images formed by the plurality of lens units for each block.

7. The imaging device according to claim 1, further comprising:
a distance calculating unit that derives a distance to a subject based on the parallax.

8. The imaging device according to claim 1, further comprising:
an origin correction coefficient saving unit that saves an origin correction coefficient, which is- information concerning correspondence between an origin of the optical axes of the plurality of lens units and an origin of the imaging signals; and
an origin correcting unit that corrects an origin of each of the plurality of imaging signals based on the origin correction coefficient.

9. The imaging device according to claim 1, further comprising:
a distortion correction coefficient saving unit that saves a distortion correction coefficient, which is information concerning distortion of the lens units; and
a distortion correcting unit that corrects each of the plurality of imaging signals based on the distortion correction coefficient, so as to reduce an effect of distortion of the plurality of lens units.

10. The imaging device according to claim 1, wherein the intensity correcting unit corrects the plurality of imaging signals such that intensity levels are equal.

11. The imaging device according to claim 1, further comprising:
optical elements having the same transmission characteristics that are provided respectively on light paths of lights incident on at least two of the imaging areas,
wherein the intensity correcting unit corrects the respective intensities of the imaging signals corresponding to the two of the imaging areas, and
the parallax calculating unit derives a parallax of images formed respectively by the plurality of lens units, based on the imaging signals corresponding to the two of the imaging areas whose intensity have been corrected by the intensity correcting unit.

12. A manufacturing method for an imaging device that has a plurality of lens units each including at least one lens,
a plurality of imaging areas corresponding one-to-one with the plurality of lens units, and each having a light receiving surface substantially perpendicular to the optical axis direction of the corresponding lens unit,
an imaging signal input unit that receives as input a plurality of imaging signals each output from a different one of the imaging areas,
an intensity correction coefficient saving unit that saves an intensity correction coefficient, which is information concerning intensity unevenness in the imaging areas that corresponds to a bias of light intensity distribution depending on a position within each of the imaging areas,
an intensity correcting unit that corrects an intensity of the imaging signals using the intensity correction coefficient such that the degree of correction changes depending on the position in the imaging area, so as to reduce the effect of intensity unevenness in the imaging areas that corresponds to the bias of light intensity distribution depending on the position within each of the imaging areas, and
a parallax calculating unit that derives a parallax, representing shift amounts in relative positions of images of the same object formed respectively on the plurality of the imaging areas by the plurality of lens units, based on the imaging signals whose intensity has been corrected by the intensity correcting unit, the manufacturing method comprising:
a first image capturing step of using the imaging device to capture an image of a substantially white object;
an intensity correction coefficient calculating step of calculating the intensity correction coefficient based on an imaging signal obtained in the first image capturing step;
a step of saving the intensity correction coefficient calculated in the intensity correction coefficient calculating step to the intensity correction coefficient saving unit; and
a parallax calculating step of deriving a parallax by the use of the parallax calculating unit based on the imaging signals whose intensity has been corrected by the intensity correcting coefficient.

13. The manufacturing method according to claim 12, wherein the imaging device further includes an origin correction coefficient saving unit that saves an origin correction coefficient, which is information concerning correspondence between an origin of the optical axes of the plurality of lens units and an origin of the imaging signals, and an origin correcting unit that corrects an origin of the imaging signals based on the origin correction coefficient, and
the manufacturing method further comprises:
a second image capturing step of using the imaging device to capture an image of an object having a pattern that includes a cross in a central portion thereof;
an origin correction coefficient calculating step of calculating the origin correction coefficient based on an imaging signal obtained in the second image capturing step; and
a step of saving the origin correction coefficient calculated in the origin correction coefficient calculating step to the origin correction coefficient saving unit.

14. The manufacturing method according to claim 12, wherein the imaging device further includes a distortion correction coefficient saving unit that saves a distortion correction coefficient, which is information concerning distortion of the lens units, and a distortion correcting unit that corrects the imaging signals based on the distortion correction coefficient, so as to reduce an effect of distortion of the plurality of lens units, and the manufacturing method further comprises:
a third image capturing step of using the imaging device to capture an image of an object having a lattice pattern;
a distortion correction coefficient calculating step of calculating the distortion correction coefficient based on an imaging signal obtained in the third image capturing step; and
a step of saving the distortion correction coefficient calculated in the distortion correction coefficient calculating step to the distortion correction coefficient saving unit.

15. The manufacturing method according to claim 12, wherein the imaging device further includes an origin correction coefficient saving unit that saves an origin correction coefficient, which is information concerning correspondence between an origin of the optical axes of the plurality of lens units and an origin of the imaging signals, and an origin correcting unit that corrects an origin of the imaging signals based on the origin correction coefficient, the substantially white object used in the first image capturing step has a substantially white background and a pattern that includes a cross in a central portion thereof, and the manufacturing method further comprises:
an origin correction coefficient calculating step of calculating the origin correction coefficient based on the imaging signal obtained in the first image capturing step; and
a step of saving the origin correction coefficient calculated in the origin correction coefficient calculating step to the origin correction coefficient saving unit.

16. The manufacturing method according to claim 12, wherein the imaging device further includes a distortion correction coefficient saving unit that saves a distortion correction coefficient, which is information concerning distortion of the lens units, and a distortion correcting unit that corrects the imaging signals based on the distortion correction coefficient, so as to reduce an effect of distortion of the plurality of lens units, the substantially white object used in the first image capturing step has a substantially white background and a lattice pattern, and the manufacturing method further comprises:
a distortion correction coefficient calculating step of calculating the distortion correction coefficient based on the imaging signal obtained in the first image capturing step; and
a step of saving the distortion correction coefficient calculated in the distortion correction coefficient calculating step to the distortion correction coefficient saving unit.

17. The manufacturing method according to claim 12, wherein the imaging device further includes an origin correction coefficient saving unit that saves an origin correction coefficient, which is information concerning correspondence between an origin of the optical axes of the plurality of lens units and an origin of the imaging signals, an origin correcting unit that corrects an origin of the imaging signals based on the origin correction coefficient, a distortion correction coefficient saving unit that saves a distortion correction coefficient, which is information concerning distortion of the lens units, and a distortion correcting unit that corrects the imaging signals based on the distortion correction coefficient, so as to reduce an effect of distortion of the plurality of lens units, the substantially white object used in the first image capturing step has a substantially white background and a lattice pattern, and the manufacturing method further comprises:
an origin correction coefficient calculating step of calculating the origin correction coefficient based on the imaging signal obtained in the first image capturing step;
a distortion correction coefficient calculating step of calculating the distortion correction coefficient based on the imaging signal obtained in the first image capturing step; and
a step of saving the origin correction coefficient calculated in the origin correction coefficient calculating step to the origin correction coefficient saving unit, and saving the distortion correction coefficient calculated in the distortion correction coefficient calculating step to the distortion correction coefficient saving unit.

* * * * *

UNITED STATES PATENT AND TRADEMARK OFFICE
CERTIFICATE OF CORRECTION

PATENT NO. : 8,023,016 B2
APPLICATION NO. : 11/722447
DATED : September 20, 2011
INVENTOR(S) : Iijima et al.

Page 1 of 1

It is certified that error appears in the above-identified patent and that said Letters Patent is hereby corrected as shown below:

Column 61, line 39 (claim 8): "is-" should read --is--.

Signed and Sealed this
Thirteenth Day of March, 2012

David J. Kappos
*Director of the United States Patent and Trademark Office*